US012347389B2

(12) United States Patent
Luo et al.

(10) Patent No.: US 12,347,389 B2
(45) Date of Patent: Jul. 1, 2025

(54) DRIVING CIRCUIT, DRIVING MODULE, DRIVING METHOD, DISPLAY SUBSTRATE AND DISPLAY DEVICE

(71) Applicant: BOE TECHNOLOGY GROUP CO., LTD., Beijing (CN)

(72) Inventors: Chengyuan Luo, Beijing (CN); Pan Xu, Beijing (CN); Ying Han, Beijing (CN); Xing Zhang, Beijing (CN); Donghui Zhao, Beijing (CN); Guangshuang Lv, Beijing (CN); Cheng Xu, Beijing (CN); Xing Yao, Beijing (CN); Dandan Zhou, Beijing (CN); Miao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/558,905

(22) PCT Filed: Jan. 13, 2023

(86) PCT No.: PCT/CN2023/072074

§ 371 (c)(1),
(2) Date: Nov. 3, 2023

(87) PCT Pub. No.: WO2024/148601

PCT Pub. Date: Jul. 18, 2024

(65) Prior Publication Data

US 2025/0104646 A1 Mar. 27, 2025

(51) Int. Cl.
*G09G 3/3266* (2016.01)

(52) U.S. Cl.
CPC ..... *G09G 3/3266* (2013.01); *G09G 2310/061* (2013.01); *G09G 2310/08* (2013.01)

(58) Field of Classification Search
CPC ........... G09G 3/3266; G09G 2310/061; G09G 2310/08
See application file for complete search history.

(56) References Cited

U.S. PATENT DOCUMENTS

| | | | | |
|---|---|---|---|---|
| 10,074,329 B2 * | 9/2018 | Jang | ........................ | G11C 19/28 |
| 2021/0183326 A1 * | 6/2021 | Fu | ........................ | G09G 3/3677 |
| 2021/0201807 A1 * | 7/2021 | Feng | .................... | G09G 3/3266 |

* cited by examiner

*Primary Examiner* — Brent D Castiaux
(74) *Attorney, Agent, or Firm* — MUNCY, GEISSLER, OLDS & LOWE, P.C.

(57) ABSTRACT

A driving circuit, a driving module, a driving method, a display substrate and a display device are provided. The driving circuit includes a first leakage prevention circuit, an output circuit and a first control node control circuit; the first leakage prevention circuit is configured to control to connect or disconnect the first control node, the first node and the first intermediate node under the control of a first voltage signal provided by the first voltage line according to a potential of the first intermediate node, control to connect or disconnect the first intermediate node and the second voltage line under the control of the potential of the first node, and control to disconnect the first control node and the first node when the first intermediate node and the second voltage line is connected.

20 Claims, 27 Drawing Sheets

DRIVING CIRCUIT, DRIVING MODULE, DRIVING METHOD, DISPLAY SUBSTRATE AND DISPLAY DEVICE

CROSS-REFERENCE TO RELATED APPLICATION

The present disclosure is the U.S. national phase of PCT Application No. PCT/CN2023/072074 filed on Jan. 13, 2023, which are incorporated herein by reference in their entireties.

TECHNICAL FIELD

The present disclosure relates to the field of display technology, in particular to a driving circuit, a driving module, a driving method, a display substrate and a display device.

BACKGROUND

Organic Light Emitting Diode (OLED) is a display light emitting technology that has gradually developed in recent years. Especially in the display industry, it is considered to have broad application prospects due to its advantages of high response, high contrast, and flexibility.

The scanning driving circuit for driving the OLED pixel circuit is directly integrated in the non-display area of the array substrate, which can replace the driving chip externally connected to the array substrate. It has the advantages of low cost, less process, and high productivity, and is a design called Gate driver on Array (GOA, the gate driving circuit arranged on the array substrate). The gate driving circuit that provides the light emitting control signal for the light emitting control transistor included in the OLED pixel circuit is called EM (light emitting) GOA. EM GOA can realize multi-pulse width modulation (PWM) dimming, thereby effectively improving the low gray scale expansion capability. Therefore, EM GOA circuit design and array structure are very important for display devices.

SUMMARY

In one aspect, the present disclosure provides in some embodiments a driving circuit, including a first leakage prevention circuit, an output circuit and a first control node control circuit: wherein the first control node control circuit is electrically connected to a first control node, and is configured to control a potential of the first control node: the output circuit is electrically connected to a first node, a first voltage line, and a driving signal output terminal, respectively, and is configured to control to connect or disconnect the driving signal output terminal and the first voltage line under the control of a potential of the first node: the first leakage prevention circuit is electrically connected to the first voltage line, the first control node, the first node, a first intermediate node and a second voltage line, and is configured to control to connect or disconnect the first control node, the first node and the first intermediate node under the control of a first voltage signal provided by the first voltage line according to a potential of the first intermediate node, control to connect or disconnect the first intermediate node and the second voltage line under the control of the potential of the first node, and control to disconnect the first control node from the first node when the first intermediate node is connected to the second voltage line.

Optionally, the first leakage prevention circuit comprises a first control circuit, a second control circuit and a third control circuit: the first control circuit is respectively electrically connected to the first voltage line, the first control node and the first intermediate node, and is configured to control to connect or disconnect the first control node and the first intermediate node under the control of the first voltage signal provided by the first voltage line according to the potential of the first control node: the second control circuit is respectively electrically connected to the first voltage line, the first intermediate node and the first node, and is configured to control to connect or disconnect the first intermediate node and the first node under the control of the first voltage signal according to the potential of the first intermediate node: the third control circuit is electrically connected to the first node, the first intermediate node, and the second voltage line, and is configured to control to connect or disconnect the first intermediate node and the second voltage line under the control of the potential of the first node.

Optionally, the first control circuit comprises a first transistor, the second control circuit comprises a second transistor, and the third control circuit comprises a third transistor: a gate electrode of the first transistor is electrically connected to the first voltage line, a first electrode of the first transistor is electrically connected to the first control node, a second electrode of the first transistor is electrically connected to the first intermediate node: a gate electrode of the second transistor is electrically connected to the first voltage line, a first electrode of the second transistor is electrically connected to the first intermediate node, and a second electrode of the second transistor is electrically connected to the first node: a gate electrode of the third transistor is electrically connected to the first node, a first electrode of the third transistor is electrically connected to the second voltage line, and a second electrode of the third transistor is electrically connected to the first node.

Optionally, the first transistor, the second transistor and the third transistor are all n-type transistors, and a voltage value of the first voltage signal provided by the first voltage line is smaller than a voltage value of a second voltage signal provided by the second voltage line: or, the first transistor, the second transistor and the third transistor are all p-type transistors, and the voltage value of the first voltage signal provided by the first voltage line is greater than the voltage value of the second voltage signal provided by the second voltage line.

Optionally, the driving circuit further includes an output reset circuit; wherein the output reset circuit is electrically connected to a second node, a third voltage line and the driving signal output terminal, and is configured to control to connect or disconnect the driving signal output terminal and the third voltage line under the control of a potential of the second node.

Optionally, the output reset circuit comprises a first reset sub-circuit and a second reset sub-circuit, and the driving circuit further comprises a second leakage prevention circuit: the first reset sub-circuit is electrically connected to the second node, the driving signal output terminal and a second intermediate node, and is configured to control to connect or disconnect the driving signal output terminal and the second intermediate node under the control of the potential of the second node: the second reset sub-circuit is electrically connected to the second node, the second intermediate node, and the third voltage line, and is configured to control to connect or disconnect the second intermediate node and the third voltage line under the control of the potential of the second node: the second leakage prevention circuit is electrically connected to the first voltage line and the second intermediate node respectively, and the second leakage prevention circuit is electrically connected to the driving signal output terminal or the first node, and is configured to control to connect or disconnect the second intermediate node and the first voltage line under the control of a driving signal provided by the driving signal output terminal or the potential of the first node.

Optionally, the output circuit comprises an output transistor and a first capacitor, and the output reset circuit comprises a first output reset transistor, a second output reset transistor and a second capacitor: a gate electrode of the output transistor is electrically connected to the first node, a first electrode of the output transistor is electrically connected to the first voltage line, and a second electrode of the output transistor is electrically connected to the driving signal output terminal: a first electrode plate of the first capacitor is electrically connected to the first node, and a second electrode plate of the first capacitor is electrically connected to the driving signal output terminal: a gate electrode of the first output reset transistor is electrically connected to the second node, a first electrode of the first output reset transistor is electrically connected to the driving signal output terminal, and a second electrode of the first output reset transistor is electrically connected to the second intermediate node: a gate electrode of the second output reset transistor is electrically connected to the second node, a first electrode of the second output reset transistor is electrically connected to the second intermediate node, and a second electrode of the second output reset transistor is electrically connected to the third voltage line: a first electrode plate of the second capacitor is electrically connected to the second node, and a second electrode plate of the second capacitor is electrically connected to the third voltage line: the second leakage prevention circuit includes a fourth transistor: a gate electrode of the fourth transistor is electrically connected to the driving signal output terminal or the first node, a first electrode of the fourth transistor is electrically connected to the first voltage line, and a second electrode of the fourth transistor is electrically connected to the second intermediate node.

Optionally, the driving circuit further includes a second control node control circuit and a second node control circuit: wherein the first control node control circuit is also electrically connected to an input terminal, a first clock signal line, a reset line, the first voltage line, a second clock signal line, a second control node and a third voltage line, is configured to control to connect or disconnect the first control node and the input terminal under the control of a clock signal provided by the first clock signal line, and control to connect or disconnect the first control node and the input terminal under the control of a reset signal provided by the reset line: control to connect or disconnect the first control node and the third voltage line under the control of a clock signal provided by the second clock signal line and a potential of the second control node: the second control node control circuit is respectively electrically connected to the first clock signal line, the first voltage line, the first control node, and the second control node, and is configured to control to connect or disconnect the second control node and the first voltage line under the control of the clock signal provided by the first clock signal line, and control to connect or disconnect the second control node and the first clock signal line under the control of the potential of the first control node: the second node control circuit is electrically connected to the second control node, the second clock signal line, the first node, the second node, a third intermediate node and the third voltage line, is configured to control to connect or disconnect the third intermediate node and the second clock signal line under the control of the potential of the second control node, control a potential of the third intermediate node under the control of the potential of the second control node, control to connect or disconnect the third intermediate node and the second node under the control of the clock signal provided by the second clock signal line, and control to connect or disconnect the second node and the third voltage line under the control of the potential of the first node.

Optionally, the first control node control circuit comprises a fifth transistor, a sixth transistor, a seventh transistor and an eighth transistor: a gate electrode of the fifth transistor is electrically connected to the first clock signal line, a first electrode of the fifth transistor is electrically connected to the input terminal, and a second electrode of the fifth transistor is electrically connected to the first control node; a gate electrode of the sixth transistor is electrically connected to the second clock signal line, and a first electrode of the sixth transistor is electrically connected to the first control node: a gate electrode of the seventh transistor is electrically connected to the second control node, a first electrode of the seventh transistor is electrically connected to a second electrode of the sixth transistor, a second electrode of the seventh transistor is electrically connected to the third voltage line: a gate electrode of the eighth transistor is electrically connected to the reset line, a first electrode of the eighth transistor is electrically connected to the first voltage line, and a second electrode of the eighth transistor is electrically connected to the first control node.

Optionally, the second control node control circuit comprises a ninth transistor and a tenth transistor: a gate electrode of the ninth transistor is electrically connected to the first clock signal line, a first electrode of the ninth transistor is electrically connected to the first voltage line, and a second electrode of the ninth transistor is electrically connected to the second control node: a gate electrode of the tenth transistor is electrically connected to the first control node, a first electrode of the tenth transistor is electrically connected to the first clock signal line, and a second electrode of the tenth transistor is electrically connected to the second control node.

Optionally, the second node control circuit comprises an eleventh transistor, a twelfth transistor, a thirteenth transistor and a third capacitor: a gate electrode of the eleventh transistor is electrically connected to the second control node, a first electrode of the eleventh transistor is electrically connected to the second clock signal line, a second electrode of the eleventh transistor is electrically connected to the third intermediate node: a gate electrode of the twelfth transistor is electrically connected to the second clock signal line, a first electrode of the twelfth transistor is electrically connected to the third intermediate node, and a second electrode of the twelfth transistor is electrically connected to the second node: a gate electrode of the thirteenth transistor is electrically connected to the first node, a first electrode of the thirteenth transistor is electrically connected to the third voltage line, and a second electrode of the thirteenth transistor is electrically connected to the second node: a first electrode plate of the third capacitor is electrically connected to the second control node, and a second electrode plate of the third capacitor is electrically connected to the third intermediate node.

Optionally, the driving circuit further includes a second control node control circuit and a second node control circuit: wherein the first control node control circuit is further electrically connected to an input terminal, a first clock signal line, a reset line and the first voltage line, and is configured to control to connect or disconnect the first control node and the input terminal under the control of a clock signal provided by the first clock signal line, and control to connect or disconnect the first control node and the first voltage line under the control of a reset signal provided by the reset line; the second control node control circuit is respectively electrically connected to a second clock signal line, the first voltage line, the first control node and the second control node, and is configured to control to connect or disconnect the second control node and the first voltage line under the control of a clock signal provided by the second clock signal line, and control to connect or disconnect the second control node and the second clock signal line under the control of the potential of the first control node: the second node control circuit is electrically connected to the second control node, the first clock signal line, the first control node, the reset line, the second node, a third intermediate node and a fourth voltage line, and is configured to control to connect or disconnect the third intermediate node and the first clock signal line under the control of the potential of the second control node, and control a potential of the third intermediate node under the control of the potential of the second control node, control to connect or disconnect the third intermediate node and the second node under the control of the clock signal provided by the first clock signal line, control to connect or disconnect the second node and the fourth voltage line under the control of the potential of the first control node, and control to connect or disconnect the second node and the fourth voltage line under the control of a reset signal provided by the reset line.

Optionally, the first control node control circuit comprises a fifth transistor and an eighth transistor: a gate electrode of the fifth transistor is electrically connected to the first clock signal line, a first electrode of the fifth transistor is electrically connected to the input terminal, and a second electrode of the fifth transistor is electrically connected to the first control node: a gate electrode of the eighth transistor is electrically connected to the reset line, a first electrode of the eighth transistor is electrically connected to the first voltage line, and a second electrode of the eighth transistor is electrically connected to the first control node: the second control node control circuit includes a ninth transistor and a tenth transistor: a gate electrode of the ninth transistor is electrically connected to the second clock signal line, a first electrode of the ninth transistor is electrically connected to the first voltage line, and a second electrode of the ninth transistor is electrically connected to the second control node: a gate electrode of the tenth transistor is electrically connected to the input terminal, a first electrode of the tenth transistor is electrically connected to the second clock signal line, and a second electrode of the tenth transistor is electrically connected to the second control node: the second node control circuit includes an eleventh transistor, a twelfth transistor, a thirteenth transistor, a fourteenth transistor and a third capacitor: a gate electrode of the eleventh transistor is electrically connected to the second control node, a first electrode of the eleventh transistor is electrically connected to the first clock signal line, and a second electrode of the eleventh transistor is electrically connected to the third intermediate node: a gate electrode of the twelfth transistor is electrically connected to the first clock signal line, a first electrode of the twelfth transistor is electrically connected to the third intermediate node, and a second electrode of the twelfth transistor is electrically connected to the second node: a gate electrode of the thirteenth transistor is electrically connected to the first control node, a first electrode of the thirteenth transistor is electrically connected to the fourth voltage line, and a second electrode of the thirteenth transistor is electrically connected to the second node; a gate electrode of the fourteenth transistor is electrically connected to the reset line, a first electrode of the fourteenth transistor is electrically connected to the fourth voltage line, and a second electrode of the fourteenth transistor is electrically connected to the second node: a first electrode plate of the third capacitor is electrically connected to the second control node, and a second electrode plate of the third capacitor is electrically connected to the third intermediate node.

Optionally, a transistor included in the output reset circuit is an n-type transistor, and a voltage value of a fourth voltage signal provided by the fourth voltage line is smaller than a voltage value of a third voltage signal provided by the third voltage line: or, the transistor included in the output reset circuit is a p-type transistor, and the voltage value of the fourth voltage signal provided by the fourth voltage line is greater than the voltage value of the third voltage signal provided by the third voltage line.

In a second aspect, an embodiment of the present disclosure provides a driving module including a plurality of stages of the driving circuit.

Optionally, the first control node control circuit included in the driving circuit is electrically connected to the first clock signal line, the input terminal and the first control node, and is configured to control to connect or disconnect the first control node and the input terminal under the control of the clock signal provided by the first clock signal line: the first clock signal line electrically connected to the first control node control circuit of an ath stage of driving circuit receives the first clock signal, and the first clock signal line electrically connected to the first control node control circuit of an (a+1)th stage of driving circuit receives the second clock signal, and a is a positive integer: a time interval between a rising edge of the first clock signal and a rising edge of the second clock signal is a row of scanning time: an effective voltage duration of an input signal connected to the input terminal is an integer times of the row of scanning time.

In a third aspect, an embodiment of the present disclosure provides a driving method applied to the driving circuit, wherein the driving method includes: controlling, by the first control node control circuit, the potential of the first control node: controlling, by the output circuit, to connect or disconnect the driving signal output terminal and the first voltage line under the control of the potential of the first node: controlling, by the first leakage prevention circuit, to connect or disconnect the first control node, the first node and the first intermediate node under the control of the first voltage signal according to the potential of the first intermediate node: controlling, by the first leakage prevention circuit, to connect or disconnect the first intermediate node and the second voltage line under the control of the potential of the first node, and controlling to disconnect the first control node from the first node when the first intermediate node is connected to the second voltage line.

In a fourth aspect, an embodiment of the present disclosure provides display substrate, including a base substrate and the driving circuit arranged on the base substrate.

Optionally, the driving circuit further comprises an output reset circuit and a second leakage prevention circuit: the output circuit is arranged on a side of the first leakage prevention circuit away from a display area: a transistor included in the output reset circuit and a transistor included in the output circuit are arranged along a first direction: a transistor included in the first leakage prevention circuit and the transistor included in the output circuit are arranged along a second direction: a transistor included in the second leakage prevention circuit and the transistor included in the output reset circuit are arranged along the second direction: the first direction intersects the second direction.

Optionally, the driving circuit further comprises a second control node control circuit and a second node control circuit: the output circuit comprises a first capacitor, and the output reset circuit comprises a second capacitor: the second node control circuit includes a third capacitor: the first capacitor and the second capacitor are arranged on a side of the output circuit close to the display area, and the third capacitor is arranged on a side of the output circuit away from the display area: a transistor included in the second node control circuit is arranged between the third capacitor and the transistor included in the output reset circuit: a transistor included in the first control node control circuit and a transistor included in the second control node control circuit are arranged on the side of the output circuit away from the display area.

Optionally, an orthographic projection of a gate electrode of the transistor included in the second node control circuit on the base substrate is arranged on a first side of an orthographic projection of an electrode plate of the third capacitor on the base substrate: an orthographic projection of a gate electrode of the transistor included in the first control node control circuit on the base substrate is arranged on a second side of the orthographic projection of the electrode plate of the third capacitor on the base substrate; an orthographic projection of a gate electrode of the transistor included in the second control node control circuit on the base substrate is arranged on the second side of the orthographic projection of the electrode plate of the third capacitor on the base substrate: the first side and the second side are two opposite sides.

Optionally, an orthographic projection of a gate electrode of the transistor included in the first leakage prevention circuit on the base substrate is arranged on a third side of the orthographic projection of the electrode plate of the third capacitor on the base substrate.

Optionally, the display substrate further includes a first clock signal line, a second clock signal line, a reset line, the first voltage line, the second voltage line and a third voltage line arranged on the base substrate; the first clock signal line, the second clock signal line, the reset line, the first voltage line and the second voltage line are arranged on a side of the first control node control circuit away from the display area; the third voltage line is arranged on a side of the first capacitor close to the display area.

In a fifth aspect, an embodiment of the present disclosure provides a display device including the driving module.

DETAILED DESCRIPTION

The following will clearly and completely describe the technical solutions in the embodiments of the present disclosure with reference to the accompanying drawings. Obviously, the described embodiments are only some of the embodiments of the present disclosure, not all of them. Based on the embodiments in the present disclosure, all other embodiments obtained by those ordinary skill in the art without making creative work belong to the protection scope of the present disclosure.

The transistors used in all the embodiments of the present disclosure may be thin film transistors or field effect transistors or other devices with the same characteristics. In the embodiments of the present disclosure, in order to distinguish the two electrodes of the transistor except the control electrode, one electrode is called the first electrode, and the other electrode is called the second electrode.

In actual operation, when the transistor is a thin film transistor or a field effect transistor, the control electrode may be a gate electrode, the first electrode may be a drain electrode, and the second electrode may be a source electrode: or, the control electrode may be a gate electrode, the first electrode may be a source electrode, and the second electrode may be a drain electrode.

Figure 1:
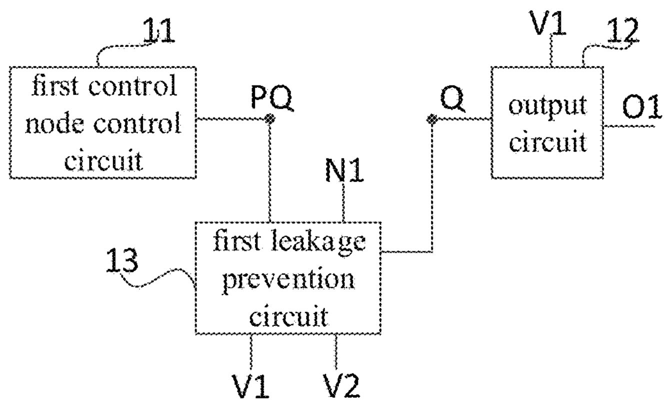
FIG. 1 is a structural diagram of a driving circuit according to an embodiment of the present disclosure.

As shown in FIG. 1, the driving circuit described in the embodiment of the present disclosure includes a first leakage prevention circuit 11, an output circuit 12 and a first control node control circuit 13;

The first control node control circuit 13 is electrically connected to a first control node PQ, and is configured to control a potential of the first control node PQ;

The output circuit 12 is electrically connected to a first node Q, a first voltage line V1, and a driving signal output terminal O1, respectively, and is configured to control to connect or disconnect the driving signal output terminal O1 and the first voltage line V1 under the control of a potential of the first node Q;

The first leakage prevention circuit 11 is electrically connected to the first voltage line V1, the first control node PQ, the first node Q, a first intermediate node N1 and a second voltage line V2, and is configured to control to connect or disconnect the first control node PQ, the first node Q and the first intermediate node N1 under the control of a first voltage signal provided by the first voltage line V1 according to a potential of the first intermediate node N1, is configured to control to connect or disconnect the first intermediate node N1 and the second voltage line V2 under the control of the potential of the first node Q, is configured to control to disconnect the first control node PQ and the first node Q when the first intermediate node N1 and the second voltage line V2 is connected.

When the driving circuit shown in FIG. 1 of the present disclosure is in operation, when the first leakage prevention circuit 11 controls to connect the first intermediate node N1 and the second voltage line V2 under the control of the potential of the first node Q, controls to disconnect the first control node PQ from the first node Q, so as to prevent the current from flowing from the first node Q to the first control node PQ, thereby causing noise at the driving signal output terminal O1.

Optionally, the first voltage line may be a first high voltage line, the second voltage line may be a second high voltage line, and a voltage value of the second high voltage signal provided by the second high voltage line may be greater than a voltage value of the first high voltage signal provided by the first high voltage line, but not limited thereto.

In at least one embodiment of the present disclosure, the driving signal provided by the driving circuit through the driving signal output terminal may be a light emitting control signal provided to the pixel circuit, but not limited thereto.

In at least one embodiment of the present disclosure, the first leakage prevention circuit may include a first control circuit, a second control circuit and a third control circuit;

The first control circuit is respectively electrically connected to the first voltage line, the first control node and the first intermediate node, and is configured to control to connect or disconnect the first control node and the first intermediate node under the control of the first voltage signal provided by the first voltage line according to the potential of the first control node;

The second control circuit is respectively electrically connected to the first voltage line, the first intermediate node and the first node, and is configured to control to connect or disconnect the first intermediate node and the first node under the control of the first voltage signal according to the potential of the first intermediate node;

The third control circuit is electrically connected to the first node, the first intermediate node, and the second voltage line, and is configured to control to connect or disconnect the first intermediate node and the second voltage line under the control of the potential of the first node.

In specific implementation, the first leakage prevention circuit may include a first control circuit, a second control circuit and a third control circuit, and the first control circuit is configured to control to connect or disconnect the first control node and the first intermediate node under the control of the first voltage signal according to the potential of the first control node: the second control circuit controls to connect or disconnect the first intermediate node and the first node according to the potential of the first intermediate node: the third control circuit controls to connect or disconnect the first intermediate node and the second voltage line under the control of the potential of the first node.

Figure 2:
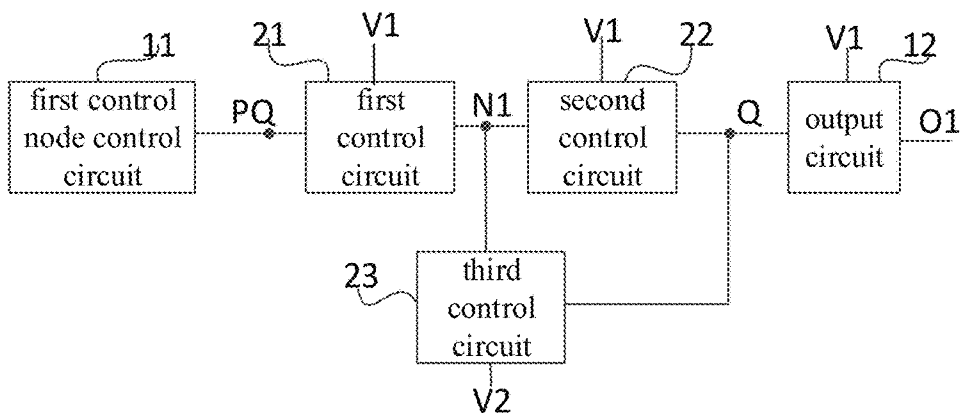
FIG. 2 is a structural diagram of a driving circuit according to at least one embodiment of the present disclosure.

As shown in FIG. 2, on the basis of at least one embodiment of the driving circuit shown in FIG. 1, the first leakage prevention circuit may include a first control circuit 21, a second control circuit 22 and a third control circuit 23;

The first control circuit 21 is electrically connected to the first voltage line V1, the first control node PQ and the first intermediate node N1 respectively, and is configured to control to connect or disconnect the first control node PQ and the first intermediate node N1 under the control of the first voltage signal provided by the first voltage line V1 according to the potential of the first control node PQ;

The second control circuit 22 is electrically connected to the first voltage line V1, the first intermediate node N1, and the first node Q respectively, and is configured to control to connect or disconnect the first intermediate node N1 and the first node Q under the control of the first voltage signal according to the potential of the first intermediate node N1;

The third control circuit 23 is electrically connected to the first node Q, the first intermediate node N1 and the second voltage line V2 respectively, and is configured to control to connect or disconnect the first intermediate node N1 and the second voltage line V2 under the control of the potential of the first node Q.

Optionally, the first control circuit includes a first transistor, the second control circuit includes a second transistor, and the third control circuit includes a third transistor;

A gate electrode of the first transistor is electrically connected to the first voltage line, a first electrode of the first transistor is electrically connected to the first control node, a second electrode of the first transistor is electrically connected to the first intermediate node;

A gate electrode of the second transistor is electrically connected to the first voltage line, a first electrode of the second transistor is electrically connected to the first intermediate node, and a second electrode of the second transistor is electrically connected to the first node;

A gate electrode of the third transistor is electrically connected to the first node, a first electrode of the third transistor is electrically connected to the second voltage line, and a second electrode of the third transistor is electrically connected to the first node.

In at least one embodiment of the present disclosure, the first transistor, the second transistor, and the third transistor are all n-type transistors, and the voltage value of the first voltage signal provided by the first voltage line is smaller than the voltage value of the second voltage signal provided by the second voltage line; or, The first transistor, the second transistor and the third transistor are all p-type transistors, and the voltage value of the first voltage signal provided by the first voltage line is greater than the voltage value of the second voltage signal provided by the second voltage line.

Figure 3:
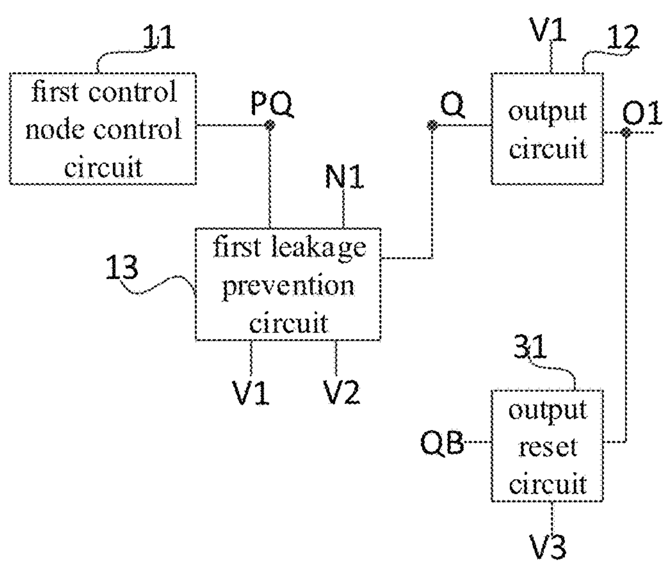
FIG. 3 is a structural diagram of a driving circuit according to at least one embodiment of the present disclosure.

As shown in FIG. 3, on the basis of at least one embodiment of the driving circuit shown in FIG. 1, the driving circuit described in at least one embodiment of the present disclosure further includes an output reset circuit 31;

The output reset circuit 31 is electrically connected to a second node QB, a third voltage line V3 and the driving signal output terminal O1, and is configured to control to connect or disconnect the driving signal output terminal O1 and the third voltage line V3 under the control of the potential of the second node QB.

In a specific implementation, the driving circuit may further include an output reset circuit 31, and the output reset circuit 31 may reset the driving circuit provided by the driving signal output terminal O1.

Optionally, the third voltage line may be the first low voltage line.

In at least one embodiment of the present disclosure, the output reset circuit includes a first reset sub-circuit and a second reset sub-circuit, and the driving circuit further includes a second leakage prevention circuit;

The first reset sub-circuit is electrically connected to the second node, the driving signal output terminal and the second intermediate node, and is configured to control to connect or disconnect the driving signal output terminal and the second intermediate node under the control of the potential of the second node;

The second reset sub-circuit is electrically connected to the second node, the second intermediate node, and a third voltage line, and is configured to control to connect or disconnect the second intermediate node and the third voltage line under the control of the potential of the second node;

The second leakage prevention circuit is electrically connected to the first voltage line and the second intermediate node respectively, and the second leakage prevention circuit is electrically connected to the driving signal output terminal or the first node, and is configured to control to connect or disconnect the second intermediate node and the first voltage line under the control of driving signal provided by the driving signal output terminal or the potential of the first node.

In specific implementation, the output reset circuit may also include a first reset sub-circuit and a second reset sub-circuit, and the driving circuit may also include a second leakage prevention circuit: the second leakage prevention circuit is configured to control to connect or disconnect the second intermediate node and the first voltage line under the control of the driving signal or the potential of the first node, and when the second leakage prevention circuit controls the connection between the second intermediate node and the first voltage line, it can reduce the current leakage at the driving signal output terminal.

Figure 4:
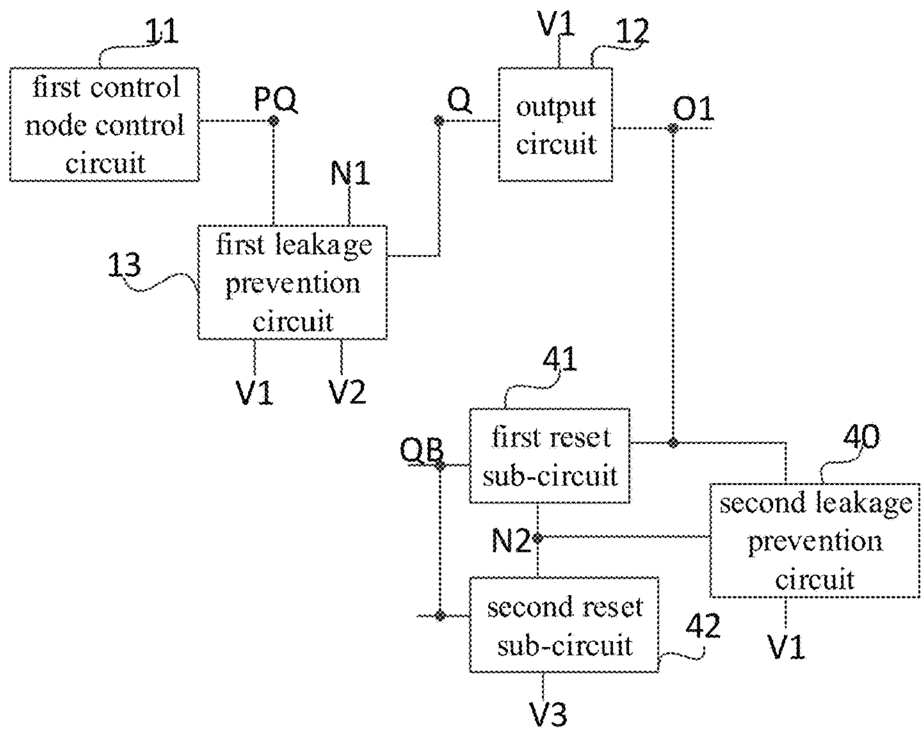
FIG. 4 is a structural diagram of a driving circuit according to at least one embodiment of the present disclosure.

As shown in FIG. 4, on the basis of at least one embodiment of the driving circuit shown in FIG. 3, the output reset circuit includes a first reset sub-circuit 41 and a second reset sub-circuit 42, and the driving circuit also includes a second leakage prevention circuit 40;

The first reset sub-circuit 41 is respectively electrically connected to the second node QB, the driving signal output terminal O1 and the second intermediate node N2, and is configured to control to connect or disconnect the driving signal output terminal O1 and the second intermediate node N2 under the control of the potential of the second node QB;

The second reset sub-circuit 42 is respectively electrically connected to the second node QB, the second intermediate node N2 and the third voltage line V3, and is configured to control to connect or disconnect the second intermediate node N2 and the third voltage line V3 under the control of the potential of the second node QB;

The second leakage prevention circuit 40 is electrically connected to the driving signal output terminal O1, the first voltage line V1 and the second intermediate node N2 respectively, and is configured to control to connect or disconnect the second intermediate node N2 and the first voltage line V1 under the control of the driving signal provided by the driving signal output terminal O1.

When at least one embodiment of the driving circuit of the present disclosure as shown in FIG. 4 is in operation, The first reset sub-circuit 41 controls to connect or disconnect the driving signal output terminal O1 and the second intermediate node N2 under the control of the potential of the second node QB;

The second reset sub-circuit 42 controls to connect or disconnect the second intermediate node N2 and the third voltage line V3 under the control of the potential of the second node QB;

The second leakage prevention circuit 40 controls to connect or disconnect the second intermediate node N2 and the first voltage line V1 under the control of the driving signal, and when the second intermediate node N2 is connected to the first voltage line V1, current can be prevented from flowing from the driving signal output terminal O1 to the third voltage line V3, so as to maintain the potential of the driving circuit provided by the driving signal output terminal O1.

Figure 5:
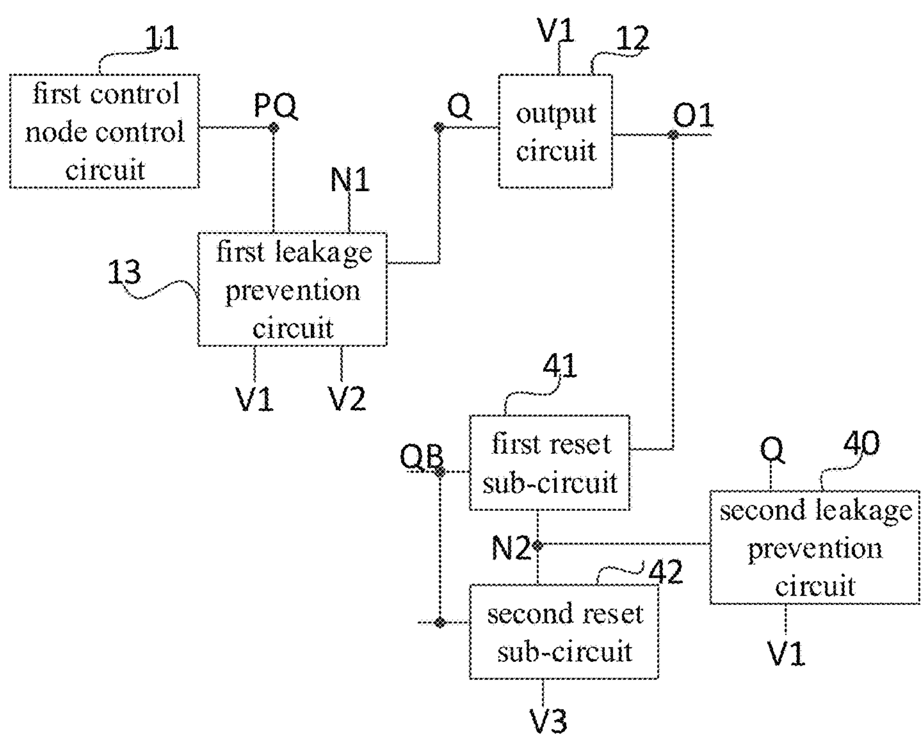
FIG. 5 is a structural diagram of a driving circuit according to at least one embodiment of the present disclosure.

As shown in FIG. 5, on the basis of at least one embodiment of the driving circuit shown in FIG. 3, the output reset circuit includes a first reset sub-circuit 41 and a second reset sub-circuit 42, and the driving circuit also includes a second leakage prevention circuit 40;

The first reset sub-circuit 41 is respectively electrically connected to the second node QB, the driving signal output terminal O1 and the second intermediate node N2, and is configured to control to connect or disconnect the driving signal output terminal O1 and the second intermediate node N2 under the control of the potential of the second node QB;

The second reset sub-circuit 42 is respectively electrically connected to the second node QB, the second intermediate node N2 and the third voltage line V3, and is configured to control to connect or disconnect the second intermediate node N2 and the third voltage line V3 under the control of the potential of the second node QB;

The second leakage prevention circuit 40 is respectively electrically connected to the first node Q, the first voltage line V1 and the second intermediate node N2, and is configured to control to connect or disconnect the second intermediate node N2 and the first voltage line V1 under the control of the potential of the first node Q.

When at least one embodiment of the driving circuit of the present disclosure as shown in FIG. 5 is in operation, The first reset sub-circuit 41 controls to connect or disconnect the driving signal output terminal O1 and the second intermediate node N2 under the control of the potential of the second node QB;

The second reset sub-circuit 42 controls to connect or disconnect the second intermediate node N2 and the third voltage line V3 under the control of the potential of the second node QB;

The second leakage prevention circuit 40 controls to connect or disconnect the second intermediate node N2 and the first voltage line V1 under the control of the potential of the first node Q, and when the second intermediate node N2 is connected to the first voltage lines V1, current can be prevented from flowing from the driving signal output terminal O1 to the third voltage line V3, so as to maintain the potential of the driving circuit provided by the driving signal output terminal O1.

Optionally, the output circuit includes an output transistor and a first capacitor, and the output reset circuit includes a first output reset transistor, a second output reset transistor, and a second capacitor;

A gate electrode of the output transistor is electrically connected to the first node, a first electrode of the output transistor is electrically connected to the first voltage line, and a second electrode of the output transistor is electrically connected to the driving signal output terminal;

A first electrode plate of the first capacitor is electrically connected to the first node, and a second electrode plate of the first capacitor is electrically connected to the driving signal output terminal;

A gate electrode of the first output reset transistor is electrically connected to the second node, a first electrode of the first output reset transistor is electrically connected to the driving signal output terminal, and a second electrode of the first output reset transistor is electrically connected to the second intermediate node;

A gate electrode of the second output reset transistor is electrically connected to the second node, a first electrode of the second output reset transistor is electrically connected to the second intermediate node, and a second electrode of the second output reset transistor is electrically connected to the third voltage line;

A first electrode plate of the second capacitor is electrically connected to the second node, and a second electrode plate of the second capacitor is electrically connected to the third voltage line;

The second leakage prevention circuit includes a fourth transistor;

A gate electrode of the fourth transistor is electrically connected to the driving signal output terminal or the first node, a first electrode of the fourth transistor is electrically connected to the first voltage line, and a second electrode of the fourth transistor is electrically connected to the second intermediate node.

The driving circuit according to at least one embodiment of the present disclosure further includes a second control node control circuit and a second node control circuit;

The first control node control circuit is also electrically connected to the input terminal, the first clock signal line, the reset line, the first voltage line, the second clock signal line, the second control node and the third voltage line, is configured to control to connect or disconnect the first control node and the input terminal under the control of the clock signal provided by the first clock signal line, and control to connect or disconnect the first control node and the input terminal under the control of the reset signal provided by the reset line; control to connect or disconnect the first control node and the third voltage line under the control of the clock signal provided by the second clock signal line and the potential of the second control node;

The second control node control circuit is respectively electrically connected to the first clock signal line, the first voltage line, the first control node, and the second control node, and is configured to control to connect or disconnect the second control node and the first voltage line under the control of the clock signal provided by the first clock signal line, and control to connect or disconnect the second control node and the first clock signal line under the control of the potential of the first control node;

The second node control circuit is electrically connected to the second control node, the second clock signal line, the first node, the second node, the third intermediate node and the third voltage line, is configured to control to connect or disconnect the third intermediate node and the second clock signal line under the control of the potential of the second control node, control the potential of the third intermediate node under the control of the potential of the second control node, and control to connect or disconnect the third intermediate node and the second node under the control of the clock signal provided by the second clock signal line, and control to connect or disconnect the second node and the third voltage line under the control of the potential of the first node.

In specific implementation, the driving circuit may also include a second control node control circuit and a second node control circuit: the first control node control circuit controls to connect or disconnect the first control node and the input terminal under the control of the clock signal provided by the first clock signal line, control to connect or disconnect the first control node and the first voltage line under the control of the reset signal: control to connect or disconnect the first control node and the third voltage line under the control of the clock signal provided by the second clock signal line and the potential of the second control node: the second control node control circuit is configured to control to connect or disconnect the second control node and the first voltage line under the control of the clock signal provided by the first clock control line, control to connect or disconnect the second control node and the first clock signal line under the control of the potential of the first control node;

the second node control circuit controls to connect or disconnect the third intermediate node and the second clock signal line under the control of the potential of the second control node, and control the potential of the third intermediate node under the control of the potential of the second control node, and control to connect or disconnect the third intermediate node and the second node under the control of the clock signal provided by the second clock signal line, and control to connect or disconnect the second node and the third voltage line under the control of the potential of the first node.

Figure 6:
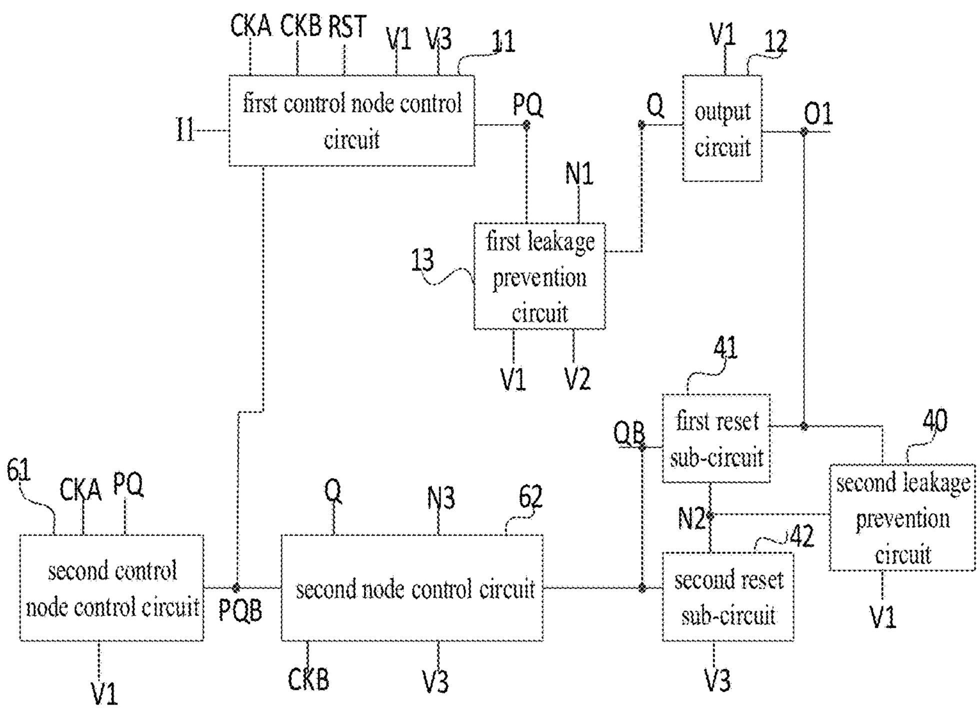
FIG. 6 is a structural diagram of a driving circuit according to at least one embodiment of the present disclosure.

As shown in FIG. 6, on the basis of at least one embodiment of the driving circuit shown in FIG. 4, the driving circuit described in at least one embodiment of the present disclosure further includes a second control node control circuit 61 and a second node control circuit 62;

The first control node control circuit 13 is also connected to the input terminal I1, the first clock signal line CKA, the reset line RST, the first voltage line V1, the second clock signal line CKB, the second control node PQB and the third voltage line V3, and is configured to control to connect or disconnect the first control node PQ and the input terminal I1 under the control of the clock signal provided by the first clock signal line CKA, and control to connect or disconnect the first control node PQ and the first voltage line V1 under the control of the reset signal provided by the reset line RST, control to connect or disconnect the first control node PQ and the third voltage line V3 under the control of the clock signal provided by the second clock signal line CKB and the potential of the second control node PQB;

The second control node control circuit 61 is respectively electrically connected to the first clock signal line CKA, the first voltage line V1, the first control node PQ, and the second control node PQB, is configured to control to connect or disconnect the second control node PQB and the first voltage line V1 under the control of the clock signal provided by the first clock signal line CKA, and control to connect or disconnect the second control node PQB and the first clock signal line CKA under the control of the potential of the first control node PQ;

The second node control circuit 62 is electrically connected to the second control node PQB, the second clock signal line CKB, the first node Q, the second node QB, the third intermediate node N3 and the third voltage line V3, is configured to control to connect or disconnect the third intermediate node N3 and the second clock signal line CKB under the control of the potential of the second control node PQB, and control the potential of the third intermediate node N3 under the control of the potential of the second control node PQB, and control to connect or disconnect the third intermediate node N3 and the second node QB under the control of the clock signal provided by the second clock signal line CKB, control to connect or disconnect the second node QB and the third voltage line V3 under the control of the potential of the first node Q.

In a specific implementation, an input terminal of the first stage of driving circuit included in the driving module is connected to the initial voltage.

Optionally, the first control node control circuit includes a fifth transistor, a sixth transistor, a seventh transistor, and an eighth transistor;

A gate electrode of the fifth transistor is electrically connected to the first clock signal line, a first electrode of the fifth transistor is electrically connected to the input terminal, and a second electrode of the fifth transistor is electrically connected to the first control node;

A gate electrode of the sixth transistor is electrically connected to the second clock signal line, and a first electrode of the sixth transistor is electrically connected to the first control node;

A gate electrode of the seventh transistor is electrically connected to the second control node, a first electrode of the seventh transistor is electrically connected to a second electrode of the sixth transistor, a second electrode of the seventh transistor is electrically connected to the third voltage line connection;

A gate electrode of the eighth transistor is electrically connected to the reset line, a first electrode of the eighth transistor is electrically connected to the first voltage line, and a second electrode of the eighth transistor is electrically connected to the first control node.

Optionally, the second control node control circuit includes a ninth transistor and a tenth transistor;

A gate electrode of the ninth transistor is electrically connected to the first clock signal line, a first electrode of the ninth transistor is electrically connected to the first voltage line, and a second electrode of the ninth transistor is electrically connected to the second control node;

A gate electrode of the tenth transistor is electrically connected to the first control node, a first electrode of the tenth transistor is electrically connected to the first clock signal line, and a second electrode of the tenth transistor is electrically connected to the second control node.

Optionally, the second node control circuit includes an eleventh transistor, a twelfth transistor, a thirteenth transistor and a third capacitor;

A gate electrode of the eleventh transistor is electrically connected to the second control node, a first electrode of the eleventh transistor is electrically connected to the second clock signal line, a second electrode of the eleventh transistor is electrically connected to the third intermediate node;

A gate electrode of the twelfth transistor is electrically connected to the second clock signal line, a first electrode of the twelfth transistor is electrically connected to the third intermediate node, and a second electrode of the twelfth transistor is electrically connected to the second node;

A gate electrode of the thirteenth transistor is electrically connected to the first node, a first electrode of the thirteenth transistor is electrically connected to the third voltage line, and a second electrode of the thirteenth transistor is electrically connected to the second node;

A first electrode plate of the third capacitor is electrically connected to the second control node, and a second electrode plate of the third capacitor is electrically connected to the third intermediate node.

The driving circuit according to at least one embodiment of the present disclosure further includes a second control node control circuit and a second node control circuit;

The first control node control circuit is also electrically connected to the input terminal, the first clock signal line, the reset line and the first voltage line, and is configured to control to connect or disconnect the first control node and the input terminal under the control of the clock signal provided by the first clock signal line, and control to connect or disconnect the first control node and the first voltage line under the control of the reset signal provided by the reset line;

The second control node control circuit is respectively electrically connected to the second clock signal line, the first voltage line, the first control node and the second control node, and is configured to control to connect or disconnect the second control node and the first voltage line under the control of the clock signal provided by the second clock signal line, and control to connect or disconnect the second control node and the second clock signal line under the control of the potential of the first control node;

The second node control circuit is electrically connected to the second control node, the first clock signal line, the first control node, the reset line, the second node, the third intermediate node and the fourth voltage line, and is configured to control to connect or disconnect the third intermediate node and the first clock signal line under the control of the potential of the second control node, and control the potential of the third intermediate node under the control of the potential of the second control node, control to connect or disconnect the third intermediate node and the second node under the control of the clock signal provided by the first clock signal line, and control to connect or disconnect the second node and the fourth voltage line under the control of the potential of the first control node, and control to connect or disconnect the second node and the fourth voltage line under the control of the reset signal provided by the reset line.

In specific implementation, the driving circuit may also include a second control node control circuit and a second node control circuit: the first control node control circuit controls to connect or disconnect the first control node and the input terminal under the control of the clock signal provided by the first clock signal line, control connect or disconnect the first control node and the first voltage line under the control of a reset signal: the second control node control circuit controls to connect or disconnect the second control node and the first voltage line under the control of the clock signal provided by the second clock signal line, and controls to connect or disconnect the second control node and the second clock signal line under the control of the potential of the first control node;

the second node control circuit controls to connect or disconnect the third intermediate node and the first clock signal line under the control of the potential of the second control node, controls the potential of the third intermediate node under the control of the potential of the second control node, control to connect or disconnect the third intermediate node and the second node under the control of the clock signal provided by the first clock signal line, and controls to connect or disconnect the second node and the fourth voltage line under the control of the potential of the first control node, and controls to connect or disconnect the second node and the fourth voltage line under the control of the reset signal provided by the reset line.

Figure 7:
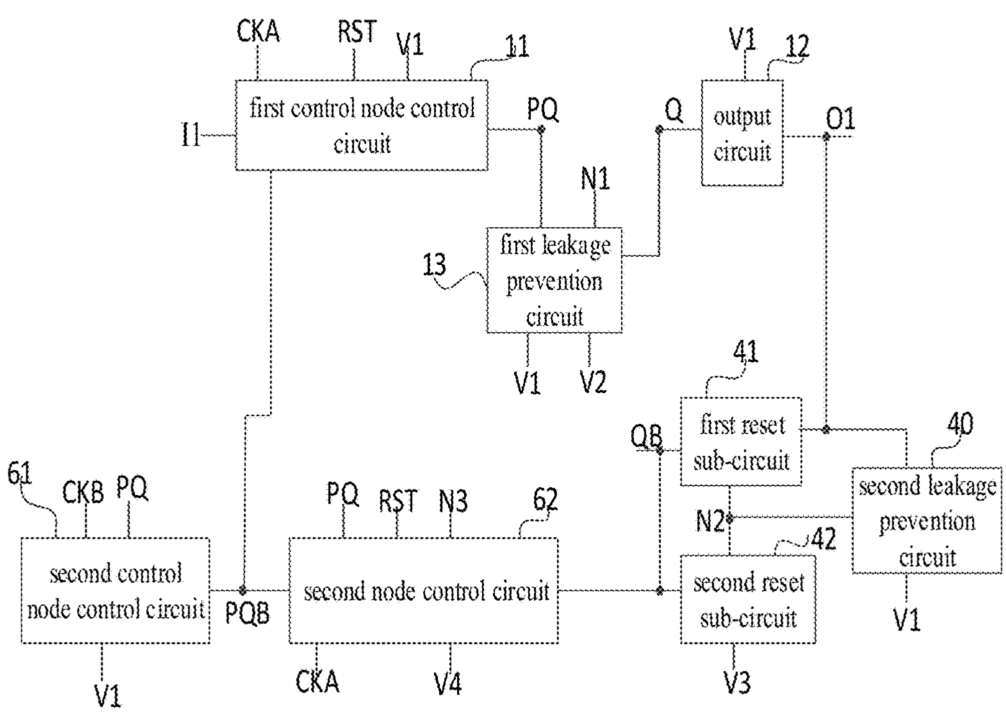
FIG. 7 is a structural diagram of a driving circuit according to at least one embodiment of the present disclosure.

As shown in FIG. 7, on the basis of at least one embodiment of the driving circuit shown in FIG. 4, the driving circuit described in at least one embodiment of the present disclosure further includes a second control node control circuit 61 and a second node control circuit 62;

The first control node control circuit 13 is also electrically connected to the input terminal I1, the first clock signal line CKA, the reset line RST and the first voltage line V1, is configured to control to connect or disconnect the first control node PQ and the input terminal I1 under the control of the clock signal provided by the first clock signal line CKA, and control to connect or disconnect the first control node PQ and the first voltage line V1 under the control of the reset signal provided by the reset line RST;

The second control node control circuit 61 is respectively electrically connected to the second clock signal line CKB, the first voltage line V1, the first control node PQ, and the second control node PQB, is configured to control to connect or disconnect the second control node PQB and the first voltage line V1 under the control of the clock signal provided by the second clock signal line CKB, and control to connect or disconnect the second control node PQB and the second clock signal line CKB under the control of the potential of the first control node PQ;

The second node control circuit 62 is electrically connected to the second control node PQB, the first clock signal line CKA, the first control node PQ, the reset line RST, the second node QB, the third intermediate node N3 and the fourth voltage line V4 respectively, is configured to control to connect or disconnect the third intermediate node N3 and the first clock signal line CKA under the control of the potential of the second control node PQB, control the potential of the third intermediate node N3 under the control of the potential of the second control node PQB, and control to connect or disconnect the third intermediate node N3 and the second node QB under the control of the clock signal provided by the first clock signal line CKA, control to connect or disconnect the second node QB and the fourth voltage line V4 under the control of the potential of the first control node PQ, and control to connect or disconnect the second node QB and the fourth voltage line V4 under the control of the reset signal provided by the reset line RST.

In at least one embodiment of the present disclosure, the fourth voltage line may be a second low voltage line.

Optionally, the first control node control circuit includes a fifth transistor and an eighth transistor;

A gate electrode of the fifth transistor is electrically connected to the first clock signal line, a first electrode of the fifth transistor is electrically connected to the input terminal, and a second electrode of the fifth transistor is electrically connected to the first control node;

A gate electrode of the eighth transistor is electrically connected to the reset line, a first electrode of the eighth transistor is electrically connected to the first voltage line, and a second electrode of the eighth transistor is electrically connected to the first control node;

The second control node control circuit includes a ninth transistor and a tenth transistor;

A gate electrode of the ninth transistor is electrically connected to the second clock signal line, a first electrode of the ninth transistor is electrically connected to the first voltage line, and a second electrode of the ninth transistor is electrically connected to the second control node;

A gate electrode of the tenth transistor is electrically connected to the input terminal, a first electrode of the tenth transistor is electrically connected to the second clock signal line, and a second electrode of the tenth transistor is electrically connected to the second control node;

The second node control circuit includes an eleventh transistor, a twelfth transistor, a thirteenth transistor, a fourteenth transistor and a third capacitor;

A gate electrode of the eleventh transistor is electrically connected to the second control node, a first electrode of the eleventh transistor is electrically connected to the first clock signal line, and a second electrode of the eleventh transistor is electrically connected to the third intermediate node;

A gate electrode of the twelfth transistor is electrically connected to the first clock signal line, a first electrode of the twelfth transistor is electrically connected to the third intermediate node, and a second electrode of the twelfth transistor is electrically connected to the second node;

A gate electrode of the thirteenth transistor is electrically connected to the first control node, a first electrode of the thirteenth transistor is electrically connected to the fourth voltage line, and a second electrode of the thirteenth transistor is electrically connected to the second node;

A gate electrode of the fourteenth transistor is electrically connected to the reset line, a first electrode of the fourteenth transistor is electrically connected to the fourth voltage line, and a second electrode of the fourteenth transistor is electrically connected to the second node;

A first electrode plate of the third capacitor is electrically connected to the second control node, and a second electrode plate of the third capacitor is electrically connected to the third intermediate node.

In at least one embodiment of the present disclosure, the transistor included in the output reset circuit is an n-type transistor, and the voltage value of the fourth voltage signal provided by the fourth voltage line is smaller than the voltage value of the third voltage signal provided by the third voltage line; or, The transistors included in the output reset circuit are p-type transistors, and the voltage value of the fourth voltage signal provided by the fourth voltage line is greater than the voltage value of the third voltage signal provided by the third voltage line.

Figure 8A:
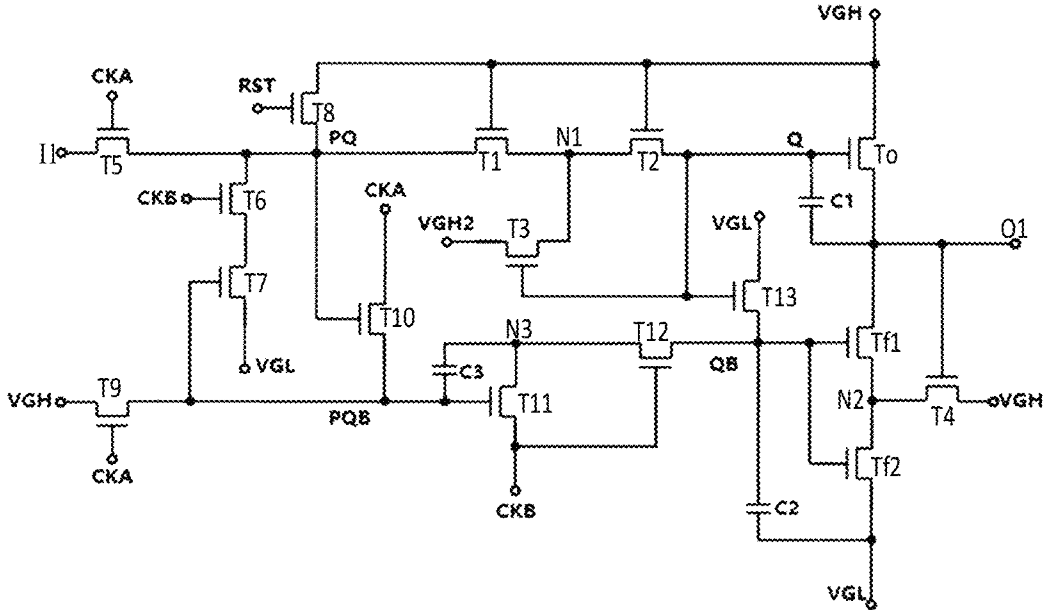
FIG. 8A is a circuit diagram of a driving circuit according to at least one embodiment of the present disclosure.

As shown in FIG. 8A, on the basis of at least one embodiment of the driving circuit shown in FIG. 6, The first control circuit includes a first transistor T1, the second control circuit includes a second transistor T2, and the third control circuit includes a third transistor T3;

The gate electrode of the first transistor T1 is electrically connected to the first high voltage line VGH, the first electrode of the first transistor T1 is electrically connected to the first control node PQ, and the second electrode of the first transistor T1 is electrically connected to the first intermediate node N1;

The gate electrode of the second transistor T2 is electrically connected to the first high voltage line VGH, the first electrode of the second transistor T2 is electrically connected to the first intermediate node N1, and the second electrode of the second transistor T2 is electrically connected to the first node Q;

The gate electrode of the third transistor T3 is electrically connected to the first node Q, the first electrode of the third transistor T3 is electrically connected to the second high voltage line VGH2, and the second electrode of the third transistor T3 is electrically connected to the first node Q;

The output circuit includes an output transistor To and a first capacitor C1, and the output reset circuit includes a first output reset transistor Tf1, a second output reset transistor Tf2, and a second capacitor C2;

The gate electrode of the output transistor To is electrically connected to the first node Q, the first electrode of the output transistor To is electrically connected to the first high voltage line VGH, the second electrode of the output transistor To is connected to the driving signal output Terminal O1;

The first electrode plate of the first capacitor C1 is electrically connected to the first node Q, and the second electrode plate of the first capacitor C1 is electrically connected to the driving signal output terminal O1;

The gate electrode of the first output reset transistor Tf1 is electrically connected to the second node QB, the first electrode of the first output reset transistor Tf1 is electrically connected to the driving signal output terminal O1, and the second electrode of the first output reset transistor Tf1 is electrically connected to the second intermediate node N2;

The gate electrode of the second output reset transistor Tf2 is electrically connected to the second node QB, the first electrode of the second output reset transistor Tf2 is electrically connected to the second intermediate node N2, and the second electrode of the second output reset transistor Tf2 is electrically connected to the first low voltage line VGL;

The first electrode plate of the second capacitor C2 is electrically connected to the second node QB, and the second electrode plate of the second capacitor C2 is electrically connected to the first low voltage line VGL;

The second leakage prevention circuit includes a fourth transistor T4;

The gate electrode of the fourth transistor T4 is electrically connected to the driving signal output terminal O1, the first electrode of the fourth transistor T4 is electrically connected to the first high voltage line VGH, and the second electrode of the fourth transistor T4 is electrically connected to the second intermediate node N2;

The first control node control circuit includes a fifth transistor T5, a sixth transistor T6, a seventh transistor T7 and an eighth transistor T8;

The gate electrode of the fifth transistor T5 is electrically connected to the first clock signal line CKA, the first electrode of the fifth transistor T5 is electrically connected to the input terminal I1, and the second electrode of the fifth transistor T5 is electrically connected to the first control node PQ;

The gate electrode of the sixth transistor T6 is electrically connected to the second clock signal line CKB, and the first electrode of the sixth transistor T6 is electrically connected to the first control node PQ;

The gate electrode of the seventh transistor T7 is electrically connected to the second control node PQB, the first electrode of the seventh transistor T7 is electrically connected to the second electrode of the sixth transistor T6, and the second electrode of the seventh transistor T7 is electrically connected to the first low voltage line VGL;

The gate electrode of the eighth transistor T8 is electrically connected to the reset line RST, the first electrode of the eighth transistor T8 is electrically connected to the first high voltage line VGH, and the second electrode of the eighth transistor T8 is electrically connected to the first control node PQ;

The second control node control circuit includes a ninth transistor T9 and a tenth transistor T10;

The gate electrode of the ninth transistor T9 is electrically connected to the first clock signal line CKA, the first electrode of the ninth transistor T9 is electrically connected to the first high voltage line VGH, and the second electrode of the ninth transistor T9 is electrically connected to the second control node PQB;

The gate electrode of the tenth transistor T10 is electrically connected to the first control node PQ, the first electrode of the tenth transistor T10 is electrically connected to the first clock signal line CKA, and the second electrode of the tenth transistor T10 is electrically connected to the second control node PQB;

The second node control circuit includes an eleventh transistor T11, a twelfth transistor T12, a thirteenth transistor T13 and a third capacitor C3;

The gate electrode of the eleventh transistor T11 is electrically connected to the second control node PQB, the first electrode of the eleventh transistor T11 is electrically connected to the second clock signal line CKB, and the second electrode of the eleventh transistor T11 is electrically connected to the third intermediate node N3;

The gate electrode of the twelfth transistor T12 is electrically connected to the second clock signal line CKB, the first electrode of the twelfth transistor T12 is electrically connected to the third intermediate node N3, and the second electrode of the twelfth transistor T12 is electrically connected to the second node QB;

The gate electrode of the thirteenth transistor T13 is electrically connected to the first node Q, the first electrode of the thirteenth transistor T13 is electrically connected to the first low voltage line VGL, and the second electrode of the thirteenth transistor T13 is electrically connected to the second node QB;

A first electrode plate of the third capacitor C3 is electrically connected to the second control node PQB, and a second electrode plate of the third capacitor C3 is electrically connected to the third intermediate node N3.

In at least one embodiment of the driving circuit shown in FIG. 8A, all transistors are n-type transistors, but not limited thereto.

In at least one embodiment of the driving circuit shown in FIG. 8A, the first voltage line is a first high voltage line, the second voltage line is a second high voltage line, and the third voltage line is a first low voltage line.

At least one embodiment of the driving circuit shown in FIG. 8A of the present disclosure can provide a light emitting control signal for the pixel circuit through the driving signal output terminal O1, that is, the driving signal provided by the driving signal output terminal O1 can be a light emitting control signal.

In at least one embodiment of the driving circuit shown in FIG. 8A, when the driving circuit is the first stage of driving circuit included in the driving module, the input terminal I1 is electrically connected to the initial voltage line, and receives the initial voltage signal of the initial voltage line;

When the driving circuit is a driving circuit included in the driving module other than the nth stage of driving circuit, the input terminal of the nth stage of driving circuit may be electrically connected to the driving signal output terminal of the (n−1)th stage of driving circuit.

When at least one embodiment of the driving circuit shown in FIG. 8A of the present disclosure is working, T5, T6, T7 and T8 are configured to control the potential of the first control node PQ, T9 and T10 are configured to control the potential of the second control node PQB, T5 is used for input control, and T6 and T7 can control the potential of PQ to be a low voltage when the potential of PQB is a high voltage and CKB provides a high voltage signal, T10 can control the potential of PQB to be a low voltage when the potential of PQ is a high voltage and CKA provides a low voltage signal. T9 can control the potential of PQB to be a high voltage signal when CKA provides a high voltage signal;

T1, T2 and T3 can be used for high voltage leakage prevention. The voltage value of the second high voltage signal provided by VGH2 is greater than the voltage value of the first high voltage signal provided by VGH. When T3 is turned on under the control of the potential of the first node Q, the first intermediate node N1 is connected to the second high voltage line VGH2, so that the potential of the first intermediate node N1 is the second high voltage. At this time, T1 and T2 are turned off to prevent the current from flowing from the first node Q to the first control node PQ, to avoid causing noise at the driving signal output terminal O1;

When the potential of PQB is a high voltage, T11 controls to connect the third intermediate node N3 and CKB, and when CKB provides a high voltage signal, T12 is turned on to control to connect the third intermediate node N3 and the second node QB, so that the potential of the second node QB is a high voltage, and the potential of QB can be kept stable;

T13 may be configured to control the potential of the second node QB to be a low voltage when the potential of the first node Q is a high voltage;

T4 can maintain the stability of the driving signal outputted by the driving signal output terminal O1. When To is turned on and O1 outputs a high voltage signal, T4 is turned on to control to connect the second intermediate node N2 and the first high voltage line VGH, to prevent current from flowing from the driving signal output terminal O1 to the first low voltage line VGL, to avoid voltage drop and ensure that the potential of the driving signal output terminal O1 is maintained at a high voltage.

When at least one embodiment of the driving circuit shown in FIG. 8A of the present disclosure is in operation, PQB provides a high potential for QB, when CKA provides a high voltage signal, T9 is turned on, the potential of PQB is a high voltage, and T11 is turned on to control the potential of the third intermediate node N3 to be a high voltage, C3 maintains the potential of N3, and then when CKB provides a high voltage signal, T12 is turned on to control to connect QB and N3, thereby controlling the potential of QB to be a high voltage, and when the potential of PQ is a low potential, the potential of PQB remains at a high potential: when the potential of PQ is a high potential, T10 is turned on, and PQB is connected to CKA: when RST provides a high voltage signal, T8 is turned on, and the potential of PQ is a high voltage. After I1 provides a low voltage signal and CKA provides a high voltage signal, T5 is turned on, and the potential of PQ becomes a low potential. After that, when I1 provides a high voltage signal, after CKA provides a high voltage signal, T5 is turned on, and the potential of PQ is a high voltage, T10 is turned on, and PQB is connected to CKA. After that, for a period of time, the potential of PQ is maintained at a high voltage: when the potential of QB is a high potential, O1 outputs a low voltage signal, and the high potential of QB requires the high potential of PQB and the high potential of CKB: the change of the potential of Q is synchronized with the change of the potential of PQ. When the potential of Q is a high voltage, O1 outputs a high voltage signal. When the potential of Q is a high voltage, T13 is turned on, the potential of QB is a low voltage.

Figure 9:
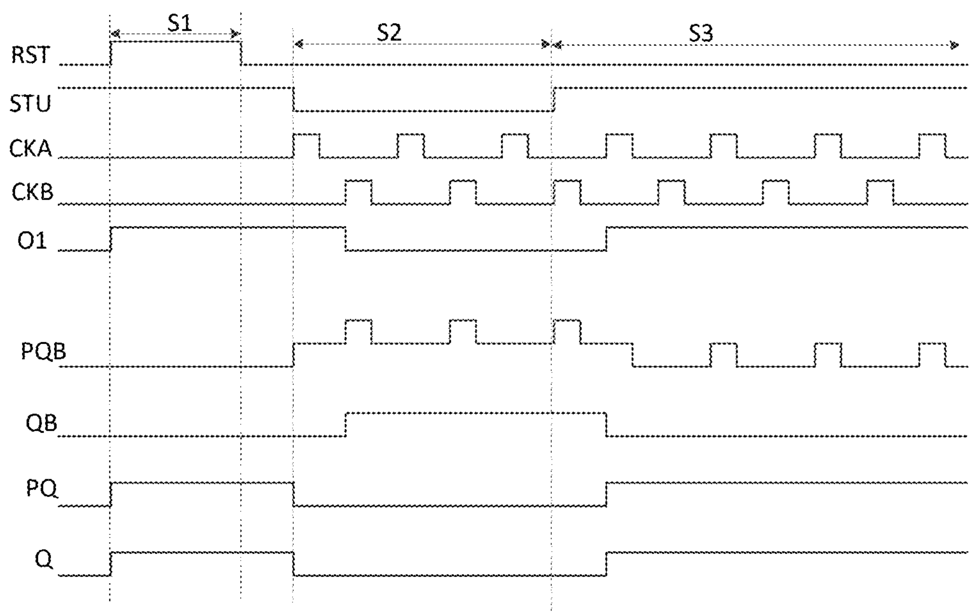
FIG. 9 is a working timing diagram of the driving circuit shown in FIG. 8A of at least one embodiment of the present disclosure.

As shown in FIG. 9, when at least one embodiment of the driving circuit shown in FIG. 8A of the present disclosure is in operation, when the driving circuit is the first stage of driving circuit included in the driving module, I1 is electrically connected to the initial voltage line STU;

In the first phase S1, RST provides a high voltage signal, T8 is turned on, PQ is connected to VGH, the potential of PQ is a high voltage, T1 and T2 are turned on, so that the potential of Q is a high voltage, CKA provides a low voltage signal, T9 is turned off, T10 is turned on, PQB is connected to CKA, the potential of PQB is a low voltage, T13 is turned on, QB is connected to VGL, the potential of QB is a low voltage, Tf1 and Tf2 are turned off, To is turned on, and O1 outputs a high voltage signal;

In the second phase S2, RST provides a low voltage signal, STU provides a low voltage signal, when CKA provides a high voltage signal, T5 is turned on, the potential of PQ is a low voltage, T1 and T2 are turned on, the potential of Q is a low voltage, and T9 is turned on, PQB is connected to VGH, the potential of PQB is a high voltage, T11 is turned on, and N3 is connected to CKB. When CKB provides a high voltage signal, the potential of PQB is also bootstrapped accordingly, and the potential of N3 is a high voltage, and T12 is turned on, the potential of QB is a high voltage, Tf1 and Tf2 are turned on, and O1 outputs a low voltage signal;

In the third phase S3, RST provides a low voltage signal, STU provides a high voltage signal, when CKA outputs a high voltage signal, T5 is turned on, the potential of PQ is a high voltage, T1 and T2 are turned on, the potential of Q is a high voltage, and To is turned on, O1 outputs a high voltage signal.

When at least one embodiment of the driving circuit shown in FIG. 8A is in operation, the display refresh rate can be 120 Hz, the 1H time is 3.7 us, and the duty ratio of the clock signal provided by CKA and the duty ratio of the clock signal provided by CKB are both 25%, the low voltage maintenance time of the initial voltage signal provided by STU can be 3H, the high voltage value of the clock signal provided by CKA can be 24V, the low voltage value of the clock signal provided by CKA can be −6V, and the high voltage value of the clock signal provided by CKB can be 24V, the low voltage value of the clock signal provided by CKB can be −6V, the high voltage value of the initial voltage signal provided by STU can be 20V, and the low voltage value of the initial voltage signal provided by STU can be −6V, the high voltage value of the reset signal provided by RST can be 24V, the low voltage value of the reset signal can be −6V, the voltage value of the first high voltage signal provided by VGH can be 20V, and the voltage value of the second high voltage signal provided by VGH2 may be 24V, and the voltage value of the first low voltage signal provided by the VGL may be −6V.

When at least one embodiment of the driving circuit shown in FIG. 8A is in operation, in the first phase S1 and the third phase S3, after the potential of the first node Q becomes a high voltage, T1 and T2 can be turned off;

Since the high voltage value of the initial voltage signal provided by the STU can be 20V, in the first phase S1 and the third phase S3, T1 and T2 are turned on, so that the potential of the first node Q can be slightly less than 20V, when the potential of the first node Q is abnormally bootstrapped and pulled up, if the potential of the first node Q and the voltage value of the second high voltage signal provided by VGH2 are greater than the threshold voltage of T3, T3 is turned on, so that N1 and VGH2 are connected, thereby preventing the current from flowing from Q to PQ, and avoiding the abnormal output of the driving signal output terminal caused by the decrease of the potential of the first node Q.

In at least one embodiment of the driving circuit shown in FIG. 8A, the width-to-length ratio of T1 may be 300/6, the width-to-length ratio of T2 may be 300/6, the width-to-length ratio of T3 may be 20/6, and the width-to-length ratio of T4 may be 20/6, the width-to-length ratio of T5 can be 50/6, the width-to-length ratio of T6 can be 10/6, the width-to-length ratio of T7 can be 10/6, and the width-to-length ratio of T8 can be 20/6, the width-to-length ratio of T9 can be 50/6, the width-to-length ratio of T10 can be 20/6, the width-to-length ratio of T11 can be 100/6, the width-to-length ratio of T12 can be 300/6, the width-to-length ratio of T13 can be 10/6, the width-to-length ratio of To can be 2000/6, the width-to-length ratio of Tf1 and Tf2 can be 1000/6: the capacitance value of C1 can be 2 pF, the capacitance value of C2 and the capacitance value of C3 can be 0.5 pF, but not limited thereto.

Figure 10:
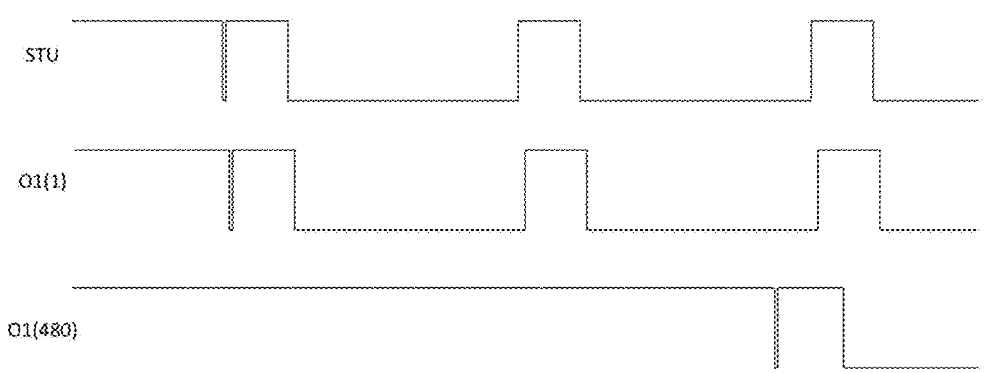
FIG. 10 is a simulation working timing diagram of a driving module including the driving circuit shown in FIG. 8A.

FIG. 10 is a simulation working timing diagram of a driving module including the driving circuit shown in FIG. 8A.

In FIG. 10, the one labeled STU is the waveform diagram of the initial voltage signal, the one labeled O1 (1) is the driving signal outputted by the first stage of driving circuit, and the one labeled O1 (480) is the driving signal outputted by the 480th stage of driving circuit.

In at least one embodiment of the present disclosure, the duty ratio of the clock signal provided by CKA and the duty ratio of the clock signal provided by CKB may be greater than or equal to 20% and less than or equal to 40%, and the clock signal provided by the CKA of an adjacent stage of driving circuit and the clock signal provided by CKB is interchanged, since the input of PQ is controlled by T5, the gate electrode of T5 is electrically connected to CKA, and the time interval between the driving signals provided by the driving signal output terminals of the adjacent stages of driving circuits can be 1H (1H is the scanning time of one row), so the time interval between the clock signal provided by CKA and the clock signal provided by CKB can be 1H, and because the low level maintenance time of the driving signal provided by the driving circuit can be an integer times of 1H, so the low level maintenance time of the input signal provided by I1 can be an integer times of 1H, and the low level maintenance time of the initial voltage signal can also be an integer times of 1H.

When the driving circuit is the first stage of driving circuit included in the driving module, the clock signal provided by CKA and the low voltage signal provided by STU are input at the same time, that is, the first rising edge of the first clock signal provided by CKA is generated simultaneously with the first falling edge of the initial voltage signal provided by STU.

Figure 8B:
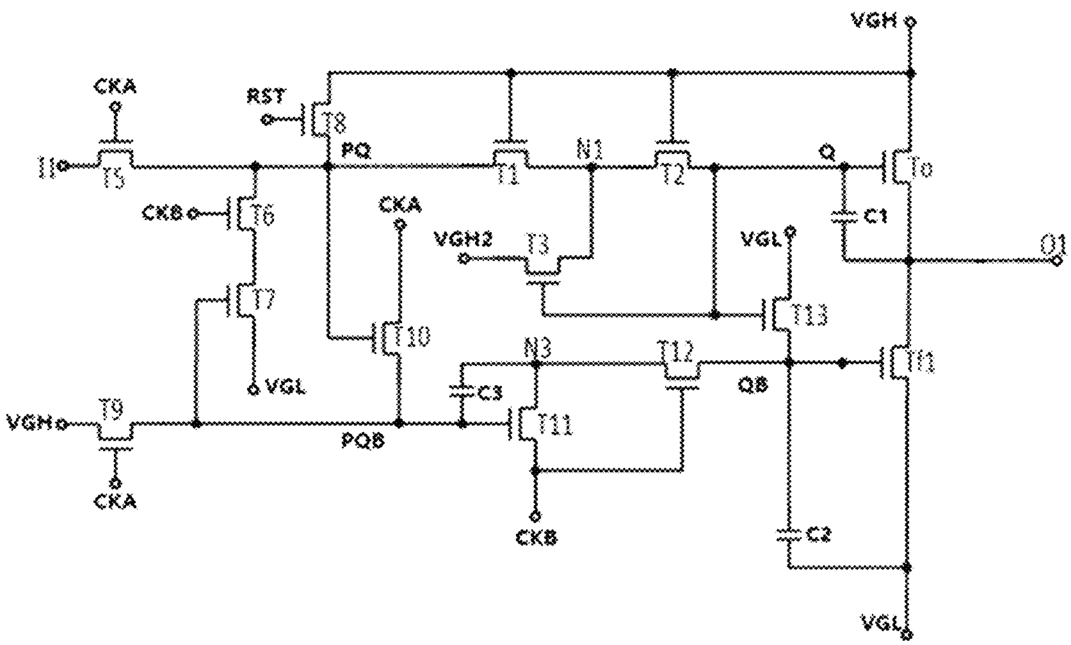
FIG. 8B is a circuit diagram of a driving circuit according to at least one embodiment of the present disclosure.

The difference between at least one embodiment of the driving circuit shown in FIG. 8B of the present disclosure and at least one embodiment of the driving circuit shown in FIG. 8A of the present disclosure is that: the fourth transistor T4 is not provided: the output reset circuit includes a first output reset transistor Tf1 and a second capacitor C2;

The gate electrode of the first output reset transistor Tf1 is electrically connected to the second node QB, the first electrode of the first output reset transistor Tf1 is electrically connected to the driving signal output terminal O1, and the second electrode of the first output reset transistor Tf1 is electrically connected to the second intermediate node N2;

The first electrode plate of the second capacitor C2 is electrically connected to the second node QB, and the second electrode plate of the second capacitor C2 is electrically connected to the first low voltage line VGL.

As shown in FIG. 9, when at least one embodiment of the driving circuit shown in FIG. 8B of the present disclosure is working, In the first phase S1, Tf1 is turned off, To is turned on, and O1 outputs a high voltage signal;

In the second phase S2, Tf1 is turned on, and O1 outputs a low voltage signal;

In the third phase S3, Tf1 is turned off, To is turned on, and O1 outputs a high voltage signal.

In at least one embodiment of the present disclosure, the output reset circuit may only include one output reset transistor, and the driving circuit may not include a second leakage prevention circuit, as shown in FIG. 8B, the output reset circuit may include a first output reset transistor Tf1 and a second capacitor C2; when the potential of QB is a high voltage, Tf1 is turned on: when the potential of QB is a low voltage, Tf1 is turned off.

Figure 8C:
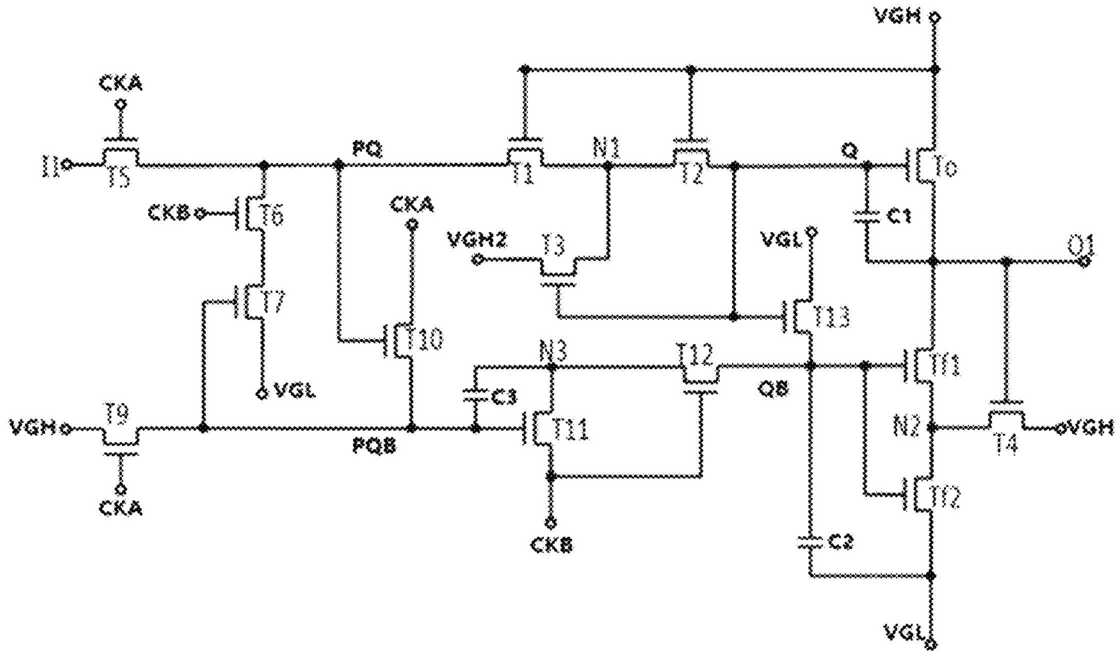
FIG. 8C is a circuit diagram of a driving circuit according to at least one embodiment of the present disclosure.

The difference between at least one embodiment of the driving circuit shown in FIG. 8C of the present disclosure and at least one embodiment of the driving circuit shown in FIG. 8A of the present disclosure is that the eighth transistor T8 is not provided.

In at least one embodiment of the driving circuit shown in FIG. 8C of the present disclosure, the first control node control circuit includes a fifth transistor T5, a sixth transistor T6, and a seventh transistor T7;

The gate electrode of the fifth transistor T5 is electrically connected to the first clock signal line CKA, the first electrode of the fifth transistor T5 is electrically connected to the input terminal I1, and the second electrode of the fifth transistor T5 is electrically connected to the first control node PQ;

The gate electrode of the sixth transistor T6 is electrically connected to the second clock signal line CKB, and the first electrode of the sixth transistor T6 is electrically connected to the first control node PQ;

The gate electrode of the seventh transistor T7 is electrically connected to the second control node PQB, the first electrode of the seventh transistor T7 is electrically connected to the second electrode of the sixth transistor T6, and the second electrode of the seventh transistor T7 is electrically connected to the first low voltage line VGL.

During operation of at least one embodiment of the driving circuit shown in FIG. 8C of the present disclosure, the potential of the first control node PQ is controlled by T5, T6 and T7.

Figure 8D:
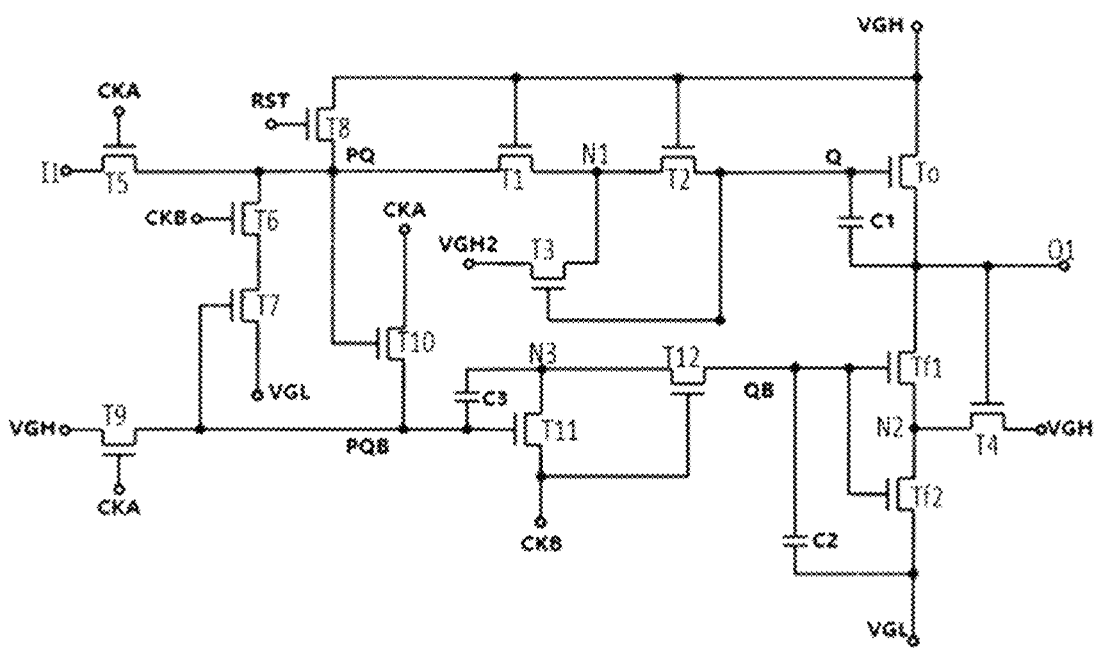
FIG. 8D is a circuit diagram of a driving circuit according to at least one embodiment of the present disclosure.

The difference between at least one embodiment of the driving circuit shown in FIG. 8D of the present disclosure and at least one embodiment of the driving circuit shown in FIG. 8A of the present disclosure is that the thirteenth transistor T13 is not provided.

In at least one embodiment of the driving circuit shown in FIG. 8D, the second node control circuit includes an eleventh transistor T11, a twelfth transistor T12, and a third capacitor C3;

The gate electrode of the eleventh transistor T11 is electrically connected to the second control node PQB, the first electrode of the eleventh transistor T11 is electrically connected to the second clock signal line CKB, and the second electrode of the eleventh transistor T11 is electrically connected to the third intermediate node N3;

The gate electrode of the twelfth transistor T12 is electrically connected to the second clock signal line CKB, the first electrode of the twelfth transistor T12 is electrically connected to the third intermediate node N3, and the second electrode of the twelfth transistor T12 is electrically connected to the second node QB;

A first electrode plate of the third capacitor C3 is electrically connected to the second control node PQB, and a second electrode plate of the third capacitor C3 is electrically connected to the third intermediate node N3.

During operation of at least one embodiment of the driving circuit shown in FIG. 8D of the present disclosure, the potential of the second node QB is controlled by T11, T12 and C3.

Figure 8E:
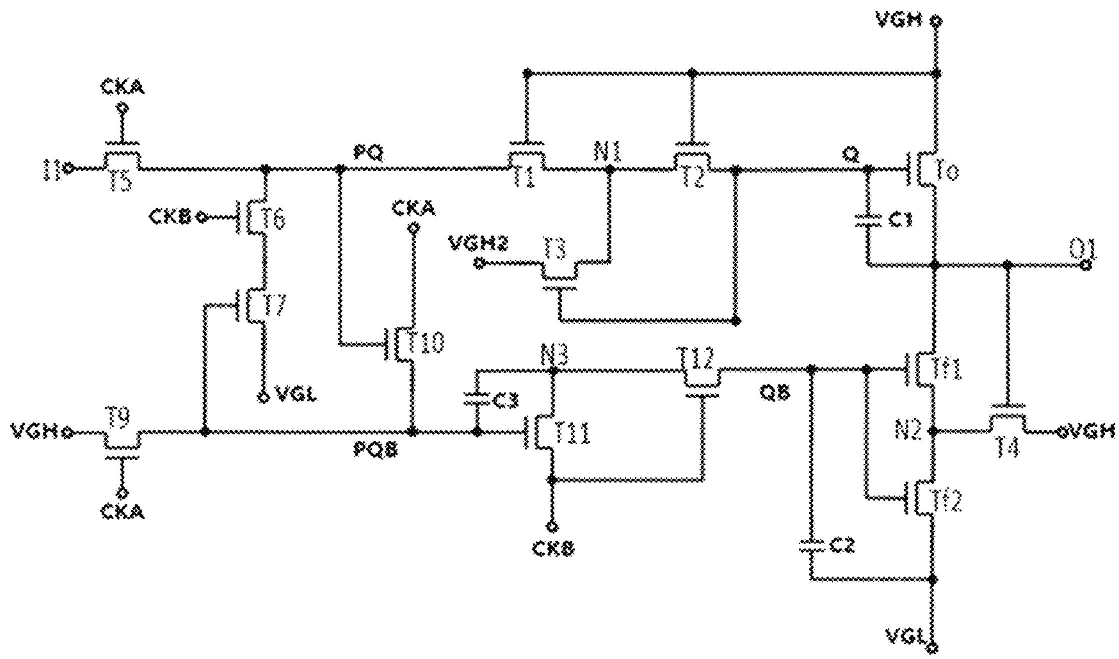
FIG. 8E is a circuit diagram of a driving circuit according to at least one embodiment of the present disclosure.

The difference between at least one embodiment of the driving circuit shown in FIG. 8E of the present disclosure and at least one embodiment of the driving circuit shown in FIG. 8A of the present disclosure is that the eighth transistor T8 and the thirteenth transistor T13 are not provided.

In at least one embodiment of the driving circuit shown in FIG. 8E, the first control node control circuit includes a fifth transistor T5, a sixth transistor T6, and a seventh transistor T7: the second node control circuit includes an eleventh transistor T11, a twelfth transistor T12 and a third capacitor C3: the potential of the first control node PQ is controlled by T5, T6 and T7: the potential of the second node QB is controlled by T11, T12 and C3.

Figure 8F:
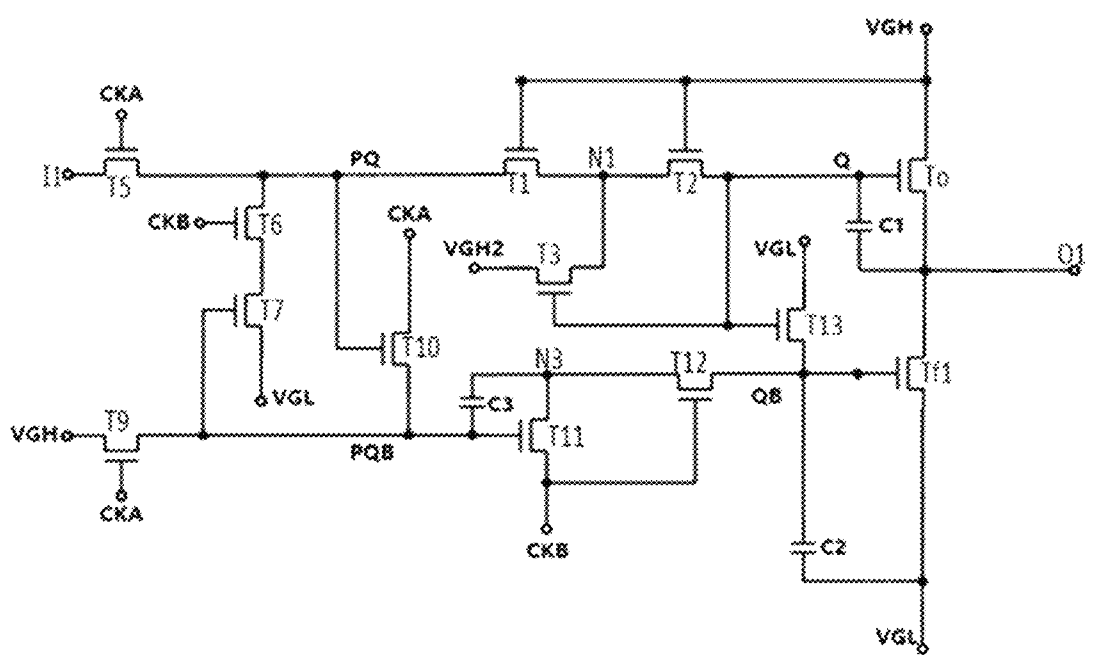
FIG. 8F is a circuit diagram of a driving circuit according to at least one embodiment of the present disclosure.

The difference between at least one embodiment of the driving circuit shown in FIG. 8F of the present disclosure and at least one embodiment of the driving circuit shown in FIG. 8B is that the eighth transistor T8 is not provided.

Figure 8G:
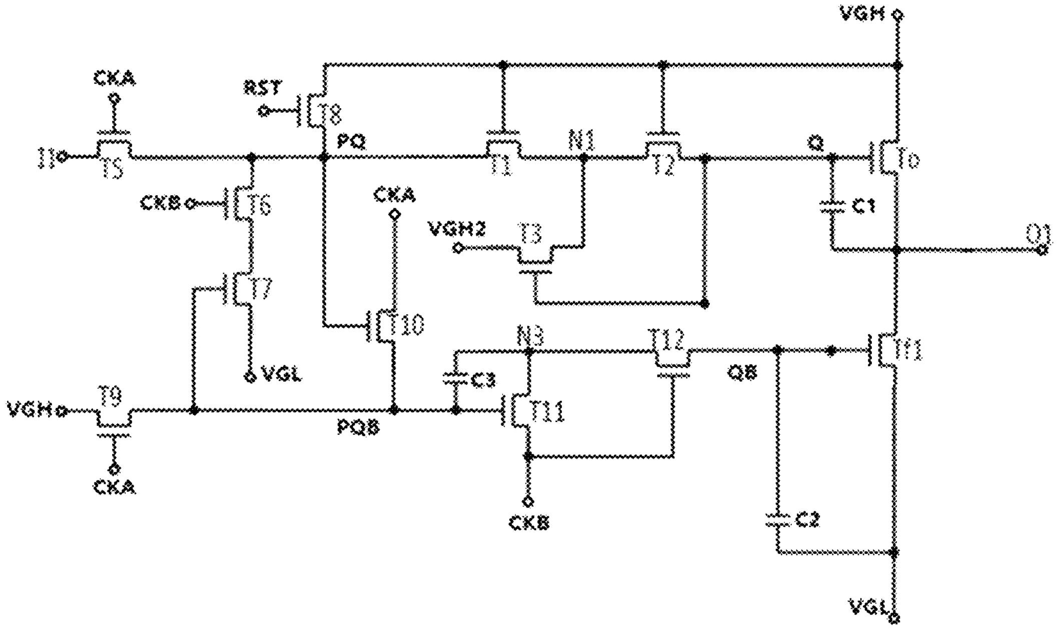
FIG. 8G is a circuit diagram of a driving circuit according to at least one embodiment of the present disclosure.

The difference between at least one embodiment of the driving circuit shown in FIG. 8G of the present disclosure and at least one embodiment of the driving circuit shown in FIG. 8B of the present disclosure is that the thirteenth transistor T13 is not provided.

Figure 8H:
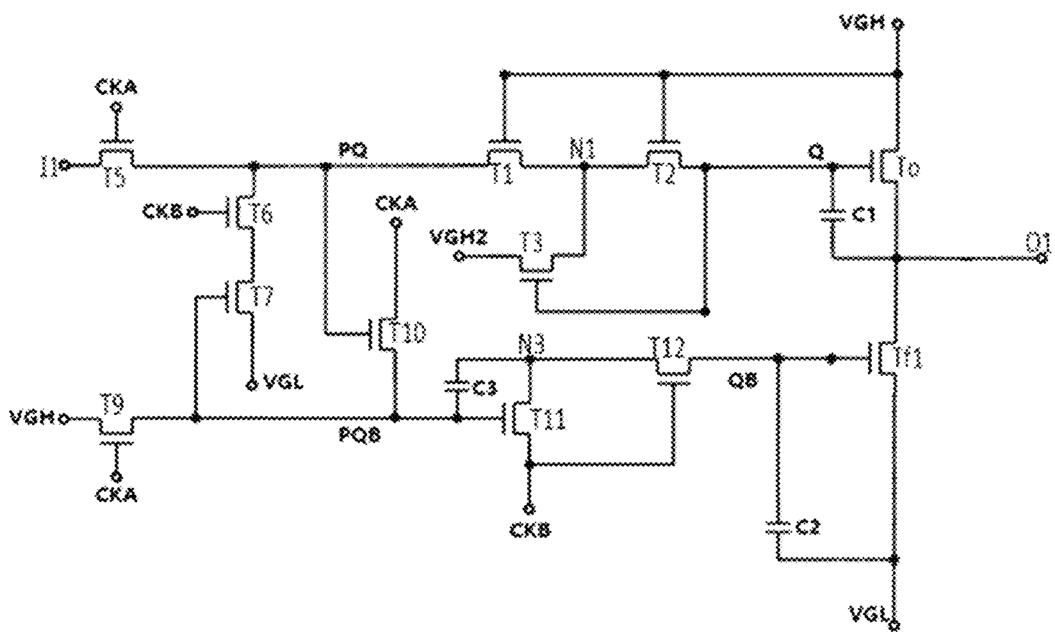
FIG. 8H is a circuit diagram of a driving circuit according to at least one embodiment of the present disclosure.

The difference between at least one embodiment of the driving circuit shown in FIG. 8H of the present disclosure and at least one embodiment of the driving circuit shown in FIG. 8B of the present disclosure is that the eighth transistor T8 and the thirteenth transistor T13 are not provided.

In specific implementation, the driving circuit described in at least one embodiment of the present disclosure may not include the eighth transistor T8 and/or the thirteenth transistor T13, at this time, the driving circuit described in at least one embodiment of the present disclosure can also accurately control the potential of the first node PQ and the potential of the second node QB. The difference between at least one embodiment of the driving circuit shown in FIG. 11A and at least one embodiment of the driving circuit shown in FIG. 8A is that the gate electrode of T4 is electrically connected to the first node Q.

Figure 11A:
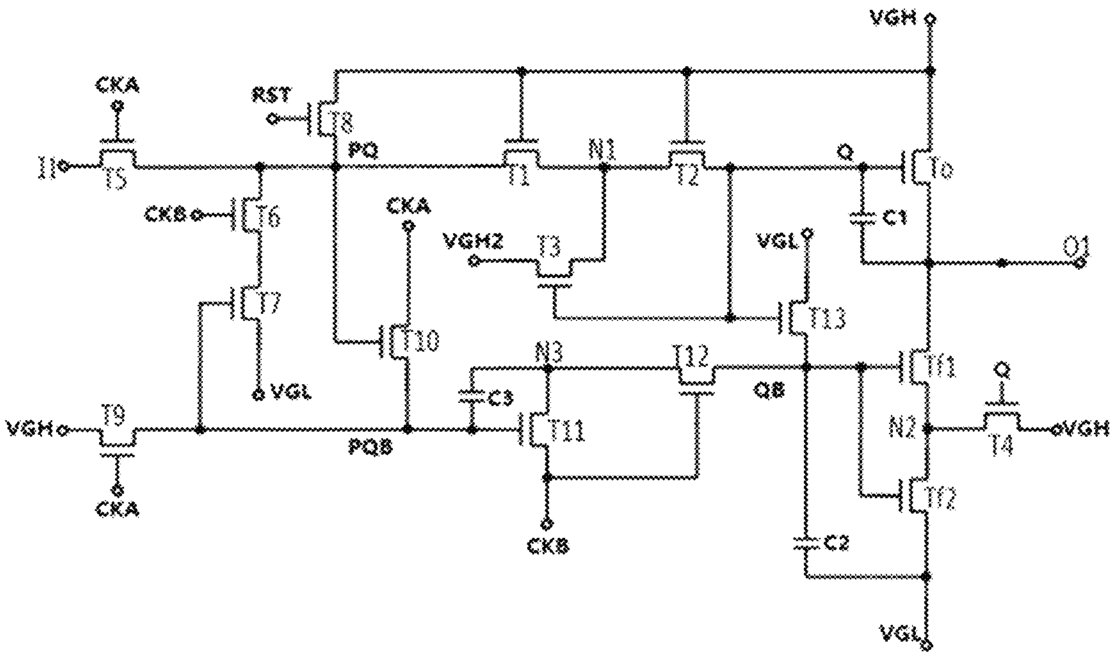
FIG. 11A is a circuit diagram of a driving circuit according to at least one embodiment of the present disclosure.
Figure 12:
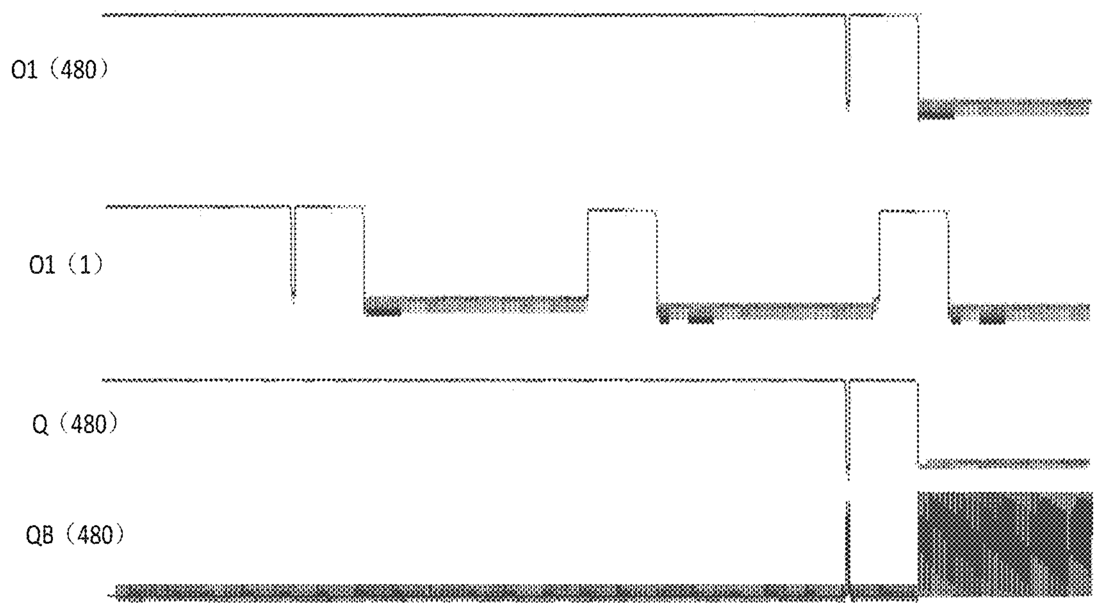
FIG. 12 is a simulation working timing diagram of a driving module including the driving circuit shown in FIG. 11A.

FIG. 12 is a simulation working timing diagram of a driving module including the driving circuit shown in FIG. 11A.

In FIG. 12, the one labeled O1 (1) is the driving signal outputted by the first stage of driving circuit, the one labeled O1 (480) is the driving signal outputted by the 480th stage of driving circuit, and the one labeled Q (480) is the waveform of the potential of the first node in the 480th stage of driving circuit, and the one labeled QB (480) is the waveform of the potential of the second node in the 480th stage of driving circuit.

Figure 11B:
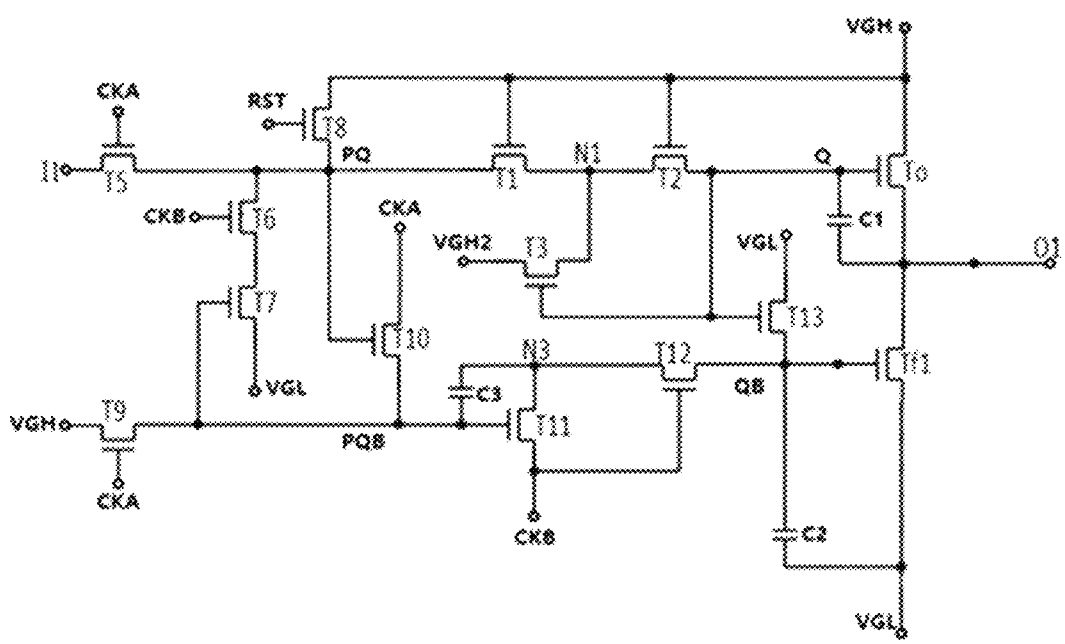
FIG. 11B is a circuit diagram of a driving circuit according to at least one embodiment of the present disclosure.

The difference between at least one embodiment of the driving circuit shown in FIG. 11B of the present disclosure and at least one embodiment of the driving circuit shown in FIG. 11A of the present disclosure is that the fourth transistor T4 is not provided: the output reset circuit includes a first output resetting the transistor Tf1 and the second capacitor C2;

The gate electrode of the first output reset transistor Tf1 is electrically connected to the second node QB, the first electrode of the first output reset transistor Tf1 is electrically connected to the driving signal output terminal O1, and the second electrode of the first output reset transistor Tf1 is electrically connected to the second intermediate node N2;

The first electrode plate of the second capacitor C2 is electrically connected to the second node QB, and the second electrode plate of the second capacitor C2 is electrically connected to the first low voltage line VGL.

In at least one embodiment of the present disclosure, the output reset circuit may only include one output reset transistor, and the driving circuit may not include a second leakage prevention circuit, as shown in FIG. 11B, the output reset circuit may include a first output reset transistor Tf1 and a second capacitor C2: when the potential of QB is a high voltage, Tf1 is turned on: when the potential of QB is a low voltage, Tf1 is turned off.

Figure 11C:
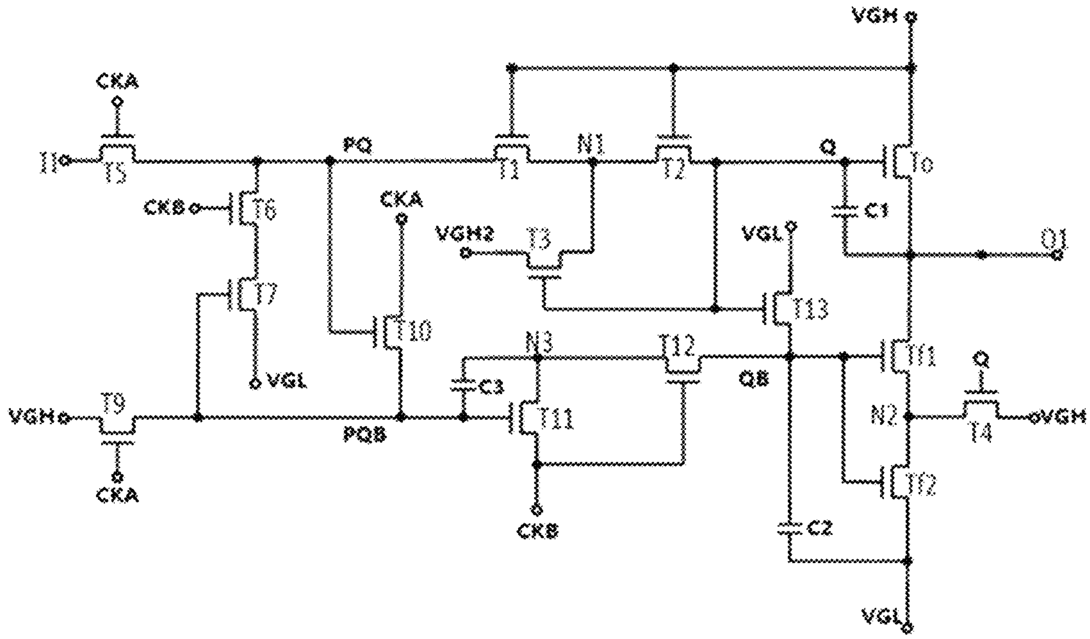
FIG. 11C is a circuit diagram of a driving circuit according to at least one embodiment of the present disclosure.

The difference between at least one embodiment of the driving circuit shown in FIG. 11C of the present disclosure and at least one embodiment of the driving circuit shown in FIG. 11A of the present disclosure is that the eighth transistor T8 is not provided.

In at least one embodiment of the driving circuit shown in FIG. 11C of the present disclosure, the first control node control circuit includes a fifth transistor T5, a sixth transistor T6, and a seventh transistor T7;

The gate electrode of the fifth transistor T5 is electrically connected to the first clock signal line CKA, the first electrode of the fifth transistor T5 is electrically connected to the input terminal I1, and the second electrode of the fifth transistor T5 is electrically connected to the first control node PQ;

The gate electrode of the sixth transistor T6 is electrically connected to the second clock signal line CKB, and the first electrode of the sixth transistor T6 is electrically connected to the first control node PQ;

The gate electrode of the seventh transistor T7 is electrically connected to the second control node PQB, the first electrode of the seventh transistor T7 is electrically connected to the second electrode of the sixth transistor T6, and the second electrode of the seventh transistor T7 is electrically connected to the first low voltage line VGL.

During operation of at least one embodiment of the driving circuit shown in FIG. 11C of the present disclosure, the potential of the first control node PQ is controlled by T5, T6 and T7.

Figure 11D:
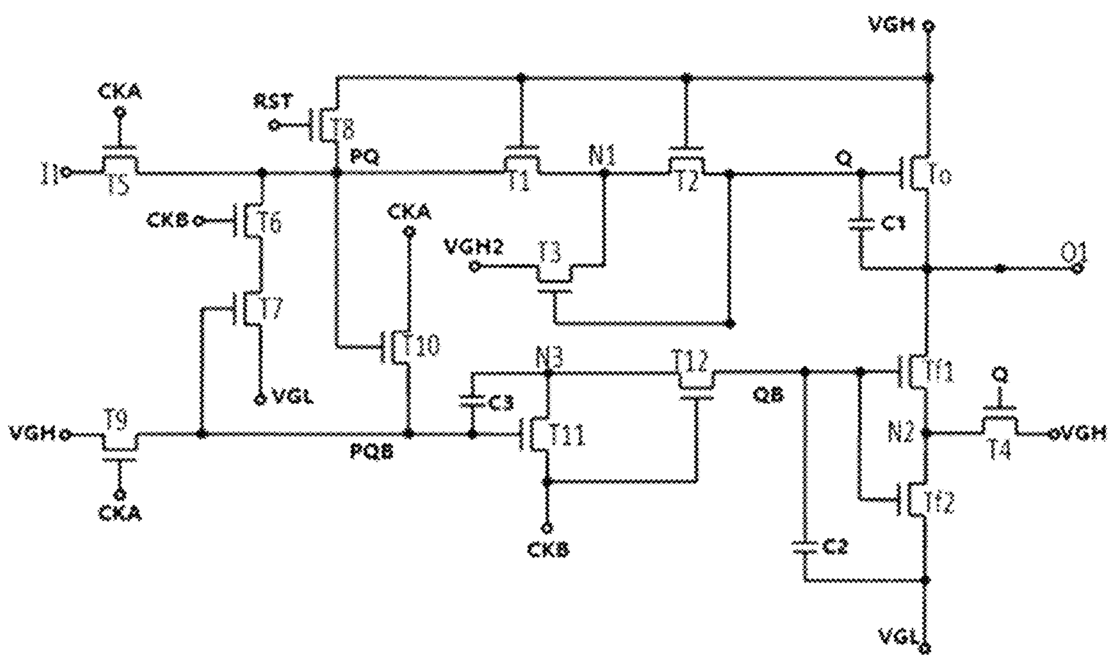
FIG. 11D is a circuit diagram of a driving circuit according to at least one embodiment of the present disclosure.

The difference between at least one embodiment of the driving circuit shown in FIG. 11D of the present disclosure and at least one embodiment of the driving circuit shown in FIG. 11A of the present disclosure is that the thirteenth transistor T13 is not provided.

In at least one embodiment of the driving circuit shown in FIG. 11D, the second node control circuit includes an eleventh transistor T11, a twelfth transistor T12, and a third capacitor C3;

The gate electrode of the eleventh transistor T11 is electrically connected to the second control node PQB, the first electrode of the eleventh transistor T11 is electrically connected to the second clock signal line CKB, and the second electrode of the eleventh transistor T11 is electrically connected to the third intermediate node N3;

The gate electrode of the twelfth transistor T12 is electrically connected to the second clock signal line CKB, the first electrode of the twelfth transistor T12 is electrically connected to the third intermediate node N3, and the second electrode of the twelfth transistor T12 is electrically connected to the second node QB;

A first electrode plate of the third capacitor C3 is electrically connected to the second control node PQB, and a second electrode plate of the third capacitor C3 is electrically connected to the third intermediate node N3.

During operation of at least one embodiment of the driving circuit shown in FIG. 11D of the present disclosure, the potential of the second node QB is controlled by T11, T12 and C3.

Figure 11E:
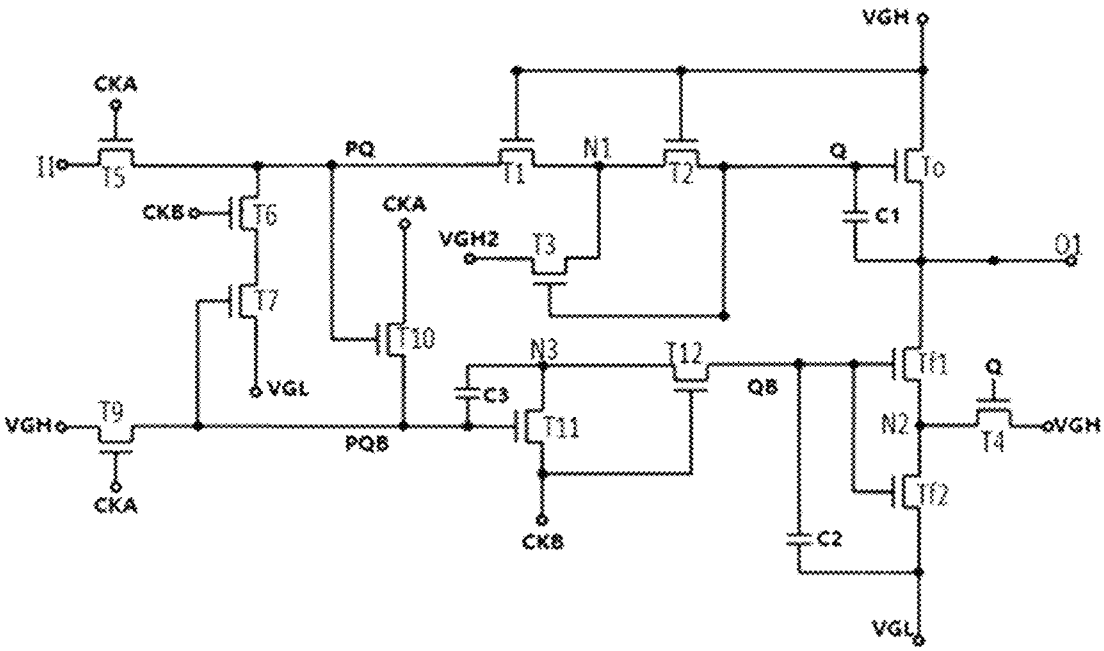
FIG. 11E is a circuit diagram of a driving circuit according to at least one embodiment of the present disclosure.

The difference between at least one embodiment of the driving circuit shown in FIG. 11E of the present disclosure and at least one embodiment of the driving circuit shown in FIG. 11A of the present disclosure is that the eighth transistor T8 and the thirteenth transistor T13 are not provided.

In at least one embodiment of the driving circuit shown in FIG. 11E, the first control node control circuit includes a fifth transistor T5, a sixth transistor T6, and a seventh transistor T7: the second node control circuit includes an eleventh transistor T11, a twelfth transistor T12 and a third capacitor C3: the potential of the first control node PQ is controlled by T5, T6 and T7: the potential of the second node QB is controlled by T11, T12 and C3.

Figure 11F:
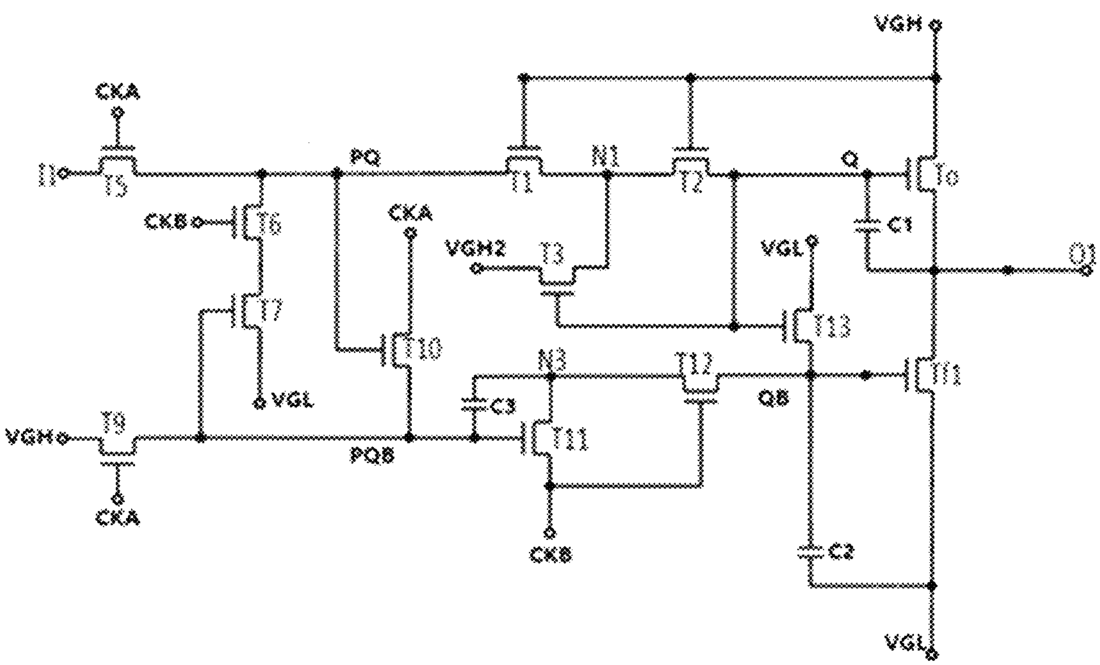
FIG. 11F is a circuit diagram of a driving circuit according to at least one embodiment of the present disclosure.

The difference between at least one embodiment of the driving circuit shown in FIG. 11F of the present disclosure and at least one embodiment of the driving circuit shown in FIG. 11B is that the eighth transistor T8 is not provided.

Figure 11G:
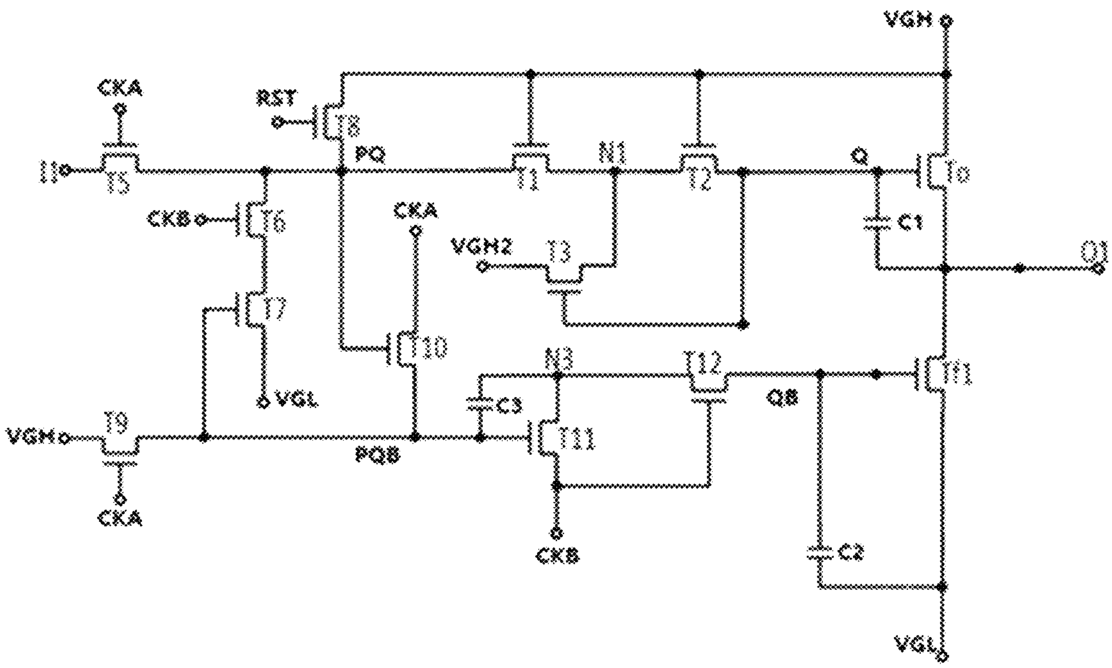
FIG. 11G is a circuit diagram of a driving circuit according to at least one embodiment of the present disclosure.

The difference between at least one embodiment of the driving circuit shown in FIG. 11G of the present disclosure and at least one embodiment of the driving circuit shown in FIG. 11B of the present disclosure is that the thirteenth transistor T13 is not provided.

Figure 11H:
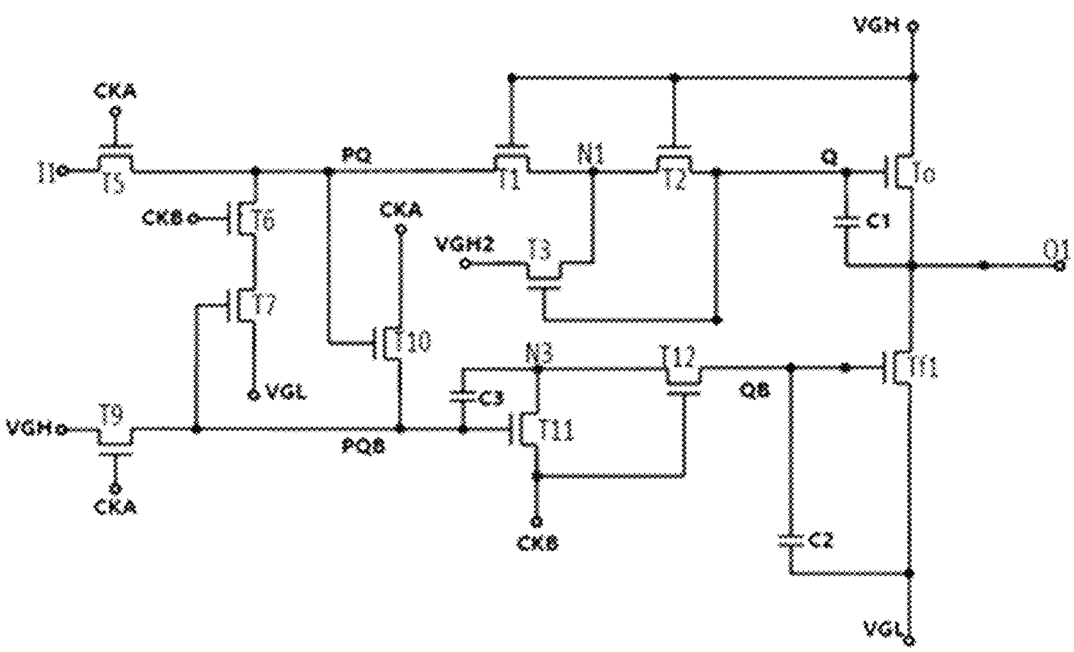
FIG. 11H is a circuit diagram of a driving circuit according to at least one embodiment of the present disclosure.

The difference between at least one embodiment of the driving circuit shown in FIG. 11H of the present disclosure and at least one embodiment of the driving circuit shown in FIG. 11B of the present disclosure is that the eighth transistor T8 and the thirteenth transistor T13 are not provided.

In specific implementation, the driving circuit described in at least one embodiment of the present disclosure may not include the eighth transistor T8 and/or the thirteenth transistor T13, at this time, the driving circuit described in at least one embodiment of the present disclosure can also accurately control the potential of the first node PQ and the potential of the second node QB.

Figure 13A:
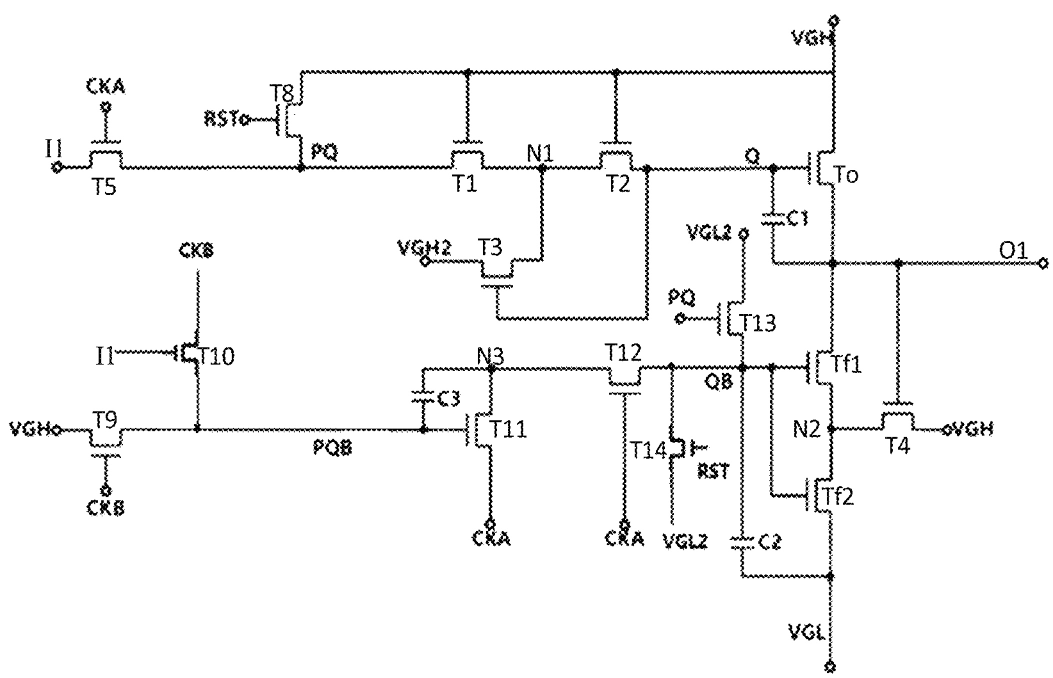
FIG. 13A is a circuit diagram of a driving circuit according to at least one embodiment of the present disclosure.

As shown in FIG. 13A, on the basis of at least one embodiment of the driving circuit shown in FIG. 7, The first control circuit includes a first transistor T1, the second control circuit includes a second transistor T2, and the third control circuit includes a third transistor T3;

The gate electrode of the first transistor T1 is electrically connected to the first high voltage line VGH, the first electrode of the first transistor T1 is electrically connected to the first control node PQ, and the second electrode of the first transistor T1 is electrically connected to the first intermediate node N1;

The gate electrode of the second transistor T2 is electrically connected to the first high voltage line VGH, the first electrode of the second transistor T2 is electrically connected to the first intermediate node N1, and the second electrode of the second transistor T2 is electrically connected to the first node Q;

The gate electrode of the third transistor T3 is electrically connected to the first node Q, the first electrode of the third transistor T3 is electrically connected to the second high voltage line VGH2, and the second electrode of the third transistor T3 is electrically connected to the first node Q;

The output circuit includes an output transistor To and a first capacitor C1, and the output reset circuit includes a first output reset transistor Tf1, a second output reset transistor Tf2, and a second capacitor C2;

The gate electrode of the output transistor To is electrically connected to the first node Q, the first electrode of the output transistor To is electrically connected to the first high voltage line VGH, the second electrode of the output transistor To is connected to the driving signal output Terminal O1;

The first electrode plate of the first capacitor C1 is electrically connected to the first node Q, and the second electrode plate of the first capacitor C1 is electrically connected to the driving signal output terminal O1;

The gate electrode of the first output reset transistor Tf1 is electrically connected to the second node QB, the first electrode of the first output reset transistor Tf1 is electrically connected to the driving signal output terminal O1, and the second electrode of the first output reset transistor Tf1 is electrically connected to the second intermediate node N2;

The gate electrode of the second output reset transistor Tf2 is electrically connected to the second node QB, the first electrode of the second output reset transistor Tf2 is electrically connected to the second intermediate node N2, and the second electrode of the second output reset transistor Tf2 is electrically connected to the first low voltage line VGL;

The first electrode plate of the second capacitor C2 is electrically connected to the second node QB, and the second electrode plate of the second capacitor C2 is electrically connected to the first low voltage line VGL;

The second leakage prevention circuit includes a fourth transistor T4;

The gate electrode of the fourth transistor T4 is electrically connected to the driving signal output terminal O1, the first electrode of the fourth transistor T4 is electrically connected to the first high voltage line VGH, and the second electrode of the fourth transistor T4 is electrically connected to the second intermediate node N2;

The first control node control circuit includes a fifth transistor T5 and an eighth transistor T8;

The gate electrode of the fifth transistor T5 is electrically connected to the first clock signal line CKA, the first electrode of the fifth transistor T5 is electrically connected to the input terminal I1, and the second electrode of the fifth transistor T5 is electrically connected to the first control node PQ;

The gate electrode of the eighth transistor T8 is electrically connected to the reset line RST, the first electrode of the eighth transistor T8 is electrically connected to the first high voltage line VGH, and the second electrode of the eighth transistor T8 is electrically connected to the first control node PQ;

The second control node control circuit includes a ninth transistor T9 and a tenth transistor T10;

The gate electrode of the ninth transistor T9 is electrically connected to the second clock signal line CKB, the first electrode of the ninth transistor T9 is electrically connected to the first high voltage line VGH, and the second electrode of the ninth transistor T9 The electrode is electrically connected to the second control node PQB;

The gate electrode of the tenth transistor T10 is electrically connected to the input terminal I1, the first electrode of the tenth transistor T10 is electrically connected to the second clock signal line CKB, and the second electrode of the tenth transistor T10 is electrically connected to the second control nodes PQB;

The second node control circuit includes an eleventh transistor T11, a twelfth transistor T12, a thirteenth transistor T13, a fourteenth transistor T14 and a third capacitor C3;

The gate electrode of the eleventh transistor T11 is electrically connected to the second control node PQB, the first electrode of the eleventh transistor T11 is electrically connected to the first clock signal line CKA, and the second electrode of the eleventh transistor T11 is electrically connected to the third intermediate node N3;

The gate electrode of the twelfth transistor T12 is electrically connected to the first clock signal line CKA, the first electrode of the twelfth transistor T12 is electrically connected to the third intermediate node N3, and the second electrode of the twelfth transistor T12 is electrically connected to the second node QB;

The gate electrode of the thirteenth transistor T13 is electrically connected to the first control node PQ, the first electrode of the thirteenth transistor T13 is electrically connected to the second low voltage line VGL2, and the second electrode of the thirteenth transistor T13 is electrically connected to the second node QB;

The gate electrode of the fourteenth transistor T14 is electrically connected to the reset line RST, the first electrode of the fourteenth transistor T14 is electrically connected to the second low voltage line VGL2, and the second electrode of the fourteenth transistor T14 is electrically connected to the second node QB;

A first electrode plate of the third capacitor C3 is electrically connected to the second control node PQB, and a second electrode plate of the third capacitor C3 is electrically connected to the third intermediate node N3.

In at least one embodiment of the driver circuit shown in FIG. 13A, all transistors are n-type transistors.

In at least one embodiment of the driving circuit shown in FIG. 13A, the voltage value of the second low voltage signal provided by VGL2 may be −8V, and the voltage value of the low voltage signal provided by VGL may be −6V.

In at least one embodiment of the driving circuit shown in FIG. 13A, T14 is added. T14 is controlled by the reset signal provided by RST. The width-to-length ratio of T14 can be 20/6. When RST provides a high voltage signal, T14 is turned on, to fully discharge QB to prevent noise.

In at least one embodiment of the driving circuit shown in FIG. 13A, the gate electrode of T10 is directly electrically connected to the input terminal I1, so that the potential of PQB remains at a high potential when I1 provides a low voltage signal, so that when CKA provides a high voltage signal, the potential of QB is bootstrapped and pulled up.

In at least one embodiment of the driving circuit shown in FIG. 13A, the first voltage line is the first high voltage line, the second voltage line is the second high voltage line, the third voltage line is the first low voltage line, and the fourth voltage line is the second low voltage line.

At least one embodiment of the driving circuit shown in FIG. 13A of the present disclosure can provide a light emitting control signal for the pixel circuit through the driving signal output terminal O1, that is, the driving signal provided by the driving signal output terminal O1 can be a light emitting control signal.

In at least one embodiment of the driving circuit shown in FIG. 13A, when the driving circuit is the first stage of driving circuit included in the driving module, the input terminal I1 is electrically connected to the initial voltage line, to receive the initial voltage signal from the initial voltage line;

When the driving circuit is a driving circuit included in the driving module other than the nth stage of driving circuit, the input terminal of the nth stage of driving circuit may be electrically connected to the driving signal output terminal of the (n−1)th stage of driving circuit.

When at least one embodiment of the driving circuit shown in FIG. 13A is in operation, the duty ratio of the clock signal provided by CKA and the duty ratio of the clock signal provided by CKB can be 45%, and the high voltage value of the clock signal provided by CKA can be 24V, the low voltage value of the clock signal provided by CKA can be −6V, the high voltage value of the clock signal provided by CKB can be 24V, the low voltage value of the clock signal provided by CKB can be −6V, and the high voltage value of the reset signal provided by RST can be 24V, the low voltage value of the reset signal can be −6V, the voltage value of the first high voltage signal provided by VGH can be 20V, and the voltage value of the second high voltage signal provided by VGH2 can be 24V, the voltage value of the first low voltage signal provided by VGL may be −6V, and the voltage value of the second low voltage signal provided by VGL2 may be −8V.

When at least one embodiment of the driving circuit shown in FIG. 13A is the first stage of driving circuit included in the driving module, the input terminal I1 is electrically connected to the initial voltage line STU, and the high voltage value of the initial voltage signal provided by the STU can be 20V, the low voltage value of the initial voltage signal provided by the STU can be −6V.

Figure 14:
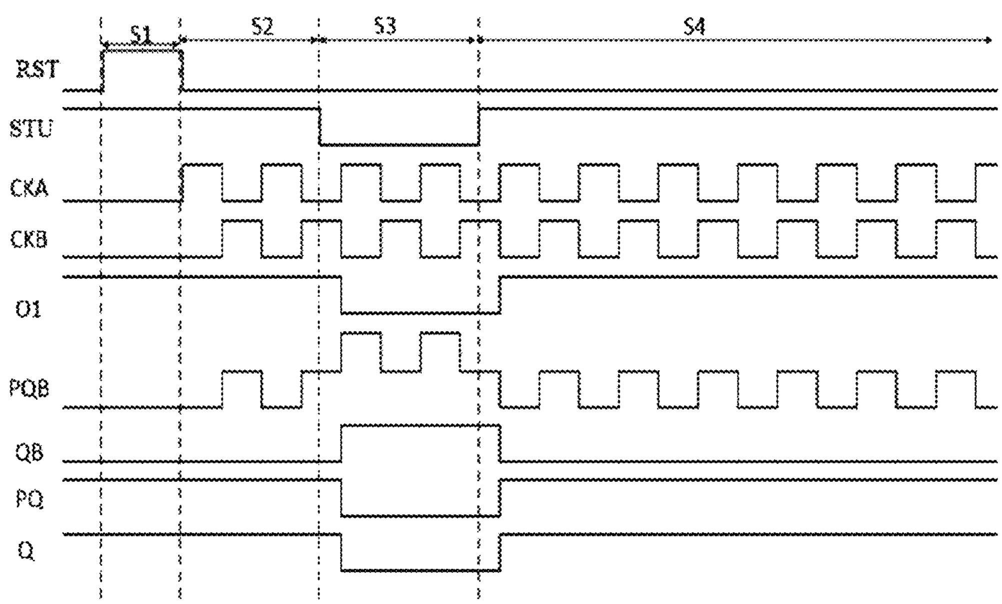
FIG. 14 is a working timing diagram of the driving circuit shown in FIG. 13A of at least one embodiment of the present disclosure.

As shown in FIG. 14, when at least one embodiment of the driving circuit shown in FIG. 13A is in operation, when the driving circuit is the first stage of driving circuit included in the driving module, I1 is electrically connected to the initial voltage line STU;

In the first phase S1, RST provides a high voltage signal, STU provides a low voltage signal, CKA and CKB provide a low voltage signal, T5 is turned on, the potential of PQ is a high voltage, T10 is turned on, the potential of PQB is a low voltage, T14 is turned on, QB is connected to VGL2, Tf1 and Tf2 are turned off, T1 and T2 are turned on, the potential of Q is a high voltage, To is turned on, and O1 outputs a high voltage signal;

In the second phase S2, RST provides a low voltage signal, STU provides a high voltage signal, T10 is turned on, and PQB and CKB are connected: when CKA provides a high voltage signal, T5 is turned on, and the potential of PQ is maintained at a high voltage, the potential of Q is maintained at a high voltage, and O1 outputs a high voltage signal;

In the third phase S3, RST provides a low voltage signal, STU provides a low voltage signal, when CKA provides a high voltage signal, T5 is turned on, the potential of PQ is a low voltage, T1 and T2 are turned on, Q and PQ are connected, the potential of Q is a low voltage. When CKB provides a high voltage signal, T9 is turned on, and PQB is connected to VGH, the potential of PQB is high voltage, and T11 is turned on. When CKA provides a high voltage signal, T12 is turned on, and the potential of QB is high voltage, when CKA provides a high voltage signal, the potential of PQB is bootstrapped and pulled up: Tf1 and Tf2 are turned on, and O1 outputs a low voltage signal;

In the fourth phase S4, RST provides a low voltage signal, STU provides a high voltage signal, T10 is turned on, and PQB and CKB are connected. When CKB provides a high voltage signal, the potential of PQB is a high voltage signal, T11 is turned on, and CKA is connected to N3, when CKA provides a high voltage signal, T12 is turned on, QB is connected to VGL2, the potential of QB is a low voltage, Tf1 and Tf2 are turned off: when CKA provides a high voltage signal, T5 is turned on, and the potential of PQ is a high voltage, T1 and T2 are turned on, Q and PQ are connected, so that the potential of Q is a high voltage, To is turned on, and O1 outputs a high voltage signal.

At least one embodiment of the driving circuit shown in FIG. 13A is in operation, in the first phase S1 and the fourth phase S4, after the potential of the first node Q becomes a high voltage, T1 and T2 can be turned off;

Since the high voltage value of the initial voltage signal provided by the STU can be 20V, in the first phase S1 and the fourth phase S4, T1 and T2 are turned on, so that the potential of the first node Q can be slightly less than 20V, when the potential of the first node Q is abnormally bootstrapped and pulled up, if the potential of the first node Q and the voltage value of the second high voltage signal provided by VGH2 are greater than the threshold voltage of T3, T3 is turned on, so that N1 and VGH2 are connected, thereby preventing the current from flowing from Q to PQ, and avoiding the abnormal output of the driving signal output terminal caused by the decrease of the potential of the first node Q.

Figure 15:
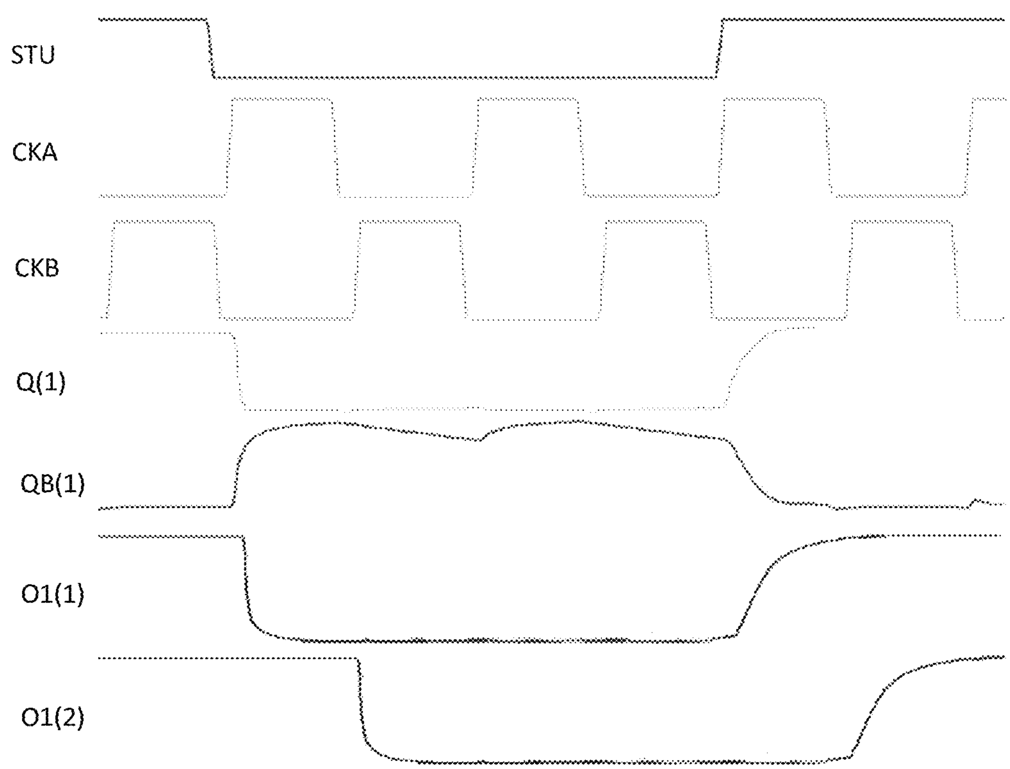
FIG. 15 is a simulation working timing diagram of a driving module including the driving circuit shown in FIG. 13A.

FIG. 15 is a simulation working timing diagram of a driving module including the driving circuit shown in FIG. 13A.

In FIG. 15, the one labeled STU is the waveform diagram of the initial voltage signal, and the input terminal of the first stage of driving circuit is electrically connected to the initial voltage line STU;

The one labeled Q(1) is the potential of the first node in the first stage of driving circuit, and the one labeled QB(1) is the potential of the second node in the first stage of driving circuit;

The one labeled O1 (1) is the driving signal outputted by the first stage of driving circuit, the one labeled O1 (2) is the driving signal outputted by the second stage of driving circuit, and the one labeled O1 (3) is the driving signal outputted by the third stage of driving circuit, the one labeled O1 (4) is the driving signal outputted by the fourth stage of driving circuit, and the ones labeled O1 (5) is the driving signal outputted by the fifth stage of driving circuit.

Figure 13B:
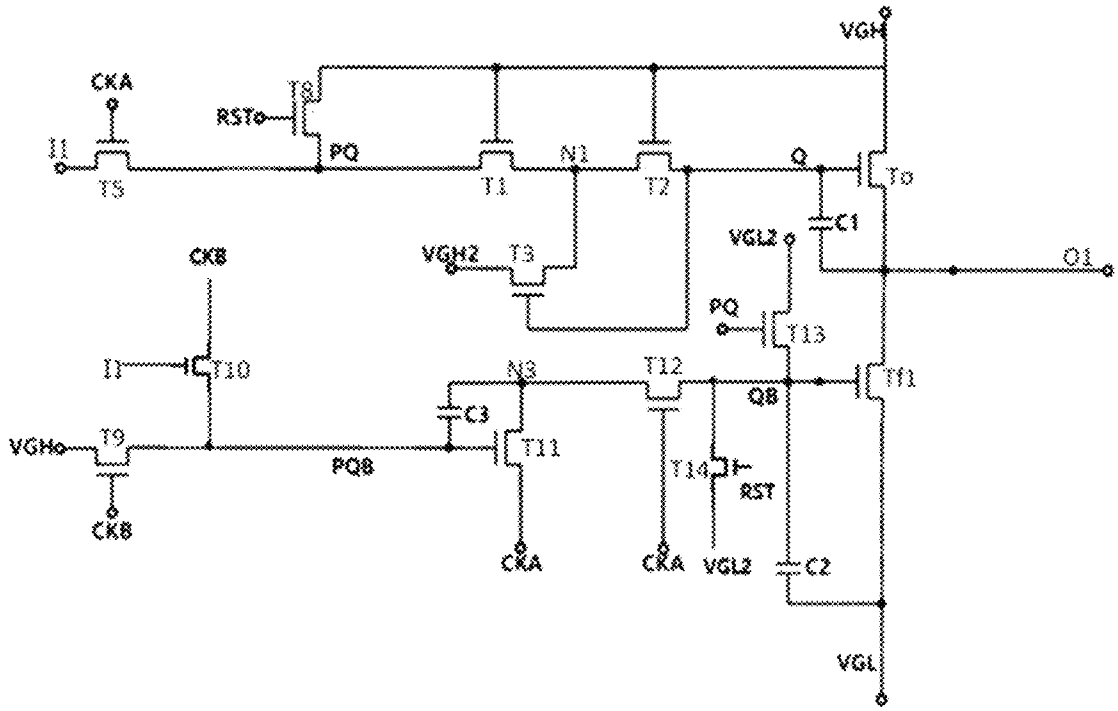
FIG. 13B is a circuit diagram of a driving circuit according to at least one embodiment of the present disclosure.

The difference between at least one embodiment of the driving circuit shown in FIG. 13B of the present disclosure and at least one embodiment of the driving circuit shown in FIG. 13A of the present disclosure is that: the fourth transistor T4 is not provided: the output reset circuit includes a first output resetting the transistor Tf1 and the second capacitor C2;

The gate electrode of the first output reset transistor Tf1 is electrically connected to the second node QB, the first electrode of the first output reset transistor Tf1 is electrically connected to the driving signal output terminal O1, and the second electrode of the first output reset transistor Tf1 is electrically connected to the second intermediate node N2;

The first electrode plate of the second capacitor C2 is electrically connected to the second node QB, and the second electrode plate of the second capacitor C2 is electrically connected to the first low voltage line VGL.

In at least one embodiment of the present disclosure, the output reset circuit may only include one output reset transistor, and the driving circuit may not include a second leakage prevention circuit, as shown in FIG. 13B, the output reset circuit may include a first output reset transistor Tf1 and a second capacitor C2: when the potential of QB is a high voltage, Tf1 is turned on: when the potential of QB is a low voltage, Tf1 is turned off.

Figure 13C:
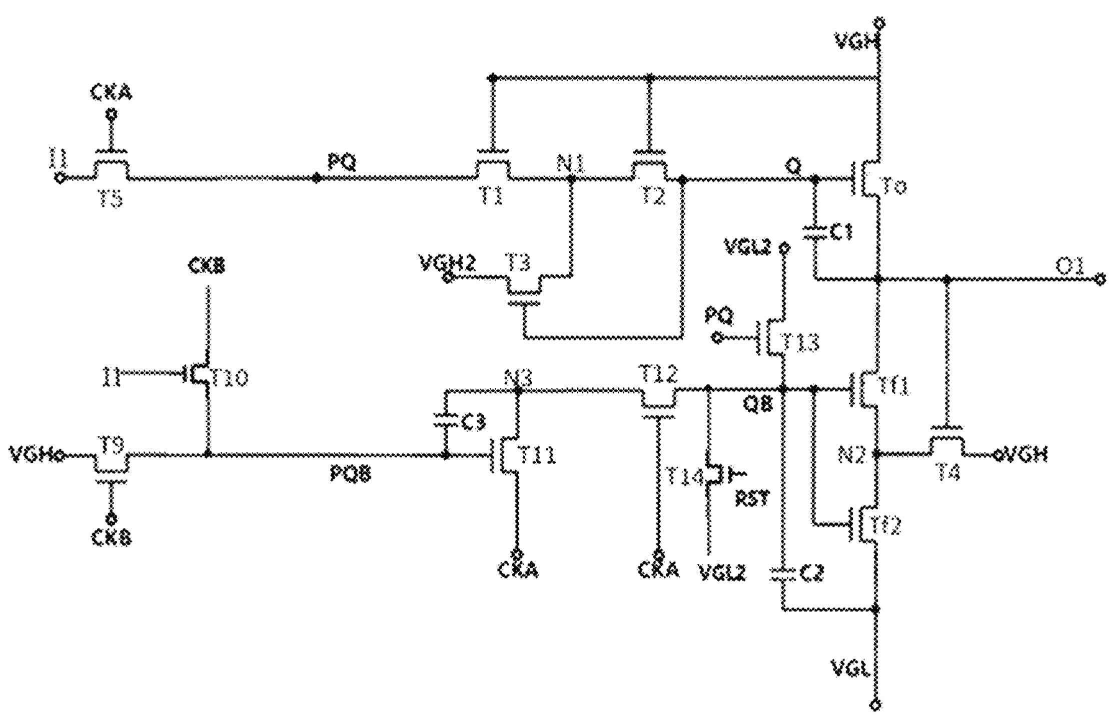
FIG. 13C is a circuit diagram of a driving circuit according to at least one embodiment of the present disclosure.

The difference between at least one embodiment of the driving circuit shown in FIG. 13C of the present disclosure and at least one embodiment of the driving circuit shown in FIG. 13A of the present disclosure is that the eighth transistor T8 is not provided.

In at least one embodiment of the driving circuit shown in FIG. 13C of the present disclosure, the first control node control circuit includes a fifth transistor T5; the potential of the first control node PQ is controlled by T5.

Figure 13D:
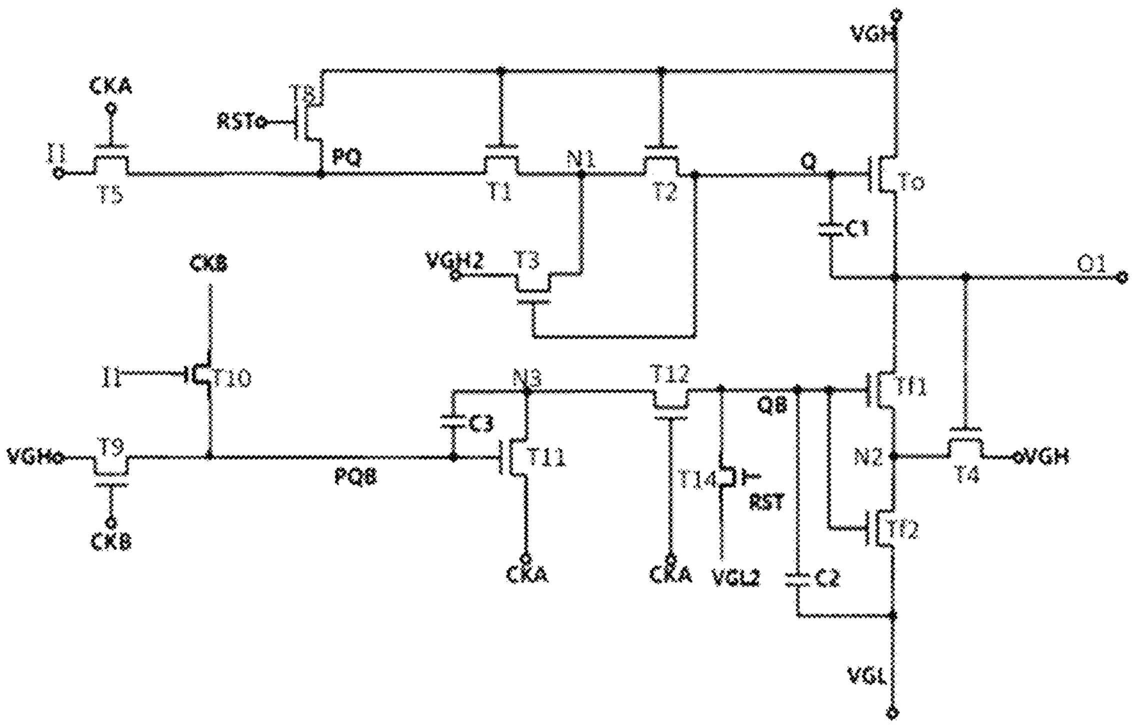
FIG. 13D is a circuit diagram of a driving circuit according to at least one embodiment of the present disclosure.

The difference between at least one embodiment of the driving circuit shown in FIG. 13D of the present disclosure and at least one embodiment of the driving circuit shown in FIG. 13A of the present disclosure is that the thirteenth transistor T13 is not provided.

In at least one embodiment of the driving circuit shown in FIG. 13D of the present disclosure, the second node control circuit includes an eleventh transistor T11, a twelfth transistor T12, a fourteenth transistor T14, and a third capacitor C3: the potential of the second node QB is controlled by T11, T12, T14 and C3.

Figure 13E:
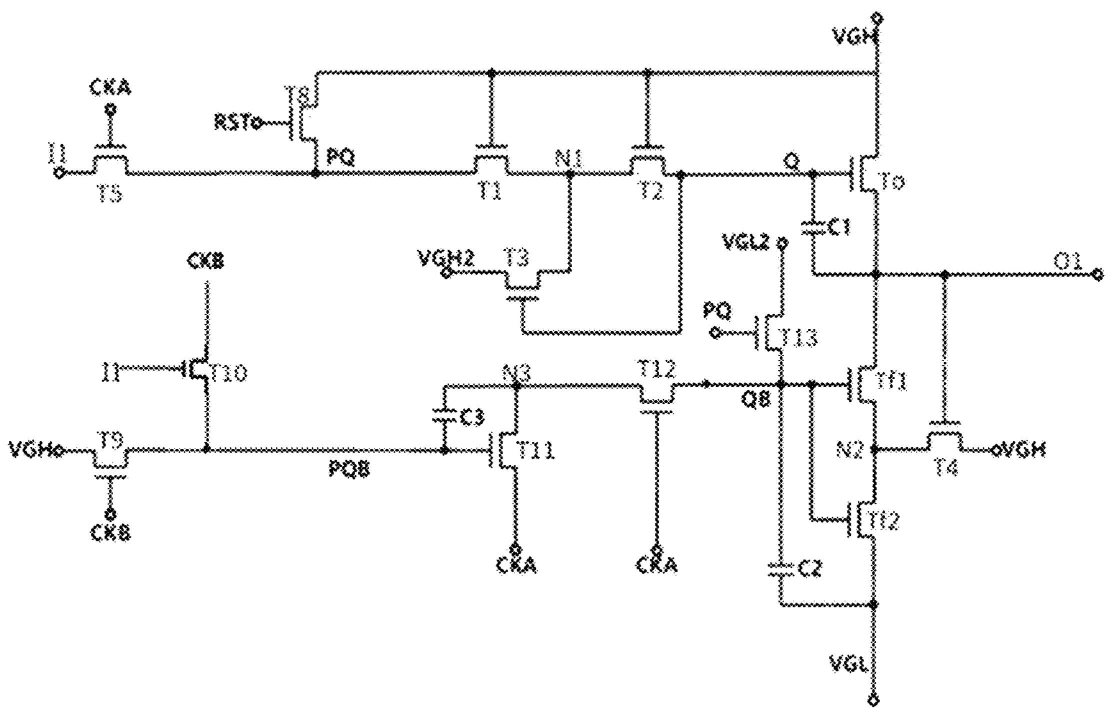
FIG. 13E is a circuit diagram of a driving circuit according to at least one embodiment of the present disclosure.

The difference between at least one embodiment of the driving circuit shown in FIG. 13E of the present disclosure and at least one embodiment of the driving circuit shown in FIG. 13A of the present disclosure is that the fourteenth transistor T14 is not provided.

In at least one embodiment of the driving circuit shown in FIG. 13E, the second node control circuit includes an eleventh transistor T11, a twelfth transistor T12, a thirteenth transistor T13, and a third capacitor C3: T11, the potential of the second node QB is controlled by T12, T13 and C3.

Figure 13F:
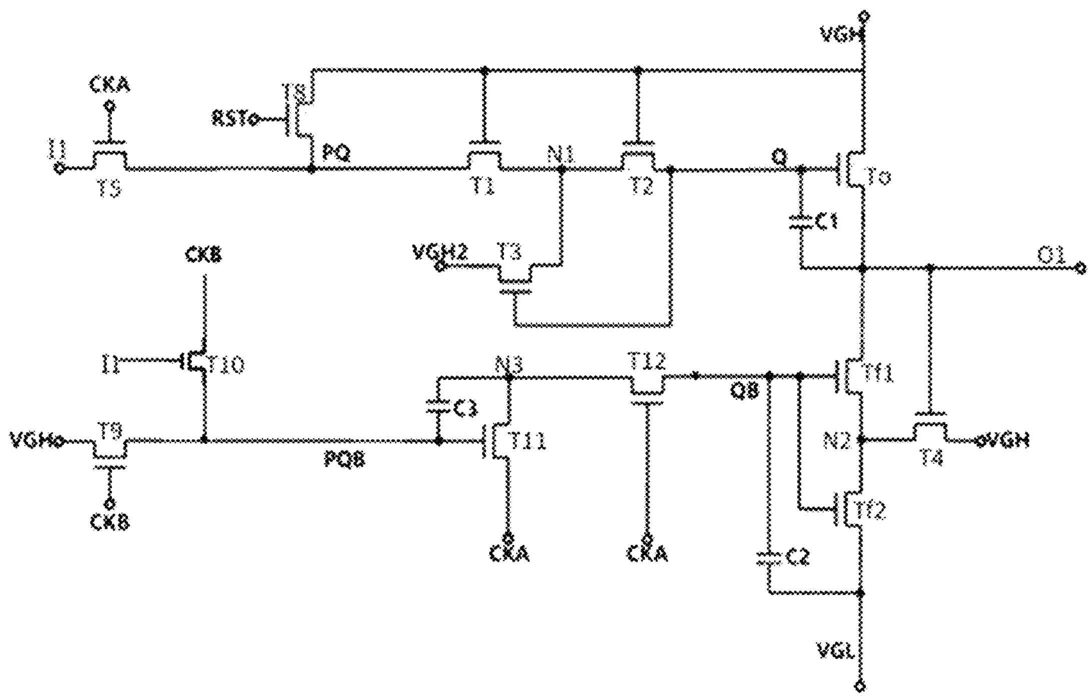
FIG. 13F is a circuit diagram of a driving circuit according to at least one embodiment of the present disclosure.

The difference between at least one embodiment of the driving circuit shown in FIG. 13F of the present disclosure and at least one embodiment of the driving circuit shown in FIG. 13A is that T13 and T14 are not provided.

In at least one embodiment of the driving circuit shown in FIG. 13F, the second node control circuit includes an eleventh transistor T11, a twelfth transistor T12, and a third capacitor C3; the potential of the second node QB is controlled by T11, T12, and C3.

Figure 13G:
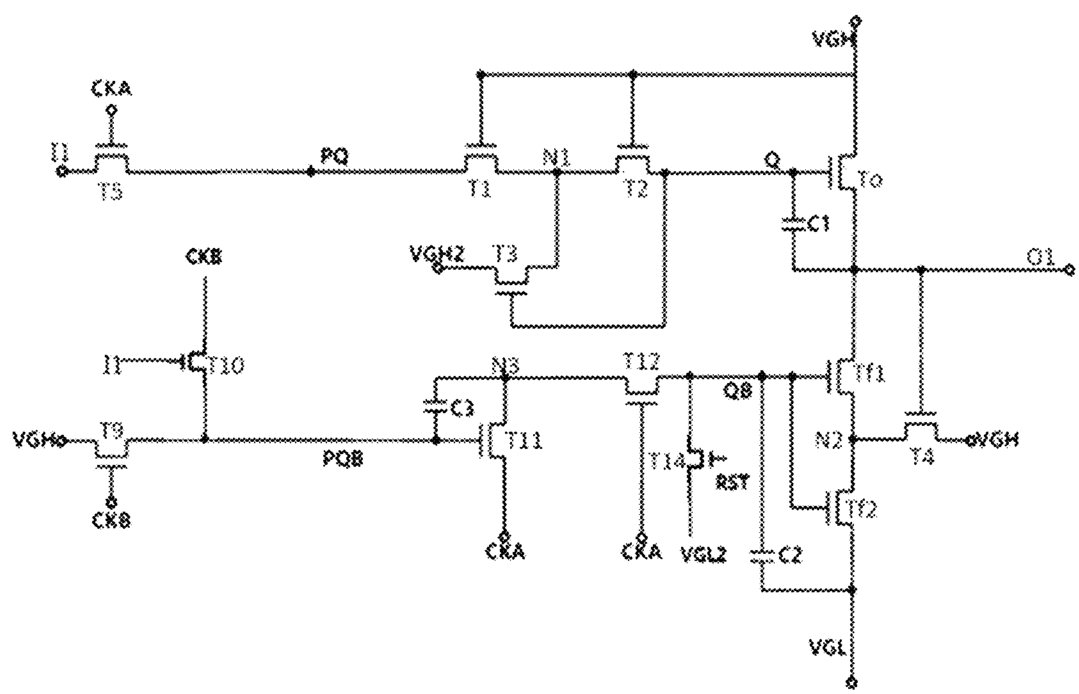
FIG. 13G is a circuit diagram of a driving circuit according to at least one embodiment of the present disclosure.

The difference between at least one embodiment of the driving circuit shown in FIG. 13G of the present disclosure and at least one embodiment of the driving circuit shown in FIG. 13A is that T8 and T13 are not provided.

Figure 13H:
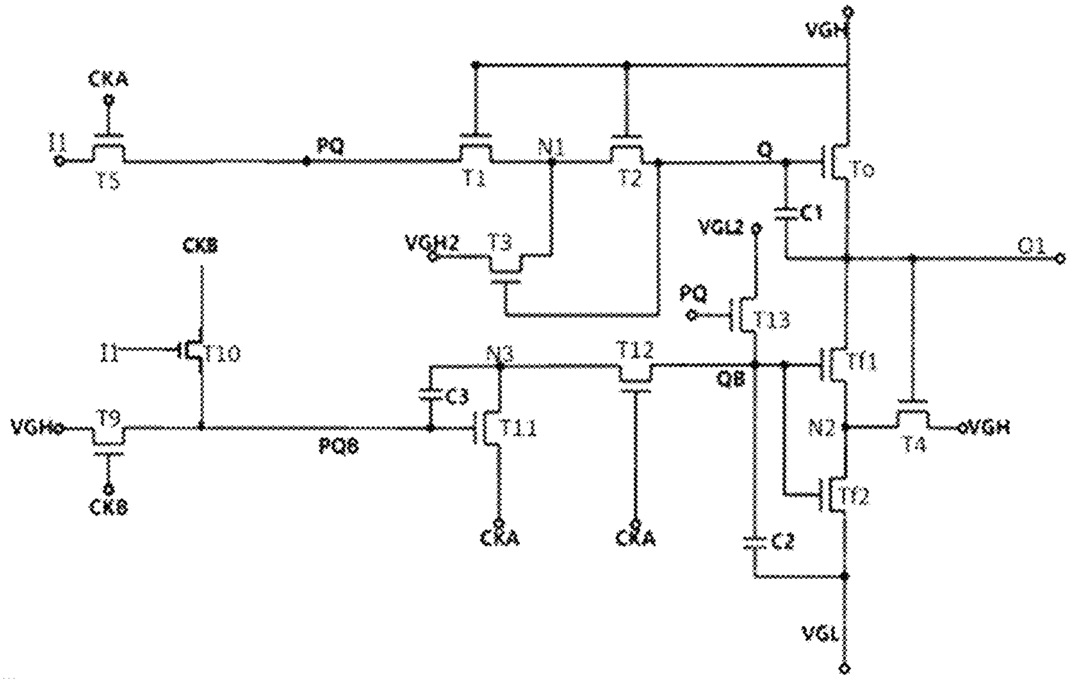
FIG. 13H is a circuit diagram of a driving circuit according to at least one embodiment of the present disclosure.

The difference between at least one embodiment of the driving circuit shown in FIG. 13H of the present disclosure and at least one embodiment of the driving circuit shown in FIG. 13A is that T8 and T14 are not provided.

Figure 13I:
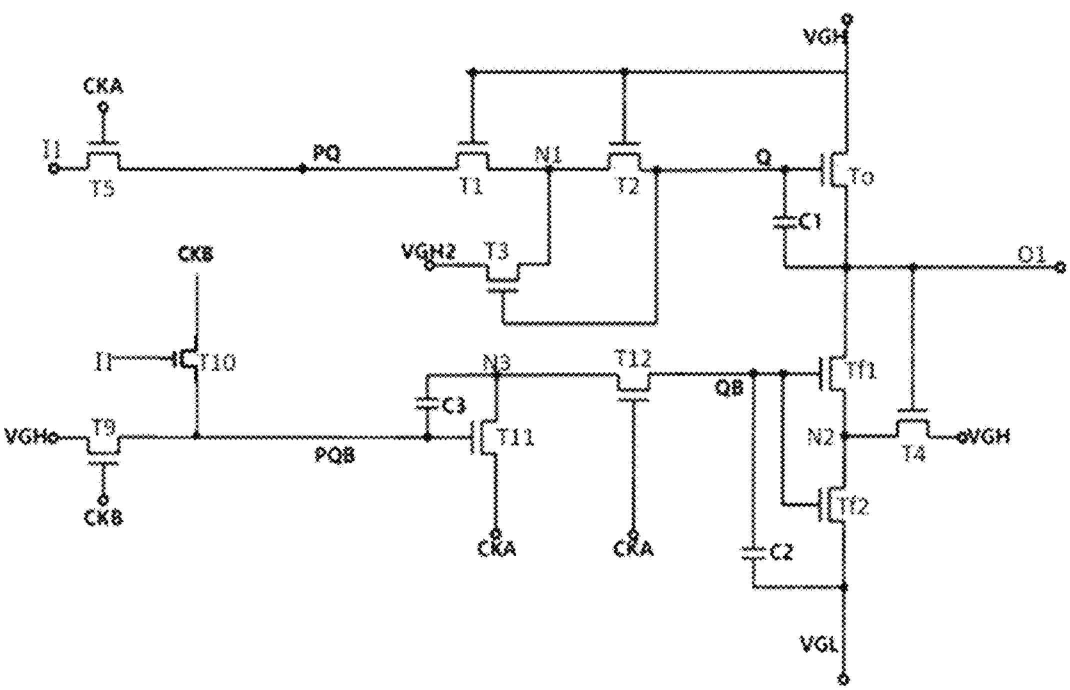
FIG. 13I is a circuit diagram of a driving circuit according to at least one embodiment of the present disclosure.

The difference between at least one embodiment of the driving circuit shown in FIG. 13I of the present disclosure and at least one embodiment of the driving circuit shown in FIG. 13A is that T8, T13 and T14 are not provided.

Figure 13J:
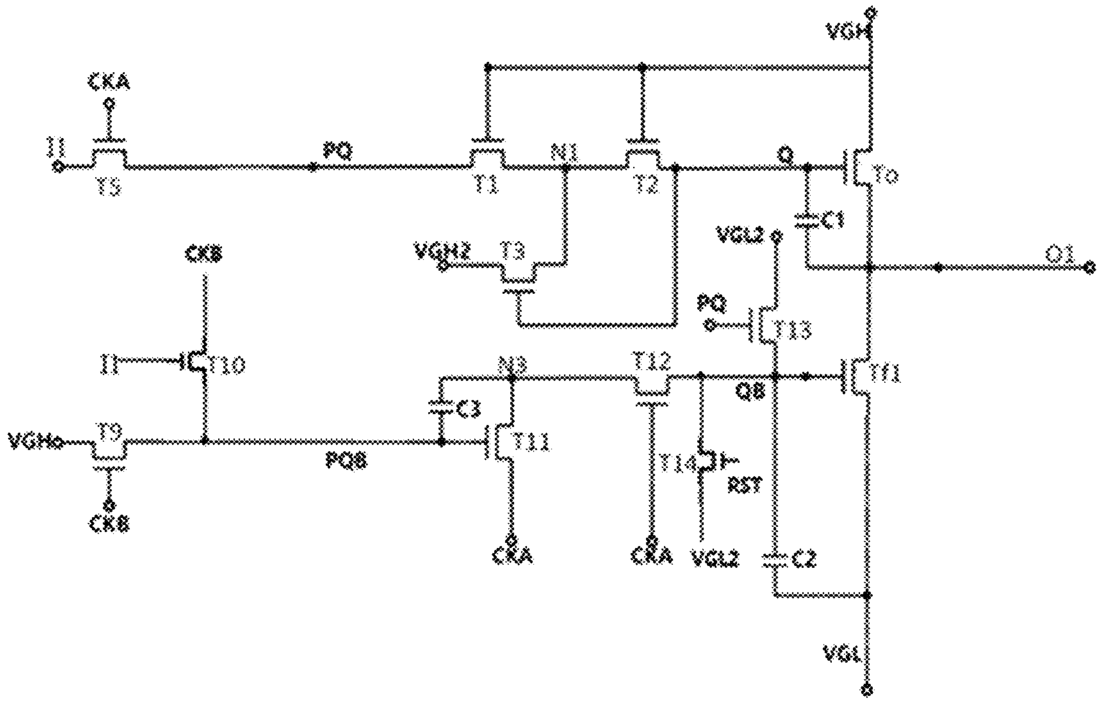
FIG. 13J is a circuit diagram of a driving circuit according to at least one embodiment of the present disclosure.

The difference between at least one embodiment of the driving circuit shown in FIG. 13J of the present disclosure and at least one embodiment of the driving circuit shown in FIG. 13B is that the eighth transistor T8 is not provided.

Figure 13K:
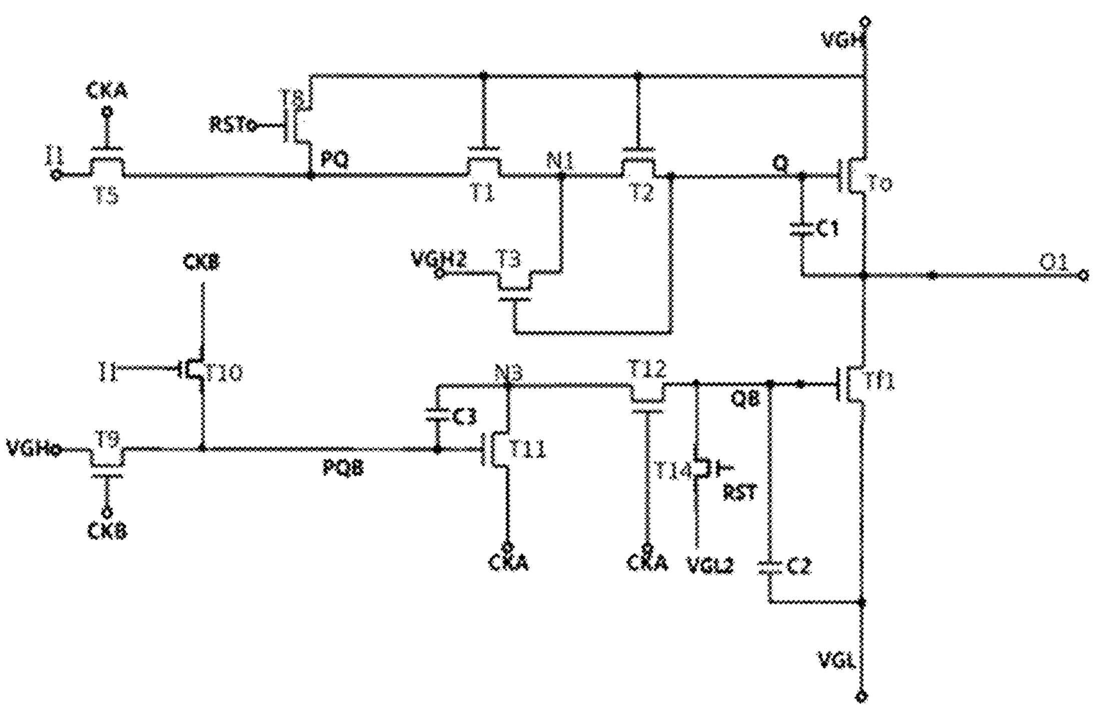
FIG. 13K is a circuit diagram of a driving circuit according to at least one embodiment of the present disclosure.

The difference between at least one embodiment of the driving circuit shown in FIG. 13K of the present disclosure and at least one embodiment of the driving circuit shown in FIG. 13B of the present disclosure is that the thirteenth transistor T13 is not provided.

Figure 13L:
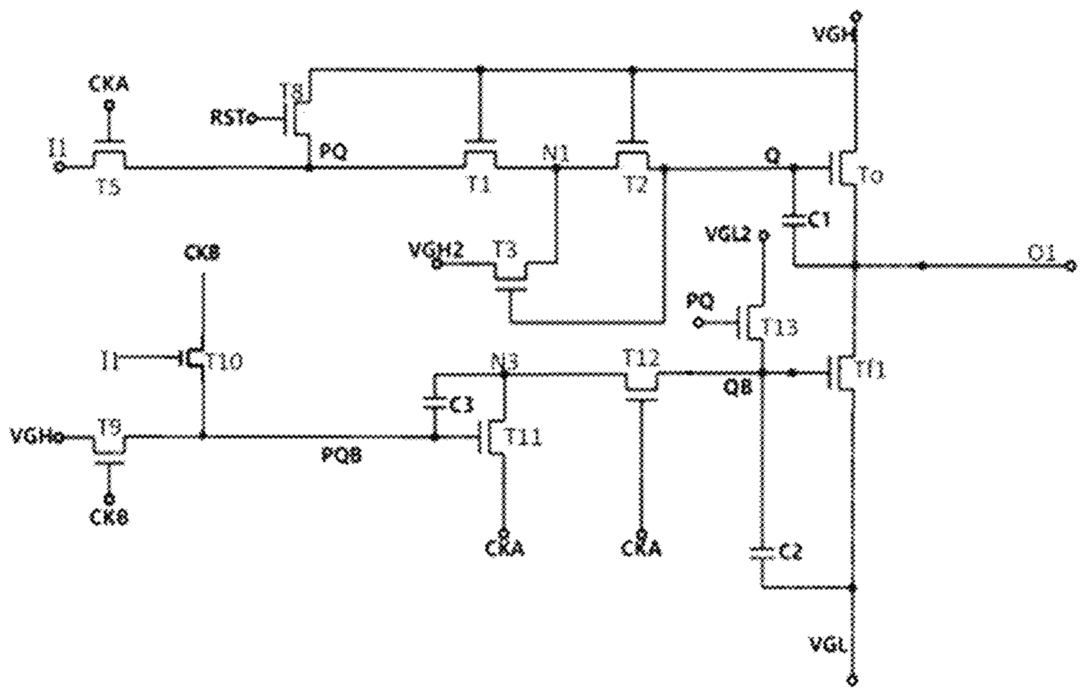
FIG. 13L is a circuit diagram of a driving circuit according to at least one embodiment of the present disclosure.

The difference between at least one embodiment of the driving circuit shown in FIG. 13L of the present disclosure and at least one embodiment of the driving circuit shown in FIG. 13B of the present disclosure is that the fourteenth transistor T14 is not provided.

Figure 13M:
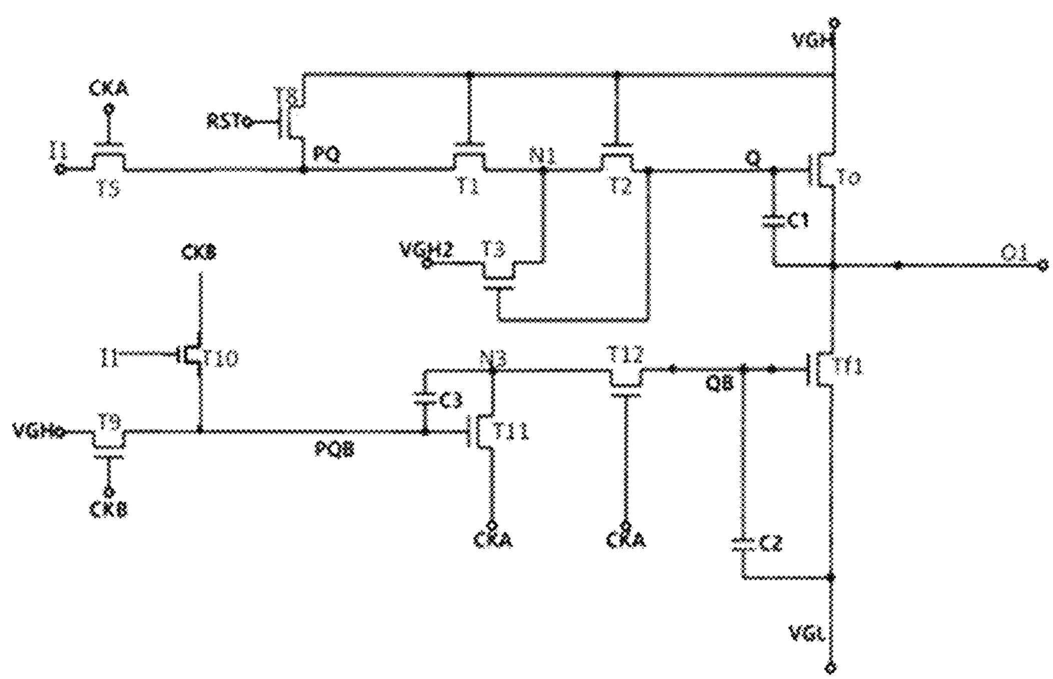
FIG. 13M is a circuit diagram of a driving circuit according to at least one embodiment of the present disclosure.

The difference between at least one embodiment of the driving circuit shown in FIG. 13M of the present disclosure and at least one embodiment of the driving circuit shown in FIG. 13B is that T13 and T14 are not provided.

Figure 13N:
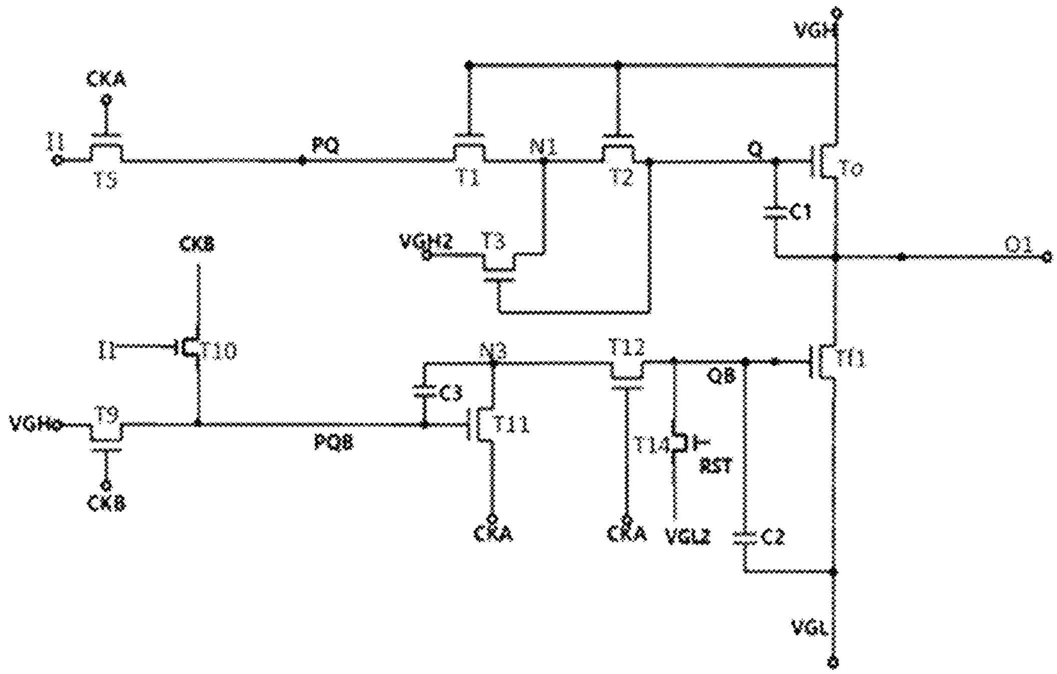
FIG. 13N is a circuit diagram of a driving circuit according to at least one embodiment of the present disclosure.

The difference between at least one embodiment of the driving circuit shown in FIG. 13N of the present disclosure and at least one embodiment of the driving circuit shown in FIG. 13B is that T8 and T13 are not provided.

Figure 13O:
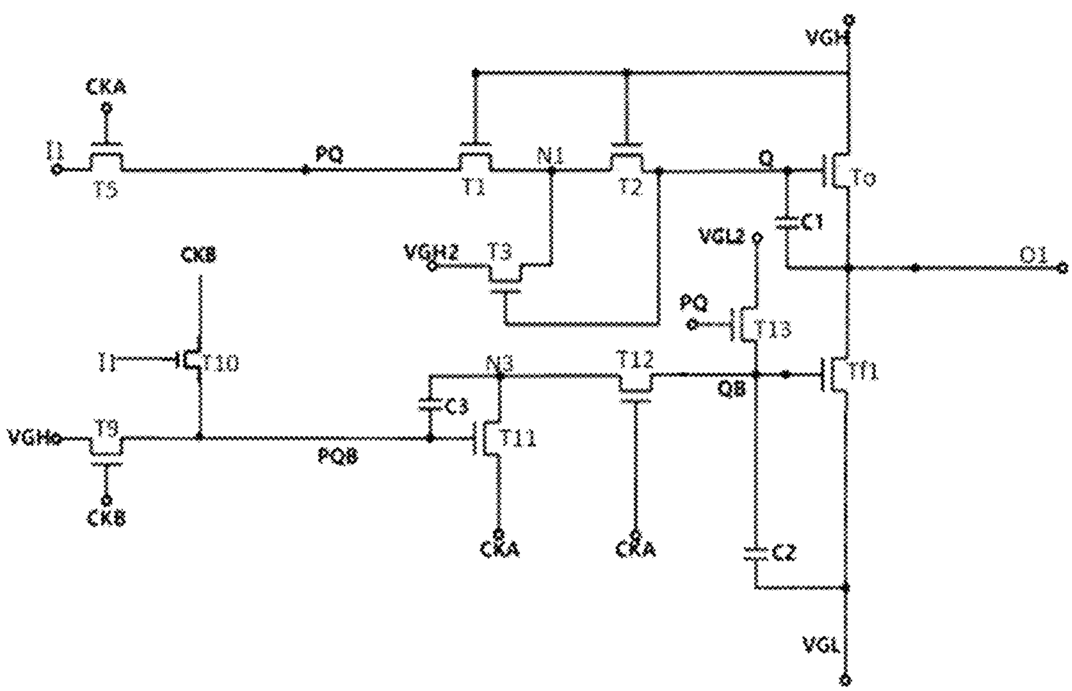
FIG. 13O is a circuit diagram of a driving circuit according to at least one embodiment of the present disclosure.

The difference between at least one embodiment of the driving circuit shown in FIG. 13O of the present disclosure and at least one embodiment of the driving circuit shown in FIG. 13B is that T8 and T14 are not provided.

Figure 13P:
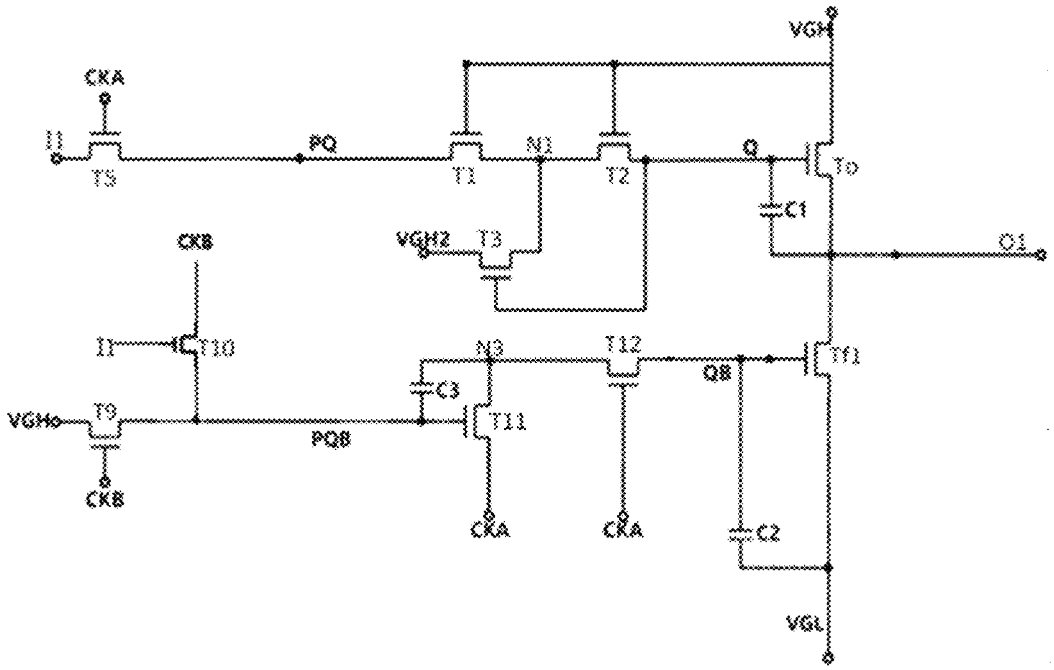
FIG. 13P is a circuit diagram of a driving circuit according to at least one embodiment of the present disclosure.

The difference between at least one embodiment of the driving circuit shown in FIG. 13P of the present disclosure and at least one embodiment of the driving circuit shown in FIG. 13B is that T8, T13 and T14 are not provided.

The driving module described in the embodiment of the present disclosure includes a plurality of stages of the above-mentioned driving circuits.

In at least one embodiment of the present disclosure, in the adjacent stages of driving circuits included in the driving module, the clock signal provided by the first clock signal terminal and the clock signal provided by the second clock signal terminal can be interchanged.

In at least one embodiment of the present disclosure, the first control node control circuit included in the driving circuit is electrically connected to the first clock signal line, the input terminal and the first control node, and is configured to control to connect or disconnect the first control node and the input terminal under the control of the clock signal provided by the first clock signal line;

The first clock signal line electrically connected to the first control node control circuit of the ath stage of driving circuit receives the first clock signal, and the first clock signal line electrically connected to the first control node control circuit of the (a+1)th stage of driving circuit receives the second clock signal, and a is a positive integer;

The time interval between the rising edge of the first clock signal and the rising edge of the second clock signal is a row of scanning time;

The effective voltage duration of the input signal connected to the input terminal is an integer times of the row of scanning time.

In at least one embodiment of the present disclosure, the time interval between the driving signals provided by the driving signal output terminals of adjacent stages of driving circuits may be 1H (1H is one row of scanning time), so the time interval between the clock signal provided by the first clock signal terminal and the clock signals provided by the second clock signal terminal can be 1H, and because the low level maintenance time of the driving signal provided by the driving circuit can be an integer times of 1H, the low level maintenance time of the input signal provided by the input terminal can be an integer times of 1H, and the low level maintenance time of the initial voltage signal can also be an integer times of 1H.

The driving method described in the embodiment of the present disclosure is applied to the above-mentioned driving circuit, and the driving method includes;

Controlling, by the first control node control circuit, the potential of the first control node;

Controlling, by the output circuit, to connect or disconnect the driving signal output terminal and the first voltage line under the control of the potential of the first node;

Controlling, by the first leakage prevention circuit, to connect or disconnect the first control node, the first node and the first intermediate node under the control of the first voltage signal according to the potential of the first intermediate node: controlling, by the first leakage prevention circuit, to connect or disconnect the first intermediate node and the second voltage line under the control of the potential of the first node, and controlling to disconnect the first control node from the first node when the first intermediate node is connected to the second voltage line.

The display substrate described in the embodiment of the present disclosure includes a base substrate and the above-mentioned driving circuit arranged on the base substrate.

In at least one embodiment of the present disclosure, the driving circuit further includes an output reset circuit and a second leakage prevention circuit;

The output circuit is arranged on a side of the first leakage prevention circuit away from a display area;

The transistors included in the output reset circuit and the transistors included in the output circuit are arranged along a first direction;

The transistors included in the first leakage prevention circuit and the transistors included in the output circuit are arranged along a second direction;

The transistors included in the second leakage prevention circuit and the transistors included in the output reset circuit are arranged along a second direction;

The first direction intersects the second direction.

Optionally, the first direction may be a vertical direction, and the second direction may be a horizontal direction, but not limited thereto.

Figure 16:
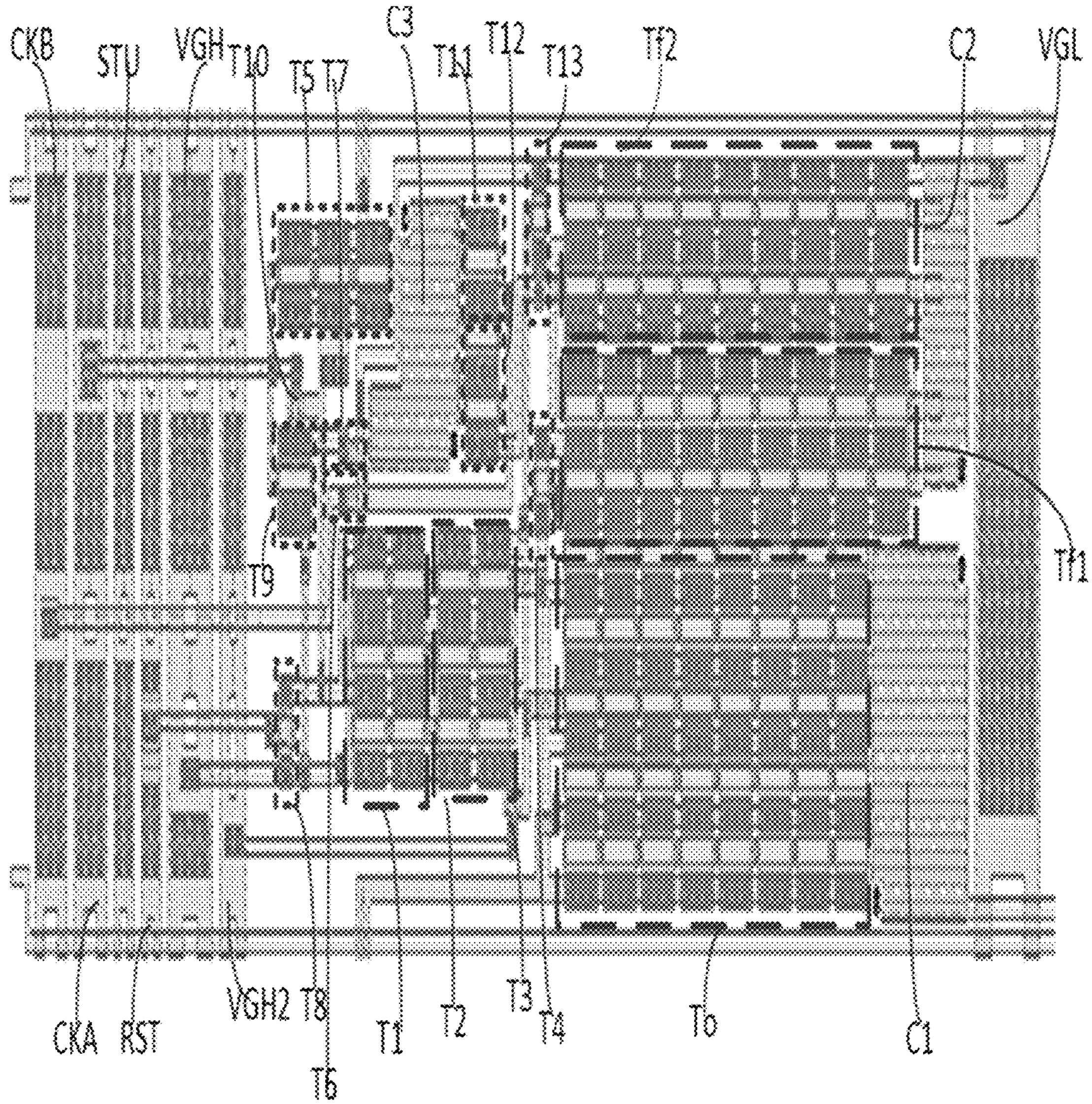
FIG. 16 is a layout diagram of the driving circuit shown in FIG. 8A.
Figure 17:
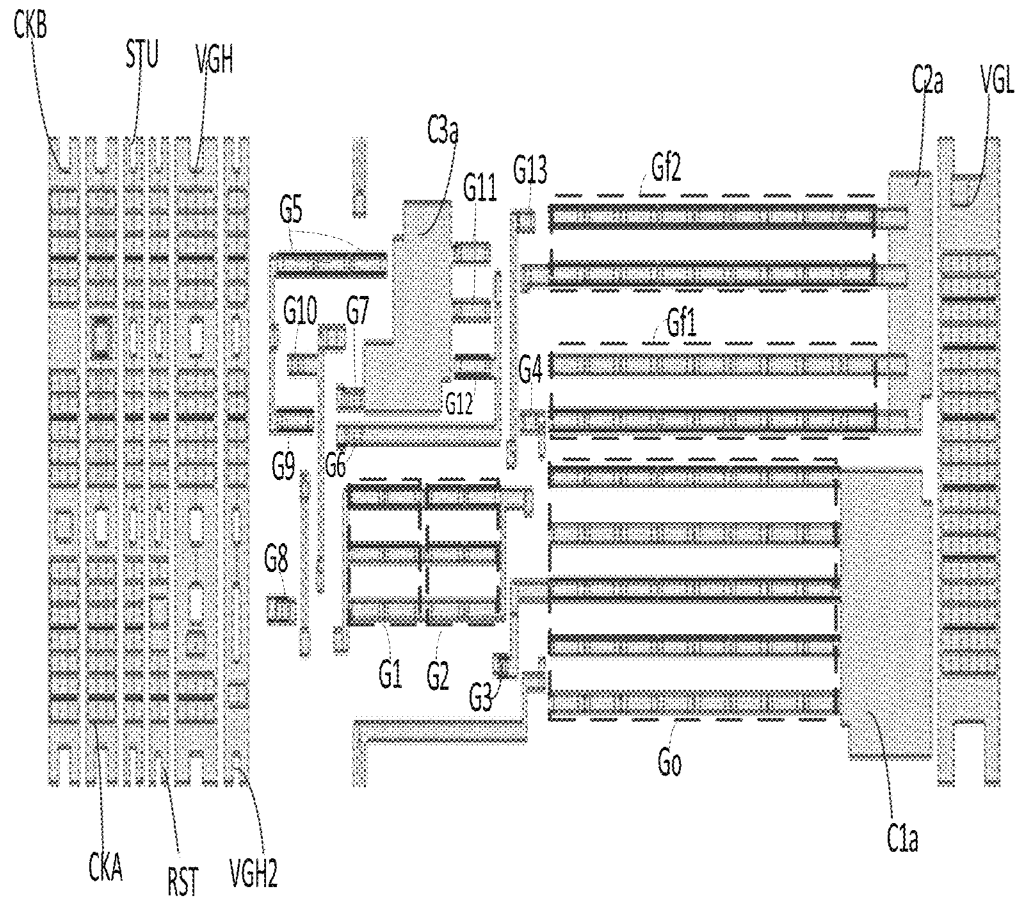
FIG. 17 is a layout diagram of the gate metal layer in FIG. 16.
Figure 18:
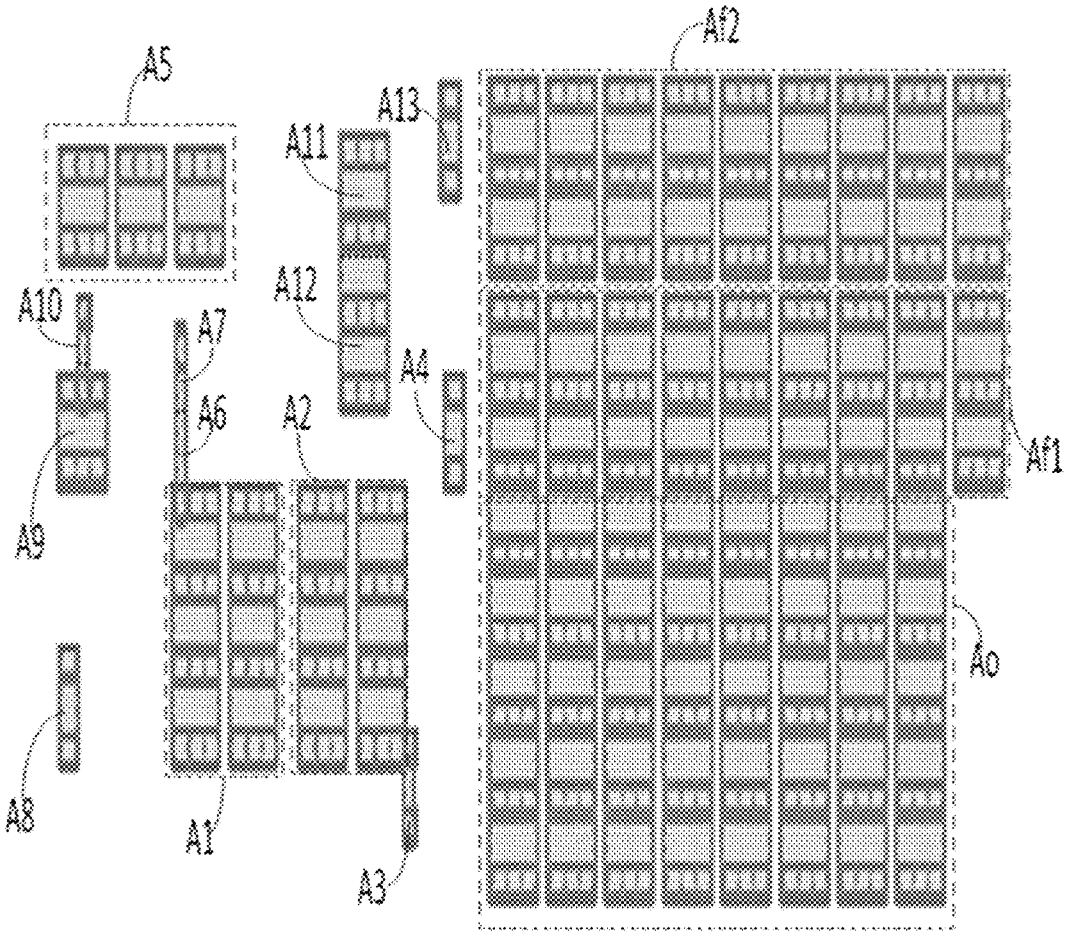
FIG. 18 is a layout diagram of the semiconductor layer in FIG. 16.
Figure 19:
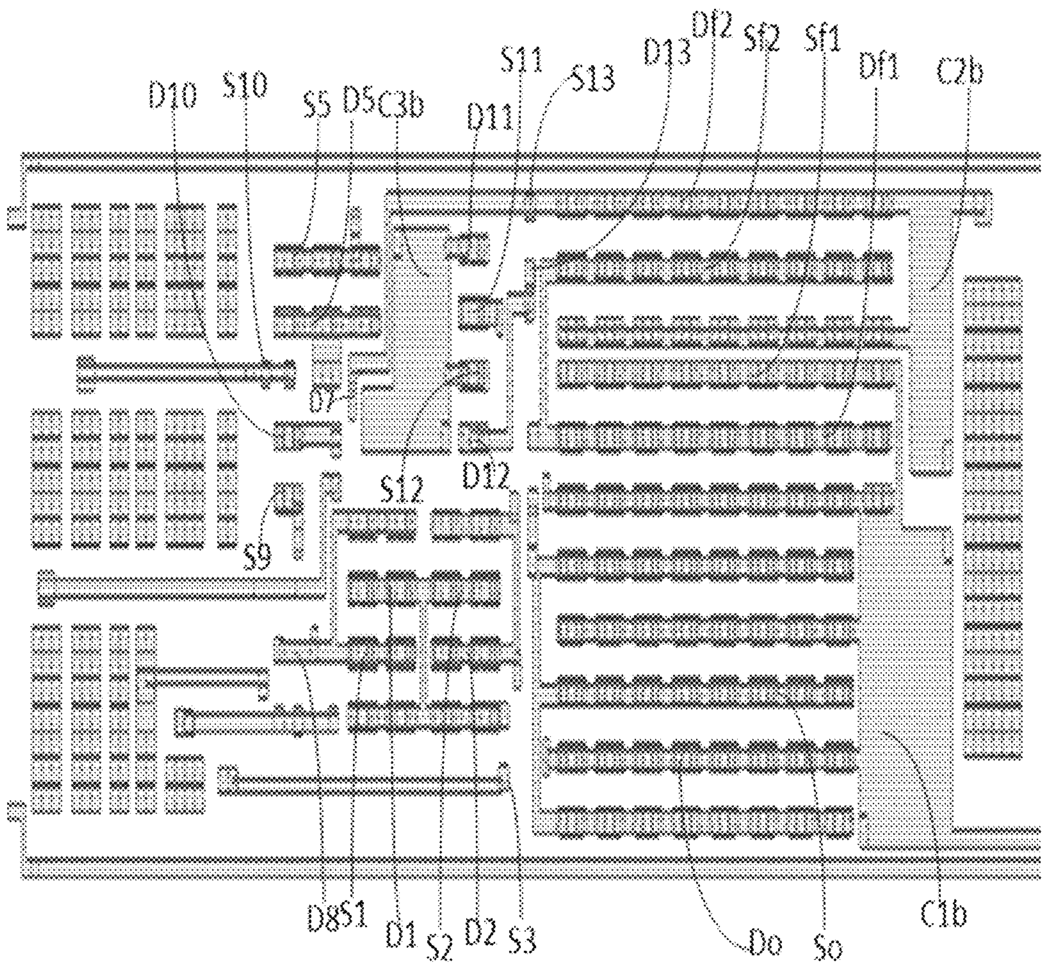
FIG. 19 is a layout diagram of the source-drain metal layer in FIG. 16.

FIG. 16 is a layout diagram of the driving circuit shown in FIG. 8A, FIG. 17 is a layout diagram of a gate metal layer in FIG. 16, FIG. 18 is a layout diagram of a semiconductor layer in FIG. 16, and FIG. 19 is a layout diagram of the source-drain metal layer in FIG. 16.

In FIG. 16, the one labeled CKB is the second clock signal line, the one labeled CKA is the first clock signal line, the one labeled STU is the initial voltage line, the one labeled VGH is the first high voltage line, and the one labeled VGH2 is the second high voltage line, and the line labeled VGL is the first low voltage line;

The one labeled T1 is the first transistor, the one labeled T2 is the second transistor, the one labeled T3 is the third transistor, the one labeled T4 is the fourth transistor, the one labeled T5 is the fifth transistor, and the one labeled T6 is The sixth transistor, the one labeled T7 is the seventh transistor, the one labeled T8 is the eighth transistor, the one labeled T9 is the ninth transistor, the one labeled T10 is the tenth transistor, the one labeled T11 is the eleventh transistor, the one labeled T12 is the twelfth transistor, the one labeled T13 is the thirteenth transistor, the one labeled To is the output transistor, the one labeled Tf1 is the first output reset transistor, and the one labeled Tf2 is the second output reset transistor, the one labeled C1 is the first capacitor, the one labeled C2 is the second capacitor, and the one labeled C3 is the third capacitor.

In specific implementation, the output circuit includes an output transistor To, the first leakage prevention circuit includes a first transistor T1, a second transistor T2 and a third transistor T3, the second leakage prevention circuit includes a fourth transistor T4, and the output reset circuit includes a first output reset transistor Tf1 and a second output reset transistor Tf2;

The output transistor To included in the output circuit is arranged on a side of the first transistor T1, the second transistor T2 and the third transistor T3 included in the first leakage prevention circuit away from the display area;

The second output reset transistor Tf2 and the first output reset transistor Tf1 included in the output reset circuit, and the output transistor To included in the output circuit are arranged vertically successively;

The first transistor T1 included in the first leakage prevention circuit and the output transistor To included in the output circuit are arranged in a horizontal direction;

The second transistor T2 included in the first leakage prevention circuit and the output transistor To included in the output circuit are arranged in a horizontal direction;

The third transistor T3 included in the first leakage prevention circuit and the output transistor To included in the output circuit are arranged in a horizontal direction;

The fourth transistor T4 included in the second leakage prevention circuit and the first output reset transistor Tf1 included in the output reset circuit are arranged in a horizontal direction;

Through the above settings, the output circuit, the first leakage prevention circuit, the second leakage prevention circuit and the output reset circuit can be arranged reasonably.

Figure 20:
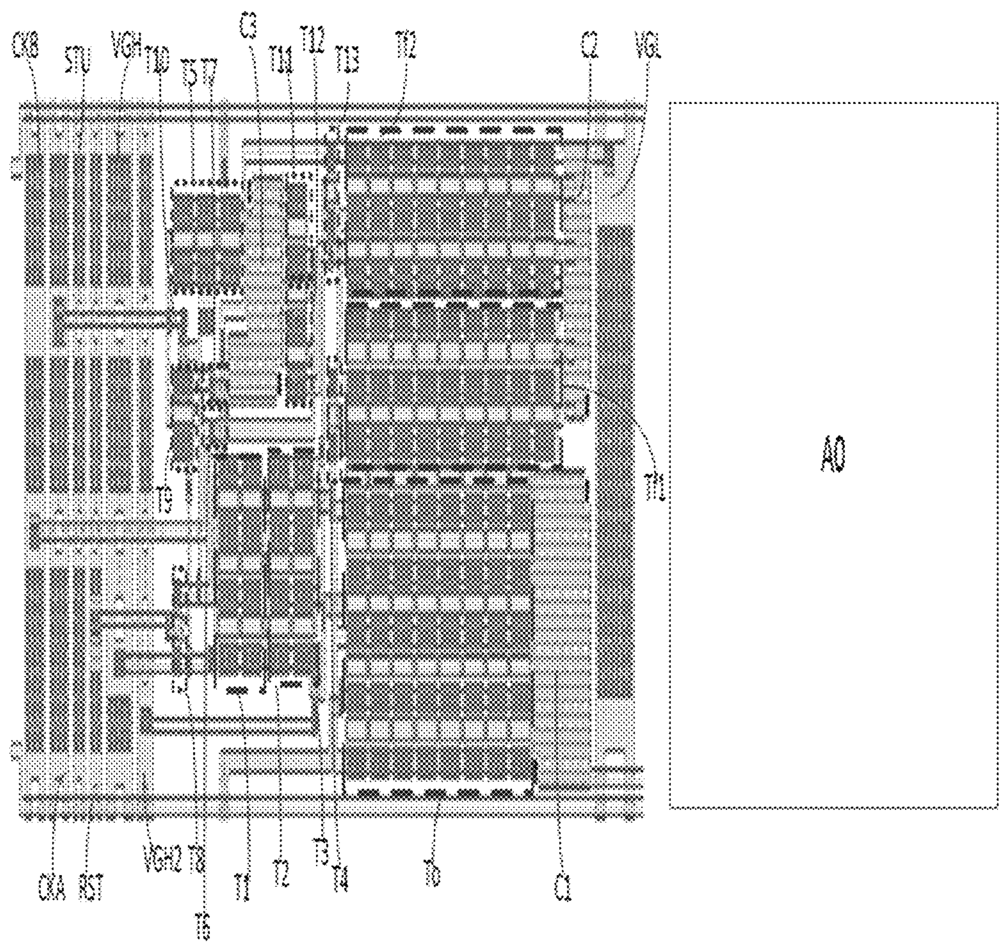
FIG. 20 is a schematic diagram of adding a display area on the basis of FIG. 16.

As shown in FIG. 20, the display area A0 is arranged on the right side of the first low voltage line VGL.

In at least one embodiment of the present disclosure, the driving circuit further includes a second control node control circuit and a second node control circuit; the output circuit includes a first capacitor, and the output reset circuit includes a second capacitor; the second node control circuit includes a third capacitor;

The first capacitor and the second capacitor are arranged on a side of the output circuit close to the display area, and the third capacitor is arranged on a side of the output circuit away from the display area;

The transistor included in the second node control circuit is arranged between the third capacitor and the transistor included in the output reset circuit;

The transistor included in the first control node control circuit and the transistor included in the second control node control circuit are arranged on a side of the output circuit away from the display area.

As shown in FIG. 16, the output circuit includes a first capacitor C1, the output reset circuit includes a first output reset transistor Tf1, a second output reset transistor Tf2, and a second capacitor C2, and the second node control circuit includes a third capacitor, the output circuit includes an output transistor To, the second node control circuit includes an eleventh transistor T11, a twelfth transistor T12, a thirteenth transistor T13, and a third capacitor C3; the first control node control circuit includes a fifth transistor T5, a sixth transistor T6, a seventh transistor T7 and an eighth transistor T8;

C1 and C2 are set on the side of the output transistor To close to the display area, and C3 is set on the side of the output transistor To away from the display area;

T11, T12 and T13 are arranged between C3 and Tf2, so as to use the space between C3 and Tf2 to set the second node control circuit, which is beneficial to realize narrow frame;

T5, T6, T7 and T8 are arranged on the side of To away from the display area.

Optionally, an orthographic projection of a gate electrode of a transistor included in the second node control circuit on the base substrate is arranged on a first side of an orthographic projection of an electrode plate of the third capacitor on the base substrate;

An orthographic projection of a gate electrode of a transistor included in the first control node control circuit on the base substrate is arranged on a second side of the orthographic projection of the electrode plate of the third capacitor on the base substrate;

An orthographic projection of a gate electrode of a transistor included in the second control node control circuit on the base substrate is arranged on the second side of the orthographic projection of the electrode plate of the third capacitor on the base substrate;

The first side and the second side are two opposite sides.

Optionally, the first side may be the right side, and the second side may be the left side, but not limited thereto.

In FIG. 17, the one labeled G1 is the gate electrode of T1, the one labeled G2 is the gate electrode of T2, the one labeled G3 is the gate electrode of T3, the one labeled G4 is the gate electrode of T4, and the one labeled G5 is the gate electrode of T5, the one labeled G6 is the gate electrode of T6, the one labeled G7 is the gate electrode of T7, the one labeled G8 is the gate electrode of T8, the one labeled G9 is the gate electrode of T9, and the one labeled G10 is the gate electrode of T10, the one labeled G11 is the gate electrode of T11, the one labeled G12 is the gate electrode of T12, the one labeled G13 is the gate electrode of T13, the one labeled Go is the gate electrode of To, and the one labeled Gf1 is the gate electrode of Tf1, the one labeled Gf2 is the gate electrode of Tf2, the one labeled C1*a* is the first electrode plate of C1, the one labeled C2*a* is the first electrode plate of C2, and the one labeled C3*a* is the first electrode plate of C3.

In specific implementation, the second node control circuit includes an eleventh transistor T11, a twelfth transistor T12, a thirteenth transistor T13, and a third capacitor C3, and the first control node control circuit includes a fifth transistor T5, a sixth transistor T6, a seventh transistor T7 and an eighth transistor T8: the second control node control circuit includes a ninth transistor T9 and a tenth transistor T10;

As shown in FIG. 17, the orthographic projection of G11 on the base substrate is arranged on the right side of the orthographic projection of C3*a* on the base substrate, and the orthographic projection of G12 on the base substrate is arranged on the right side of the orthographic projection of C3*a* on the base substrate side, the orthographic projection of G13 on the base substrate is arranged on the right side of the orthographic projection of C3*a* on the base substrate;

The orthographic projection of G5 on the base substrate is arranged on the left side of the orthographic projection of C3*a* on the base substrate, the orthographic projection of G6 on the base substrate is arranged on the left side of the orthographic projection of C3*a* on the base substrate, and the orthographic projection of G7 on the base substrate G7 is arranged on the left side of the orthographic projection of C3*a* on the base substrate, and the orthographic projection of G8 on the base substrate is arranged on the left side of the orthographic projection of C3*a* on the base substrate;

The orthographic projection of G9 on the base substrate is arranged on the left side of the orthographic projection of C3*a* on the base substrate, and the orthographic projection of G10 on the base substrate is arranged on the left side of the orthographic projection of C3*a* on the base substrate;

Through the above settings, the space on the left and right sides of C3 can be used to reasonably arrange the second node control circuit, the first control node control circuit and the second control node control circuit, which is beneficial to realize a narrow border.

In at least one embodiment shown in FIG. 17, the first side may be the right side and the second side may be the left side.

Optionally, the orthographic projection of the gate electrode of the transistor included in the first leakage prevention circuit on the base substrate is arranged on a third side of the orthographic projection of the electrode plate of the third capacitor on the base substrate.

Optionally, the third side may be the lower side, but not limited thereto.

In a specific implementation, the first leakage prevention circuit includes a first transistor T1, a second transistor T2 and a third transistor.

As shown in FIG. 17, the orthographic projection of G1 on the base substrate is arranged below the orthographic projection of C3*a* on the base substrate, and the orthographic projection of G2 on the base substrate is arranged below the orthographic projection of C3*a* on the base substrate, the orthographic projection of G2 on the base substrate is arranged below the orthographic projection of C3*a* on the base substrate, so that the space below C3 is used to lay out the first leakage prevention circuit.

The display substrate according to at least one embodiment of the present disclosure further includes a first clock signal line, a second clock signal line, a reset line, a first voltage line, a second voltage line and a third voltage line arranged on the base substrate;

The first clock signal line, the second clock signal line, the reset line, the first voltage line and the second voltage line are arranged on a side of the first control node control circuit away from the display area;

The third voltage line is arranged on a side of the first capacitor close to the display area.

In specific implementation, the first voltage line may be a first high voltage line, the second voltage line may be a second high voltage line, and the third voltage line may be a first low voltage line, As shown in FIG. 16, the first control node control circuit includes a fifth transistor T5, a sixth transistor T6, a seventh transistor T7 and an eighth transistor T8;

The first clock signal line CKA, the second clock signal line CKB, the initial voltage line STU, the first high voltage line VGH and the second high voltage line VGH2 are arranged on the side of the first control node control circuit away from the display area;

The first low voltage line VGL is arranged on a side of the first control node control circuit close to the display area.

In FIG. 18, the one labeled A1 is active layer pattern of T1, the one labeled A2 is active layer pattern of T3, the one labeled A3 is active layer pattern of T3, the one labeled A4 is active layer pattern of T4, the one labeled A5 is active layer pattern of T5, the one labeled A6 is active layer pattern of T6, the one labeled A7 is active layer pattern of T7, the one labeled A8 is active layer pattern of T8, the one labeled A9 is active layer pattern of T9, the one labeled A10 is active layer pattern of T1, the one labeled A11 is active layer pattern of T11, the one labeled A12 is active layer pattern of T12, the one labeled A13 is active layer pattern of T13, the one labeled Ao is active layer pattern of To, the one labeled Af1 is active layer pattern of Tf1, the one labeled Af2 is active layer pattern of Tf2.

In FIG. 19, the one labeled S1 is the first electrode of T1, the one labeled D1 is the second electrode of T1, the one labeled S2 is the first electrode of T2, the one labeled D2 is the second electrode of T2, the one labeled S3 is the first electrode of T3, the one labeled S5 is the first electrode of T5, the one labeled D5 is the second electrode of T5, the one labeled D7 is the second electrode of T7, and the one labeled D8 is the second electrode of T8, the one labeled S9 is the source electrode of T9, the one labeled S10 is the first electrode of T10, the one labeled D10 is the second electrode of T10, the one labeled S11 is the first electrode of T11, and the one labeled D11 is the second electrode of T11, the one labeled S12 is the first electrode of T12, the one labeled D12 is the second electrode of T12, the one labeled S13 is the first electrode of T13, and the one labeled D13 is the second electrode of T13, the one labeled So is the first electrode of To, the one labeled Do is the second electrode of To, the one labeled Sf1 is the first electrode of Tf1, the one labeled Df1 is the second electrode of Tf1, and the one labeled Sf2 is the first electrode of Tf2, the one labeled Df2 is the second electrode of Tf2, the one labeled C1*b* is the second electrode plate of C1, the one labeled C2*b* is the second electrode plate of C2, the one labeled C3*b* is the second electrode plate of C3.

The display device described in the embodiment of the present disclosure includes the above driving module.

The display device provided by the embodiments of the present disclosure may be any product or component with a display function, such as a mobile phone, a tablet computer, a television, a monitor, a notebook computer, a digital photo frame, a navigator, and the like.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A driving circuit, comprising a first leakage prevention circuit, an output circuit and a first control node control circuit; wherein the first control node control circuit is electrically connected to a first control node, and is configured to control a potential of the first control node;

the output circuit is electrically connected to a first node, a first voltage line, and a driving signal output terminal, respectively, and is configured to control to connect or disconnect the driving signal output terminal and the first voltage line under the control of a potential of the first node;

the first leakage prevention circuit is electrically connected to the first voltage line, the first control node, the first node, a first intermediate node and a second voltage line, and is configured to control to connect or disconnect the first control node, the first node and the first intermediate node under the control of a first voltage signal provided by the first voltage line according to a potential of the first intermediate node, control to connect or disconnect the first intermediate node and the second voltage line under the control of the potential of the first node, and control to disconnect the first control node from the first node when the first intermediate node is connected to the second voltage line.

2. The driving circuit according to claim 1, wherein the first leakage prevention circuit comprises a first control circuit, a second control circuit and a third control circuit;

the first control circuit is respectively electrically connected to the first voltage line, the first control node and the first intermediate node, and is configured to control to connect or disconnect the first control node and the first intermediate node under the control of the first voltage signal provided by the first voltage line according to the potential of the first control node;

the second control circuit is respectively electrically connected to the first voltage line, the first intermediate node and the first node, and is configured to control to connect or disconnect the first intermediate node and the first node under the control of the first voltage signal according to the potential of the first intermediate node;

the third control circuit is electrically connected to the first node, the first intermediate node, and the second voltage line, and is configured to control to connect or disconnect the first intermediate node and the second voltage line under the control of the potential of the first node.

3. The driving circuit according to claim 2, wherein the first control circuit comprises a first transistor, the second control circuit comprises a second transistor, and the third control circuit comprises a third transistor;

a gate electrode of the first transistor is electrically connected to the first voltage line, a first electrode of the first transistor is electrically connected to the first control node, a second electrode of the first transistor is electrically connected to the first intermediate node;

a gate electrode of the second transistor is electrically connected to the first voltage line, a first electrode of the second transistor is electrically connected to the first intermediate node, and a second electrode of the second transistor is electrically connected to the first node;

a gate electrode of the third transistor is electrically connected to the first node, a first electrode of the third transistor is electrically connected to the second voltage line, and a second electrode of the third transistor is electrically connected to the first node.

4. The driving circuit according to claim 3, wherein the first transistor, the second transistor and the third transistor are all n-type transistors, and a voltage value of the first voltage signal provided by the first voltage line is smaller than a voltage value of a second voltage signal provided by the second voltage line; or, the first transistor, the second transistor and the third transistor are all p-type transistors, and the voltage value of the first voltage signal provided by the first voltage line is greater than the voltage value of the second voltage signal provided by the second voltage line.

5. The driving circuit according to claim 1, further comprising an output reset circuit; wherein the output reset circuit is electrically connected to a second node, a third voltage line and the driving signal output terminal, and is configured to control to connect or disconnect the driving signal output terminal and the third voltage line under the control of a potential of the second node.

6. The driving circuit according to claim 5, wherein the output reset circuit comprises a first reset sub-circuit and a second reset sub-circuit, and the driving circuit further comprises a second leakage prevention circuit;

the first reset sub-circuit is electrically connected to the second node, the driving signal output terminal and a second intermediate node, and is configured to control to connect or disconnect the driving signal output terminal and the second intermediate node under the control of the potential of the second node;

the second reset sub-circuit is electrically connected to the second node, the second intermediate node, and the third voltage line, and is configured to control to connect or disconnect the second intermediate node and the third voltage line under the control of the potential of the second node;

the second leakage prevention circuit is electrically connected to the first voltage line and the second intermediate node respectively, and the second leakage prevention circuit is electrically connected to the driving signal output terminal or the first node, and is configured to control to connect or disconnect the second intermediate node and the first voltage line under the control of a driving signal provided by the driving signal output terminal or the potential of the first node.

7. The driving circuit according to claim 6, wherein the output circuit comprises an output transistor and a first capacitor, and the output reset circuit comprises a first output reset transistor, a second output reset transistor and a second capacitor;

a gate electrode of the output transistor is electrically connected to the first node, a first electrode of the output transistor is electrically connected to the first voltage line, and a second electrode of the output transistor is electrically connected to the driving signal output terminal;

a first electrode plate of the first capacitor is electrically connected to the first node, and a second electrode plate of the first capacitor is electrically connected to the driving signal output terminal;

a gate electrode of the first output reset transistor is electrically connected to the second node, a first electrode of the first output reset transistor is electrically connected to the driving signal output terminal, and a second electrode of the first output reset transistor is electrically connected to the second intermediate node;

a gate electrode of the second output reset transistor is electrically connected to the second node, a first electrode of the second output reset transistor is electrically connected to the second intermediate node, and a second electrode of the second output reset transistor is electrically connected to the third voltage line;

a first electrode plate of the second capacitor is electrically connected to the second node, and a second electrode plate of the second capacitor is electrically connected to the third voltage line;

the second leakage prevention circuit includes a fourth transistor;

a gate electrode of the fourth transistor is electrically connected to the driving signal output terminal or the first node, a first electrode of the fourth transistor is electrically connected to the first voltage line, and a second electrode of the fourth transistor is electrically connected to the second intermediate node.

8. The driving circuit according to claim 1, further comprising a second control node control circuit and a second node control circuit; wherein the first control node control circuit is also electrically connected to an input terminal, a first clock signal line, a reset line, the first voltage line, a second clock signal line, a second control node and a third voltage line, is configured to control to connect or disconnect the first control node and the input terminal under the control of a clock signal provided by the first clock signal line, and control to connect or disconnect the first control node and the input terminal under the control of a reset signal provided by the reset line; control to connect or disconnect the first control node and the third voltage line under the control of a clock signal provided by the second clock signal line and a potential of the second control node;

the second control node control circuit is respectively electrically connected to the first clock signal line, the first voltage line, the first control node, and the second control node, and is configured to control to connect or disconnect the second control node and the first voltage line under the control of the clock signal provided by the first clock signal line, and control to connect or disconnect the second control node and the first clock signal line under the control of the potential of the first control node;

the second node control circuit is electrically connected to the second control node, the second clock signal line, the first node, the second node, a third intermediate node and the third voltage line, is configured to control to connect or disconnect the third intermediate node and the second clock signal line under the control of the potential of the second control node, control a potential of the third intermediate node under the control of the potential of the second control node, control to connect or disconnect the third intermediate node and the second node under the control of the clock signal provided by the second clock signal line, and control to connect or disconnect the second node and the third voltage line under the control of the potential of the first node.

9. The driving circuit according to claim 8, wherein the first control node control circuit comprises a fifth transistor, a sixth transistor, a seventh transistor and an eighth transistor;

a gate electrode of the fifth transistor is electrically connected to the first clock signal line, a first electrode of the fifth transistor is electrically connected to the input terminal, and a second electrode of the fifth transistor is electrically connected to the first control node;

a gate electrode of the sixth transistor is electrically connected to the second clock signal line, and a first electrode of the sixth transistor is electrically connected to the first control node;

a gate electrode of the seventh transistor is electrically connected to the second control node, a first electrode of the seventh transistor is electrically connected to a second electrode of the sixth transistor, a second electrode of the seventh transistor is electrically connected to the third voltage line;

a gate electrode of the eighth transistor is electrically connected to the reset line, a first electrode of the eighth transistor is electrically connected to the first voltage line, and a second electrode of the eighth transistor is electrically connected to the first control node.

10. The driving circuit according to claim 8, wherein the second control node control circuit comprises a ninth transistor and a tenth transistor;

a gate electrode of the ninth transistor is electrically connected to the first clock signal line, a first electrode of the ninth transistor is electrically connected to the first voltage line, and a second electrode of the ninth transistor is electrically connected to the second control node;

a gate electrode of the tenth transistor is electrically connected to the first control node, a first electrode of the tenth transistor is electrically connected to the first clock signal line, and a second electrode of the tenth transistor is electrically connected to the second control node.

11. The driving circuit according to claim 8, wherein the second node control circuit comprises an eleventh transistor, a twelfth transistor, a thirteenth transistor and a third capacitor;

a gate electrode of the eleventh transistor is electrically connected to the second control node, a first electrode of the eleventh transistor is electrically connected to the second clock signal line, a second electrode of the eleventh transistor is electrically connected to the third intermediate node;

a gate electrode of the twelfth transistor is electrically connected to the second clock signal line, a first electrode of the twelfth transistor is electrically connected to the third intermediate node, and a second electrode of the twelfth transistor is electrically connected to the second node;

a gate electrode of the thirteenth transistor is electrically connected to the first node, a first electrode of the thirteenth transistor is electrically connected to the third voltage line, and a second electrode of the thirteenth transistor is electrically connected to the second node;

a first electrode plate of the third capacitor is electrically connected to the second control node, and a second electrode plate of the third capacitor is electrically connected to the third intermediate node.

12. The driving circuit according to claim 5, further comprising a second control node control circuit and a second node control circuit; wherein the first control node control circuit is further electrically connected to an input terminal, a first clock signal line, a reset line and the first voltage line, and is configured to control to connect or disconnect the first control node and the input terminal under the control of a clock signal provided by the first clock signal line, and control to connect or disconnect the first control node and the first voltage line under the control of a reset signal provided by the reset line;

the second control node control circuit is respectively electrically connected to a second clock signal line, the first voltage line, the first control node and the second control node, and is configured to control to connect or disconnect the second control node and the first voltage line under the control of a clock signal provided by the second clock signal line, and control to connect or disconnect the second control node and the second clock signal line under the control of the potential of the first control node;

the second node control circuit is electrically connected to the second control node, the first clock signal line, the first control node, the reset line, the second node, a third intermediate node and a fourth voltage line, and is configured to control to connect or disconnect the third intermediate node and the first clock signal line under the control of the potential of the second control node, and control a potential of the third intermediate node under the control of the potential of the second control node, control to connect or disconnect the third intermediate node and the second node under the control of the clock signal provided by the first clock signal line, control to connect or disconnect the second node and the fourth voltage line under the control of the potential of the first control node, and control to connect or disconnect the second node and the fourth voltage line under the control of a reset signal provided by the reset line.

13. The driving circuit according to claim 12, wherein the first control node control circuit comprises a fifth transistor and an eighth transistor;

a gate electrode of the fifth transistor is electrically connected to the first clock signal line, a first electrode of the fifth transistor is electrically connected to the input terminal, and a second electrode of the fifth transistor is electrically connected to the first control node;

a gate electrode of the eighth transistor is electrically connected to the reset line, a first electrode of the eighth transistor is electrically connected to the first voltage line, and a second electrode of the eighth transistor is electrically connected to the first control node;

the second control node control circuit includes a ninth transistor and a tenth transistor;

a gate electrode of the ninth transistor is electrically connected to the second clock signal line, a first electrode of the ninth transistor is electrically connected to the first voltage line, and a second electrode of the ninth transistor is electrically connected to the second control node;

a gate electrode of the tenth transistor is electrically connected to the input terminal, a first electrode of the tenth transistor is electrically connected to the second clock signal line, and a second electrode of the tenth transistor is electrically connected to the second control node;

the second node control circuit includes an eleventh transistor, a twelfth transistor, a thirteenth transistor, a fourteenth transistor and a third capacitor;

a gate electrode of the eleventh transistor is electrically connected to the second control node, a first electrode of the eleventh transistor is electrically connected to the first clock signal line, and a second electrode of the eleventh transistor is electrically connected to the third intermediate node;

a gate electrode of the twelfth transistor is electrically connected to the first clock signal line, a first electrode of the twelfth transistor is electrically connected to the third intermediate node, and a second electrode of the twelfth transistor is electrically connected to the second node;

a gate electrode of the thirteenth transistor is electrically connected to the first control node, a first electrode of the thirteenth transistor is electrically connected to the fourth voltage line, and a second electrode of the thirteenth transistor is electrically connected to the second node;

a gate electrode of the fourteenth transistor is electrically connected to the reset line, a first electrode of the fourteenth transistor is electrically connected to the fourth voltage line, and a second electrode of the fourteenth transistor is electrically connected to the second node;

a first electrode plate of the third capacitor is electrically connected to the second control node, and a second electrode plate of the third capacitor is electrically connected to the third intermediate node; or wherein a transistor included in the output reset circuit is an n-type transistor, and a voltage value of a fourth voltage signal provided by the fourth voltage line is smaller than a voltage value of a third voltage signal provided by the third voltage line; or, the transistor included in the output reset circuit is a p-type transistor, and the voltage value of the fourth voltage signal provided by the fourth voltage line is greater than the voltage value of the third voltage signal provided by the third voltage line.

14. A driving module comprising a plurality of stages of the driving circuit according to claim 1.

15. The driving module according to claim 14, wherein the first control node control circuit included in the driving circuit is electrically connected to the first clock signal line, the input terminal and the first control node, and is configured to control to connect or disconnect the first control node and the input terminal under the control of the clock signal provided by the first clock signal line;

the first clock signal line electrically connected to the first control node control circuit of an ath stage of driving circuit receives the first clock signal, and the first clock signal line electrically connected to the first control node control circuit of an (a+1)th stage of driving circuit receives the second clock signal, and a is a positive integer;

a time interval between a rising edge of the first clock signal and a rising edge of the second clock signal is a row of scanning time;

an effective voltage duration of an input signal connected to the input terminal is an integer times of the row of scanning time.

16. A driving method applied to the driving circuit according to claim 1, wherein the driving method comprises:

controlling, by the first control node control circuit, the potential of the first control node;

controlling, by the output circuit, to connect or disconnect the driving signal output terminal and the first voltage line under the control of the potential of the first node;

controlling, by the first leakage prevention circuit, to connect or disconnect the first control node, the first node and the first intermediate node under the control of the first voltage signal according to the potential of the first intermediate node; controlling, by the first leakage prevention circuit, to connect or disconnect the first intermediate node and the second voltage line under the control of the potential of the first node, and controlling to disconnect the first control node from the first node when the first intermediate node is connected to the second voltage line.

17. A display substrate, comprising a base substrate and the driving circuit according to claim 1 arranged on the base substrate.

18. The display substrate according to claim 17, wherein the driving circuit further comprises an output reset circuit and a second leakage prevention circuit;

the output circuit is arranged on a side of the first leakage prevention circuit away from a display area;

a transistor included in the output reset circuit and a transistor included in the output circuit are arranged along a first direction;

a transistor included in the first leakage prevention circuit and the transistor included in the output circuit are arranged along a second direction;

a transistor included in the second leakage prevention circuit and the transistor included in the output reset circuit are arranged along the second direction;

the first direction intersects the second direction.

19. The display substrate according to claim 18, wherein the driving circuit further comprises a second control node control circuit and a second node control circuit; the output circuit comprises a first capacitor, and the output reset circuit comprises a second capacitor; the second node control circuit includes a third capacitor;

the first capacitor and the second capacitor are arranged on a side of the output circuit close to the display area, and the third capacitor is arranged on a side of the output circuit away from the display area;

a transistor included in the second node control circuit is arranged between the third capacitor and the transistor included in the output reset circuit;

a transistor included in the first control node control circuit and a transistor included in the second control node control circuit are arranged on the side of the output circuit away from the display area, wherein an orthographic projection of a gate electrode of the transistor included in the second node control circuit on the base substrate is arranged on a first side of an orthographic projection of an electrode plate of the third capacitor on the base substrate;

an orthographic projection of a gate electrode of the transistor included in the first control node control circuit on the base substrate is arranged on a second side of the orthographic projection of the electrode plate of the third capacitor on the base substrate;

an orthographic projection of a gate electrode of the transistor included in the second control node control circuit on the base substrate is arranged on the second side of the orthographic projection of the electrode plate of the third capacitor on the base substrate;

the first side and the second side are two opposite sides, or wherein an orthographic projection of a gate electrode of the transistor included in the first leakage prevention circuit on the base substrate is arranged on a third side of the orthographic projection of the electrode plate of the third capacitor on the base substrate, or further includes a first clock signal line, a second clock signal line, a reset line, the first voltage line, the second voltage line and a third voltage line arranged on the base substrate;

the first clock signal line, the second clock signal line, the reset line, the first voltage line and the second voltage line are arranged on a side of the first control node control circuit away from the display area;

the third voltage line is arranged on a side of the first capacitor close to the display area.

20. A display device comprising the driving module according to claim 14.

* * * * *